United States Patent [19]

Yokokawa et al.

[11] Patent Number: 4,623,984
[45] Date of Patent: Nov. 18, 1986

[54] LOGIC ANALYZER HAVING SEARCH AND COMPARISON CAPABILITIES

[75] Inventors: Hidemi Yokokawa, Tokyo; Rikichi Murooka, Chiba; Miyuki Fukuzawa; Machiko Tomioka, both of Kanagawa, all of Japan

[73] Assignee: Sony/Tektronix Corporation, Tokyo, Japan

[21] Appl. No.: 763,325

[22] Filed: Aug. 7, 1985

Related U.S. Application Data

[63] Continuation of Ser. No. 451,125, Dec. 20, 1982, abandoned.

[30] Foreign Application Priority Data

Dec. 28, 1981 [JP] Japan ................................ 56-214115
Jan. 13, 1982 [JP] Japan .................................. 57-4236

[51] Int. Cl.[4] ........................................... G06F 3/153
[52] U.S. Cl. ................................................. 364/900
[58] Field of Search ... 364/200 MS File, 900 MS File; 340/735, 739, 740, 747, 802, 728, 751, 721

[56] References Cited

U.S. PATENT DOCUMENTS

| 4,040,025 | 8/1977 | Morrill, Jr. et al. | 364/900 |
| 4,100,532 | 7/1978 | Farnbach | 364/481 |
| 4,107,651 | 8/1978 | Martin | 371/6 |
| 4,250,562 | 2/1981 | Haag et al. | 364/900 |
| 4,301,513 | 11/1981 | Haag et al. | 364/900 |
| 4,303,987 | 12/1981 | Haag et al. | 364/900 |

Primary Examiner—Gareth D. Shaw
Assistant Examiner—Kevin A. Kriess
Attorney, Agent, or Firm—Dellett, Smith-Hill and Bedell

[57] ABSTRACT

A logic analyzer is disclosed which displays at least an input logic signal on a cathode ray tube, controls a cursor position on the cathode ray tube and obtains a relationship between a predetermined phenomenon included in the input logic signal and the cursor position. In a search mode, the predetermined phenomenon is a search word or a glitch. In a compare mode, the predetermined phenomenon is a reference logic signal.

7 Claims, 15 Drawing Figures

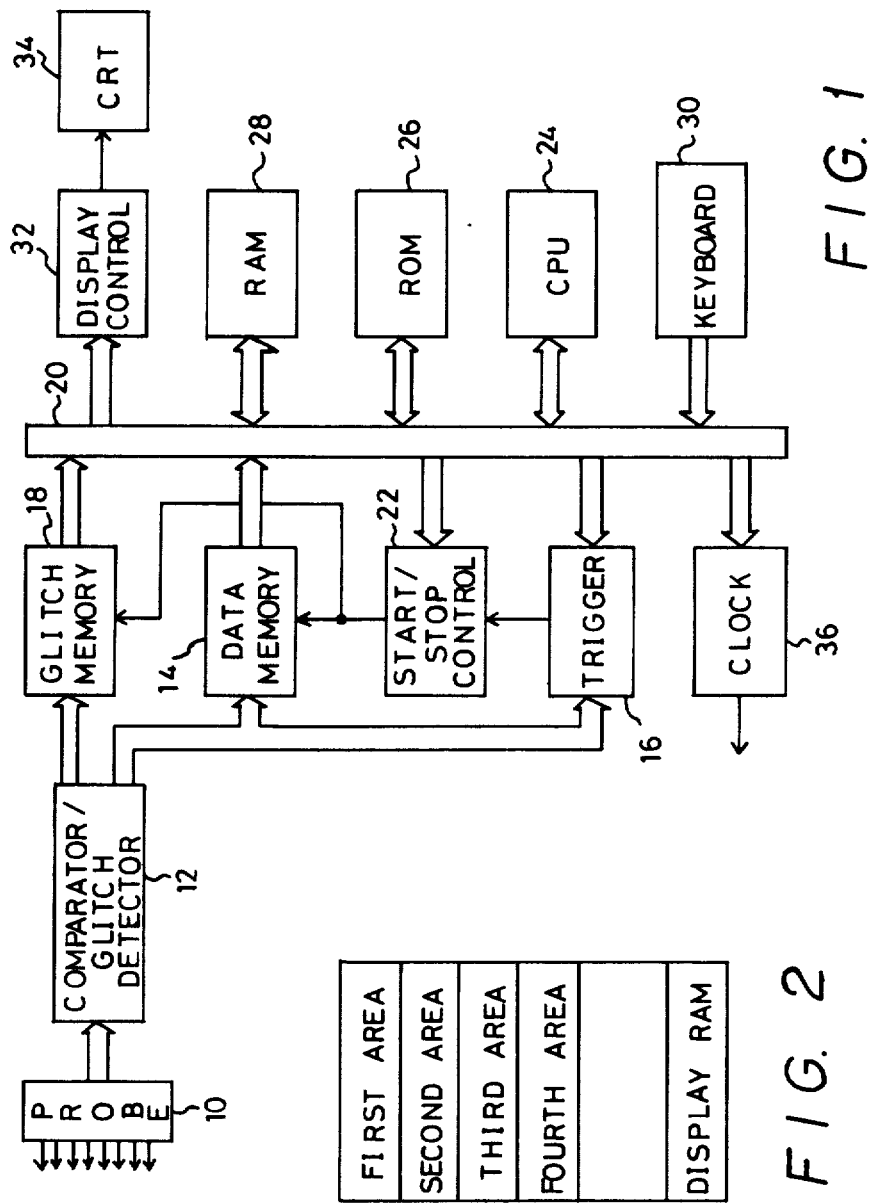

```
SRCH = [   7 3]/1 2 4
GLITCH
   CH = A A A A  A A A A
        0 1 2 3  4 5 6 7
 [9 7]  0 0 0 0  0 0 0 0
  9 8   1 1 1 1  1 0 0 1
  9 9   0 0 1 0  1 0 1 0
1 0 0   0 0 1 0  1 1 0 0
1 0 1   0 0 1 0  1 0 1 0
1 0 2   0 0 1 0  1 0 0 1
1 0 3   0 0 0 0  0 0 0 0
1 0 4 - 0 1 1 0 -1 1 1 1 -
1 0 5   1 0 0 1  0 0 1 0
1 0 6   0 1 0 0  0 0 1 0
1 0 7   0 0 1 0  0 0 1 0
1 0 8   1 0 0 1  0 0 1 0
1 0 9   0 1 1 0  0 0 1 0
```

FIG. 8

```
SRCH = [↑7 7]/1 0 8
WD = GLITCH
              H
    [5 3]   5 3
     5 4    4 F
     5 5   [5 9]
     5 6    2 F
     5 7 -  5 4 -
     5 8    4 5
     5 9    4 B
     6 0   [5 4]
     6 1    5 2
     6 2    4 F
     6 3    4 E
     6 4   [4 9]
     6 5    5 8
```

FIG. 9

```
CMPR    =  ↑1 0 3 / 2 2 5
CMPR WDO =      0 - 2 5 5
```

|  | ---ACQ--- | | ---REF--- | |
|---|---|---|---|---|
| CH = | 0 1 2 3 | 4 5 6 7 | CH = 0 1 2 3 | 4 5 6 7 |
| C 1 2 3 | 1 0 0 1 | 0 0 1 1 | 1 2 3  1 0 0 1 | 0 0 1 1 |
| C 1 2 4 | 0 0 0 1 | 0 0 0 0 | 1 2 4  0 1 1 1 | 1 1 1 1 |
| C 1 2 5 | 0 1 1 0 | 1 1 0 1 | 1 2 5  1 1 1 1 | 1 1 1 1 |
| C 1 2 6 | 1 0 0 0 | 0 1 0 0 | 1 2 6  1 1 0 0 | 0 1 1 0 |
| C 1 2 7 | 0 0 0 1 | 1 1 0 0 | 1 2 7  0 0 1 1 | 1 1 1 0 |
| C 1 2 8 | 0 1 0 0 | 1 0 0 1 | 1 2 8  1 1 0 1 | 1 0 1 1 |
| C 1 2 9 | 0 0 0 1 | 0 1 0 0 | 1 2 9  0 1 1 1 | 0 1 1 0 |
| C 1 3 0 | —1 0 1 0— | 1 0 1 0— | 1 3 0  1 0 1 0 | 1 0 1 0 |
| C 1 3 1 | 1 1 1 1 | 1 0 1 1 | 1 3 1  0 0 0 0 | 0 0 1 0 |
| C 1 3 2 | 0 1 1 1 | 1 0 1 0 | 1 3 2  0 1 0 1 | 0 0 0 0 |
| C 1 3 3 | 1 1 1 0 | 1 1 0 0 | 1 3 3  1 1 0 0 | 0 0 0 0 |
| C 1 3 4 | 0 0 0 0 | 1 1 1 1 | 1 3 4  0 0 0 1 | 0 1 0 1 |
| C 1 3 5 | 1 0 1 1 | 1 0 1 1 | 1 3 5  1 0 0 1 | 0 0 1 0 |

*FIG. 10*

```
CMPR PATER =     1 3 / 1 3
CMPR WDO =       0 - 2 0 6
```

|  | ---ACQ--- | | ---REF--- | |
|---|---|---|---|---|
| CH = | 0 1 2 3 | 4 5 6 7 | CH = 0 1 2 3 | 4 5 6 7 |
| C 1 9 7 | 0 0 1 1 | 1 1 0 0 | 3 9  1 0 1 0 | 1 0 1 0 |
| C 1 9 8 | 1 0 0 1 | 1 0 0 1 | 4 5  0 1 0 1 | 0 1 0 1 |
| C 1 9 9 | 0 1 1 0 | 1 1 0 0 | 4 1  1 0 1 0 | 1 0 1 0 |
| C 2 0 0 | 0 1 0 0 | 0 0 1 1 | | |
| C 2 0 1 | 1 0 0 1 | 1 0 0 1 | | |
| C 2 0 2 | 1 0 1 0 | 1 0 1 0 | | |
| C 2 0 3 | —0 1 0 1 | 0 1 0 1— | | |
| C 2 0 4 | 1 0 1 0 | 1 0 1 0 | | |
| C 2 0 5 | 0 0 0 1 | 1 1 0 0 | | |
| C 2 0 6 | 1 0 1 1 | 1 0 0 1 | | |
| 2 0 7 | 1 1 1 0 | 0 0 0 0 | | |
| 2 0 8 | 0 1 1 0 | 0 1 1 1 | | |
| 2 0 9 | 0 1 1 1 | 0 1 0 1 | | |

*FIG. 11*

LOGIC ANALYZER HAVING SEARCH AND COMPARISON CAPABILITIES

This is a continuation of co-pending application Ser. No. 451,125 filed on Dec. 20, 1982, now abandoned.

BACKGROUND OF THE INVENTION

The subject matter of the present invention pertains to a logic analyzer having search and comparison capabilities.

In various kinds of electronic apparatus, logic techniques are increasingly popular as a result of developments of microprocessors and computers. Oscilloscopes, logic probes and logic analyzers are utilized for developing, calibrating and trouble-shooting an electronic apparatus using these logic techniques. A logic analyzer is especially ideal for use as a measurement instrument of such electronic apparatus, because it can store multi-channel input logic signals (data) in a memory, such as a random access memory (RAM) and display the data stored in the memory on a display means, such as a cathode ray tube (CRT), so that the displayed data (before a trigger signal occurence) may be measured. There are two display modes used by a logic analyzer; one is a timing display mode for displaying the logic signals as signal waveforms; the other is a state display mode for displaying the stored data as characters (alphanumerics) of words, such as binary, octal and hexadecimal. In the state display mode, data stored in only selected addresses of the memory are displayed. All of the data stored in the memory cannot be displayed simultaneously because of the relationship between a display area and the sizes of the characters to be displayed.

Conventional logic analyzers have many functions, and one of them is a search function (or search mode). This mode is frequently selected especially in the state display mode, wherein a search word set by an operator is detected from the data stored in the memory. The searched word and the memory address thereof are displayed on a first line, and a predetermined number of words followed by this address are displayed on the following lines thereby constituting a state table. However, since all the data stored in the memory cannot be displayed in the state display mode as described hereinbefore, it is difficult to know a total number of the search words included in all the data and a relation between the total number and the search words displayed on the display means. As a result, measurement is troublesome. On the other hand, the search mode is not available in the timing display mode, so that it is troublesome to measure a timing relation among a plurality of logic signals with respect to a desired word.

Another function of a conventional logic analyzer is the detection of a glitch (a narrow width pulse signal which affects the operation of logic circuits). The glitch can be detected if a clock frequency is increased when storing the input logic signal in the memory. However, the glitch is detected commonly by a glitch detector consisting of logic circuits, such as latch circuits or the like, since the maximum clock frequency is limited by the characteristics of the memory. The detected glitch is displayed as a pulse of one bit width in the timing display mode (the glitch intensity is sometimes modulated). It is difficult to know a total number of the glitches in all the data stored in the memory and a relationship between the total number and a glitch displayed on the display means. As a result, measurement is inconvenient. Moreover, conventional logic analyzers cannot display the glitch in the state display mode. Therefore, it cannot be determined whether or not the displayed data includes the glitch.

The conventional logic analyzers have a further function, a comparison function (or comparison mode). This function is especially used in the state display mode, wherein the input logic signals stored in a first memory are compared with reference logic signals stored in a second memory and one or both of the input and reference logic signals are displayed on the display means. Conventional logic analyzers modulate the intensity of different parts of the input and reference logic signals, invert the different parts (inversion between white and black) or add markers to the different parts for distinguishing between the different parts of the input and reference logic signal from other parts thereof (easy measurement). Since all the data stored in the memory cannot be displayed simultaneously in the state display mode as described hereinbefore, it is difficult to know a total number of the different (or other) parts of the input and reference logic signal included on the display means, namely, a relationship between all the data and the displayed parts. Thus, measurement is troublesome.

SUMMARY OF THE INVENTION

According to a logic analyzer of the present invention, a search phenomenon, such as a word or a glitch, is input via input means, such as a keyboard, and processing means, such as a central processing unit (CPU), calculates a total number of the search phenomenon included in stored data. In addition, the CPU obtains a relationship between the total number and a cursor position controlled by a cursor control means, such as the keyboard. The relationship is displayed on a CRT. Moreover, the CPU compares the input logic signals with the reference logic signals, counts the total number of the different (or other) parts (words), obtains a relationship between the total number and the cursor position, and displays the comparison results on the CRT. The different or other parts may be regarded as the search phenomenon.

It is therefore one object of the present invention to provide an improved logic analyzer which is free from the disadvantages of the aforementioned prior art.

It is another object of the present invention to provide a logic analyzer which obtains a relationship between a total number of a predetermined phenomenon included in a stored input logic signal and a cursor position on a display means.

It is a further object of the present invention to provide a logic analyzer which obtains a relationship between a total number of a predetermined word included in a stored input logic signal and a cursor position on a display means.

It is an additional object of the present invention to provide a logic analyzer which obtains a relationship between a total number of glitches included in a stored input logic signal and a cursor position on a display means.

It is another object of the present invention to provide a logic analyzer which counts a total number of different or other parts of input and reference logic signals, and obtains a relationship between the total number and a cursor position displayed on a display means.

It is a further object of the present invention to provide a logic analyzer which obtains a relationship between a total number of a predetermined phenomenon included in a stored input logic signal and a cursor position on a display means when operating in a timing display mode and a state display mode.

Other objects, advantages, and features of the present invention will become apparent to those having ordinary skill in the art from a reading of the following detailed description when taken in conjunction with the accompanying drawings.

BRIEF DESCRIPTION OF THE DRAWINGS

FIG. 1 is a block diagram of a logic analyzer in accordance with the present invention;

FIG. 2 illustrates the contents of a memory circuit 28 used in FIG. 1;

FIG. 8 illustrates a display of the glitch search mode when in the state display mode according to the present invention;

FIG. 9 illustrates a display of the glitch search mode when in the state display mode according to the present invention;

FIG. 10 illustrates a display of the word compare mode in the state display mode according to the present invention; and FIG. 11 illustrates a display of a pattern compare mode when in the state display mode according to the present invention.

DETAILED DESCRIPTION OF THE INVENTION

Figure 3:
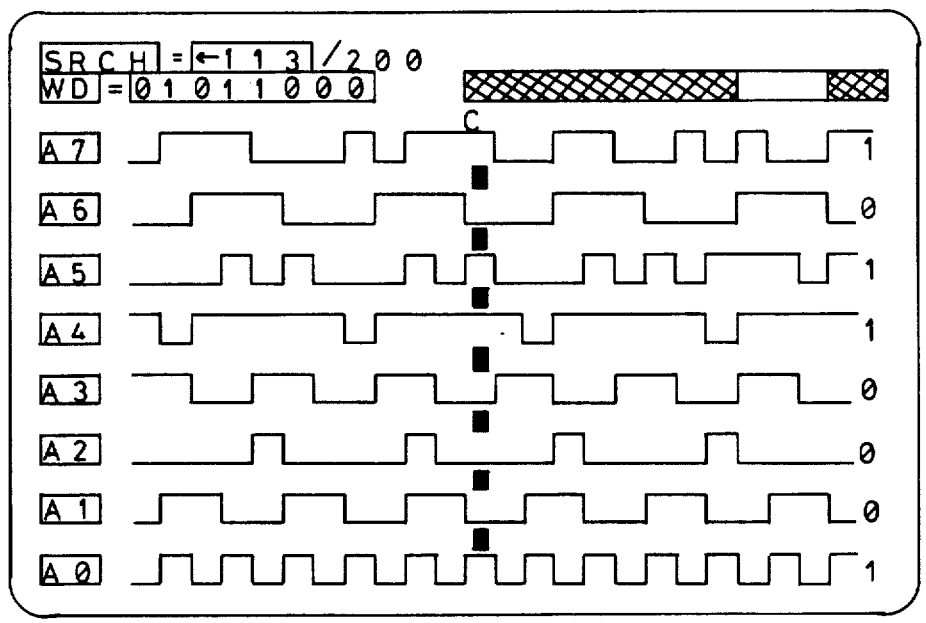
FIG. 3 illustrates a display of a word search mode when in a timing display mode according to the present invention.

Referring now to FIG. 1, there is shown a block diagram of a logic analyzer according to the present invention. Probe 10 has eight tips for detecting eight channel input logic signals from a circuit to be measured. The eight channel logic signals from probe 10 are applied to comparator/glitch detector 12, wherein the comparator converts the levels of the input logic signals to a proper logic level for each block of FIG. 1 (e.g. TTL level), and the converted signals are applied to data memory circuit 14, consisting of high speed RAMs or the like, and to trigger circuit 16 including a word recognizer (circuit for detecting a predetermined word) and a counter. The glitch detector of block 12 detects glitches from the input logic signals, and the detected glitches are applied to glitch memory circuit 18 consisting of high speed RAMs. The glitch detector may be a conventional circuit consisting of latch circuits, gates, etc. Blocks 14, 16, and 18 are connected to bus 20 (including data, address and control buses). Start/stop control circuit 22 causes memory circuits 14 and 18 to commence acquisitions in response to an instruction from bus 20, and stops the acquisitions in response to an output from trigger circuit 16. Central processing unit (CPU) 24 is, for example, a type Z80A microprocessor, and acts as a processing means. The Z80A is fully disclosed in "Z80/Z80A CPU Technical Manual" and "Z8400, Z80 CPU Product Specification" published by Zilog. Read only memory (ROM) 16 is a memory circuit for firmware to store data processing sequences of CPU 24, and RAM 28 is a memory means for acting as a temporary memory of CPU 24 and including a display RAM area. ROM 26 and RAM 28 are connected to bus 20. Keyboard 30 is connected to bus 20, and includes a plurality of keys for controlling a cursor position, inputting a search phenomenon in a search mode, and other control and input operations. Thus, keyboard 300 acts as an input means and a cursor control means. Display control circuit 32 connected to bus 20 controls the display of data on a display means 34, such as a raster scan type CRT by generating an intensity signal and horizontal and vertical scanning signals in accordance with the data stored in the display RAM area of RAM 28. Clock pulse generator 36 supplies a clock pulse to blocks 14, 16 and 18, the clock frequency being controlled in accordance with an instruction from bus 20. The clock frequency for blocks 24, 26, 28 and 30 is fixed to, for example, 4 MHz (is the CPU is the Z80A type).

For storing the input logic signals, an operator sets the clock frequency, a trigger word and a clock number for a trigger delay via keyboard 30. These set data are stored in a first area of RAM 28 (refer FIG. 2 showing the contents of RAM 28) through bus 20 and CPU 24, and are used to set trigger circuit 16 and clock pulse generator 36. When a write start instruction is applied from keyboard 30 to start/stop control circuit 22 through bus 20 and CPU 24, circuit 22 switches data memory circuit 14 and glitch memory circuit 18 to a write mode to start a write operation. As described hereinbefore, the data and glitch components of the input logic signals from probe 10 are respectively and sequentially stored in different addresses of memory circuits 14 and 18 through block 12. The addresses of memory circuits 14 and 18 are determined by an address signal from an address generator (not shown). It should be noted that the appointed addresses of memory circuits 14 and 18 correspond to each alternately occuring (i.e. every other) clock pulse. After the word recognizer in trigger circuit 16 detects the trigger word from the data components of the input logic signals, the counter counts a predetermined number of the clock and generates an output signal. In response to this output signal, start/stop control circuit 22 stops the write operations of memory 14 and 18. Thus, memory circuits 14 and 18 complete the storage of the logic signal to be measured.

When a display instruction is input via keyboard 30 in search mode or glitch mode, CPU 24 transfers the contents of memory circuits 14 and 18 to second and third areas of RAM 28 respectively in accordance with the firmware of ROM 28. The selections of the display modes (timing or state display mode) and the display area (selecting a display part of the stored logic signal to be measured) are made via keyboard 30, and information of the selected display mode and display area are stored in the first area of RAM 28 through bus 20 and CPU 24. Assuming that the selected display mode is the timing display mode, CPU 24 converts the data information in the second area of RAM 28 corresponding to the selected display area into FONT information of logic waveforms, converts the glitch information in the third area into ATTRIBUTE information, and stores the FONT and ATTRIBUTE information in the display RAM area of RAM 28 in accordance with the firmware of ROM 26. Display control circuit 32 is conventional type including a ROM for storing various patterns of logic waveforms and characters' (alphanumerics') patterns, a shift register for converting the parallel output from the ROM to a serial signal to generate a Z-axis (intensity) signal, and vertical and horizontal scan signal generators. Display control circuit 32 reads the contents of the display RAM area of RAM 28 repeatedly to display logic waveforms on CRT 34 as shown in FIG. 3. In FIG. 3, "A0" through "A7" at the left side indicate the channel number of logic signal and correspond to each tip of probe 10. These channel numbers are displayed similarly to the logic waveforms under control of the firmware of ROM 26. Characters surrounded by frames in the drawings indicate an inversion between black and white displays, the inversion being controlled by the ATTRIBUTE information stored in the display RAM area of RAM 28. In a bar graph consisting of crosshatched parts and a white part displayed at the top right side of FIG. 3, the length of the bar graph corresponds to all the stored logic signals to be measured (capacities of the second and third areas in RAM 28), and the white part corresponds to the present display area. A relationship between all the logic signals and the display may be determined by reference to this bar graph which is displayed in accordance with a method disclosed in Japanese Published Unexamined Patent Application 56-24579 corresponding to U.S. Pat. Ser. No. 172,107.

In the display of FIG. 3, "C" and seven black squares arranged longitudinally at the center portion indicate a cursor, and the position thereof is controlled by keyboard 30. When keyboard 30 determines the address of the cursor position with respect to the displayed waveforms, the cursor position information is stored in the first area of RAM 28 through bus 20 and CPU 24. CPU 24 stops the FONT and ATTRIBUTE information of the cursor in the corresponding addresses of the display RAM area of RAM 28 in accordance with the cursor position information under control of the firmware of ROM 26. Since display control circuit 32 reads the contents of the display RAM area repeatedly, the cursor is displayed on CRT 34. "10110001" positioned longitudinally at the right side of FIG. 3 indicates logic levels of each logic signal at the cursor position (cursor word). This word is useful to confirm the cursor word, when a channel number of the displayed waveforms is large or a pulse width (a period between the rising and falling edges) is narrow. The cursor word is displayed by CPU 24 in accordance with the firmware of ROM 26 as follows. Firstly, CPU 24 reads the data at the cursor position from the data information stored in the second area of RAM 28 in response to the cursor position information stored in the first area of RAM 28. CPU 24 judges "1" and "0"0 of the read-out data, and stores FONT information of the words (1 and 0) in the display RAM area of RAM 28 for displaying on CRT 34 simultaneously with other information.

If the cursor is moved by keyboard 30, the cursor position information in the first area of RAM 28 changes and the aforementioned operation is repeated. If a signal from the keyboard 30 instructs the movement of the cursor toward the outside of the displayed waveforms after the cursor is positioned at the end of the displayed waveforms, the displayed waveforms are moved, however the position of the cursor remains fixed at the end of the displayed waveforms. Therefore, the cursor is substantially moved. For example, if the cursor is instructed to further move to the right after the cursor is moved to the right end of the displayed waveforms, the displayed waveforms are moved to the left, i.e., the displayed waveforms are erased from the left end in accordance with the cursor movement value, and new waveforms appear from the right end. In this instance, the white part of the bar graph is moved. This operation is generally known as a scroll mode. In the scroll mode, the displayed window area is determined by the cursor, and CPU 24 may read all the logic signals of a new display area from the second and third areas of RAM 28 for repeating the above described display operation. However, it is effective to shift the waveform information in the display RAM area of RAM 28 by a number of the addresses corresponding to the cursor movement value, read the new waveform information corresponding to the value lacked by shifting (the end part of the waveform information is erased by shifting) from the second and third areas of RAM 28, and store the new waveform information in the display RAM area under control of CPU 24.

The search mode of the present invention will be discussed, which follows the above description. When the search word mode is selected via keyboard 30, CPU 24 displays "SRCH" (meaning the search mode) at the top left portion of the display screen by a use of the display RAM area in accordance with the firmware of ROM 26. If the search phenomenon is a word, "WD" (meaning the word) is displayed under "SRCH". The search word is input by keyboard 30 and stored in the first area of RAM 28 through bus 20 and CPU 24. In this embodiment, the search word is "01011000" and converted into the character information (FONT and ATTRIBUTE information) to be stored in the display RAM area for displaying as shown in FIG. 3.

Figure 4A:
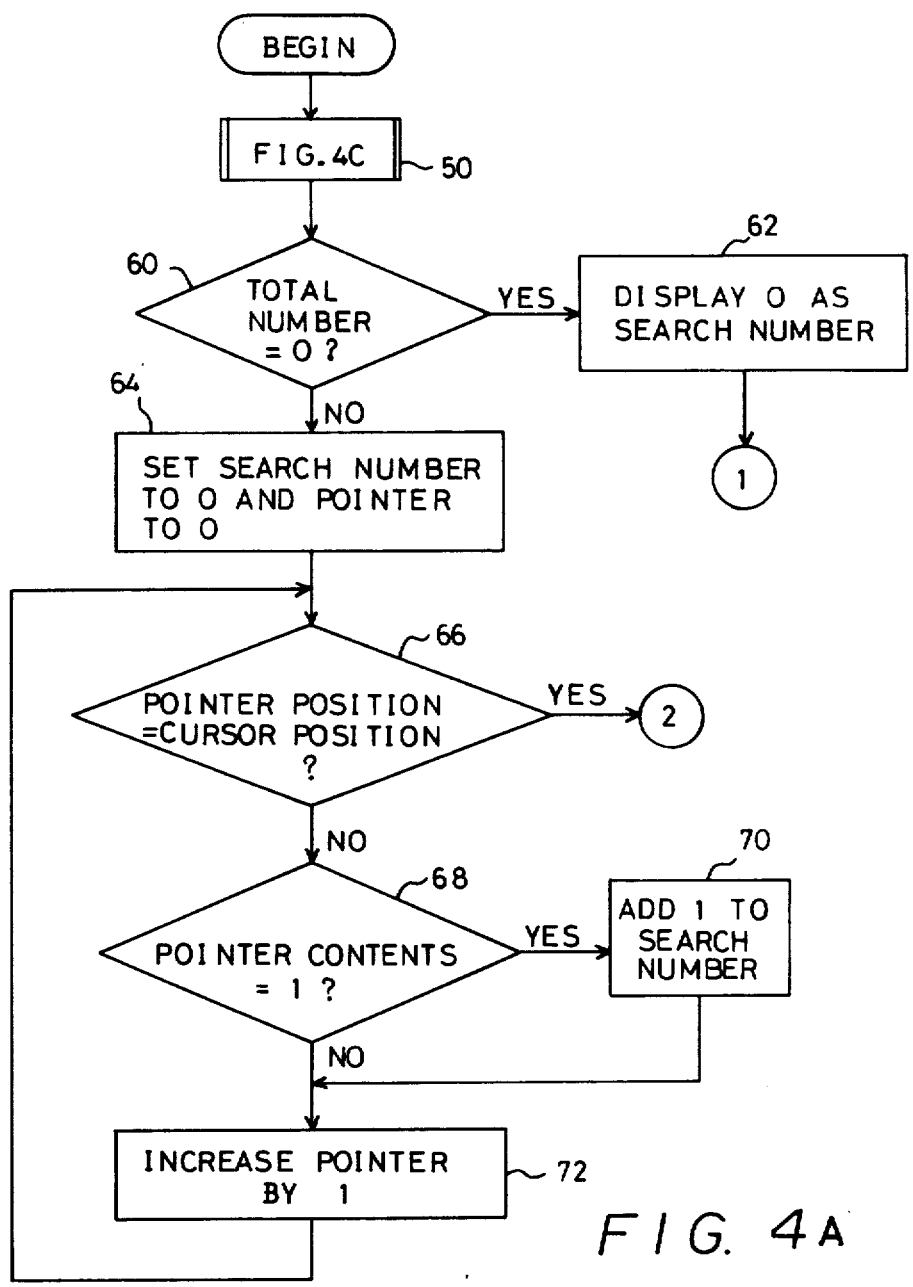
FIGS. 4A-4E in combination illustrate flow charts for explaining the present invention.
Figure 4B:
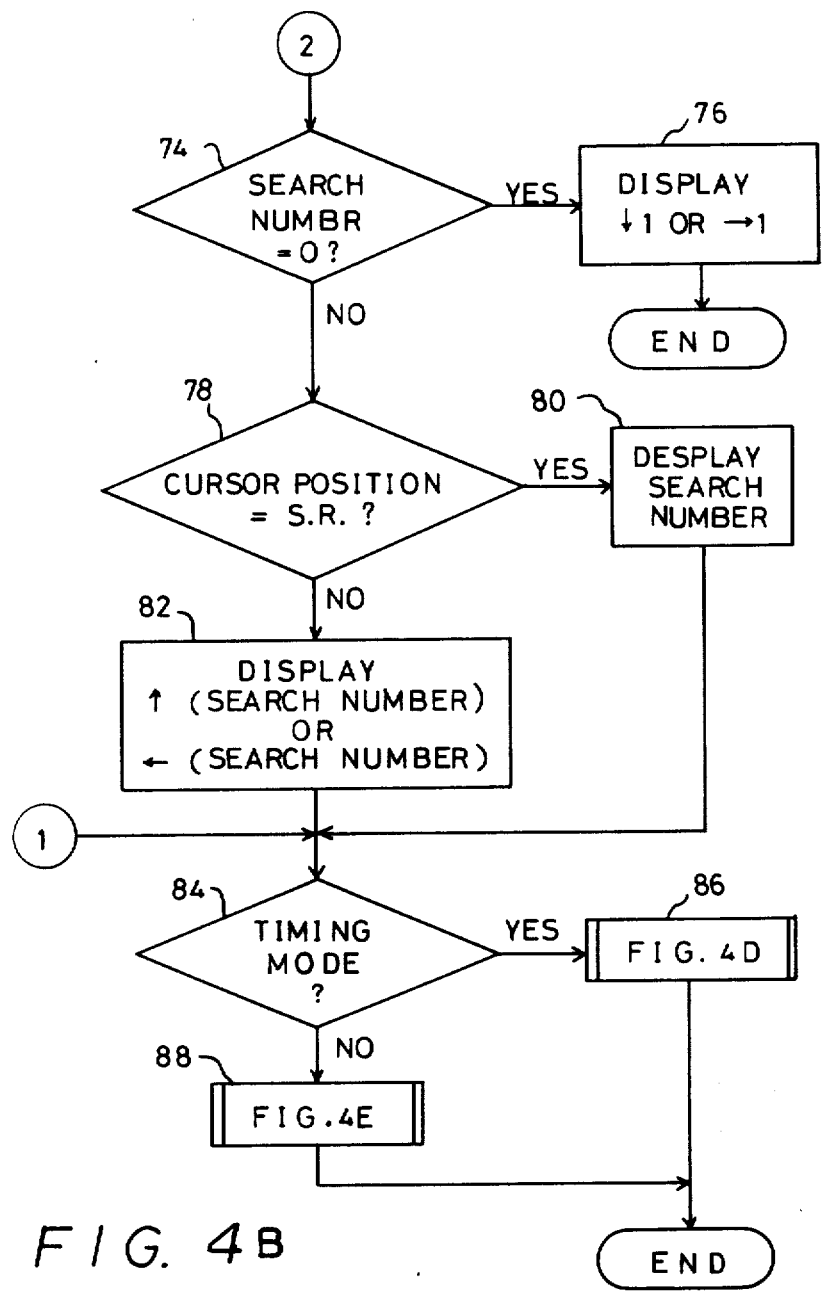
Figure 4C:
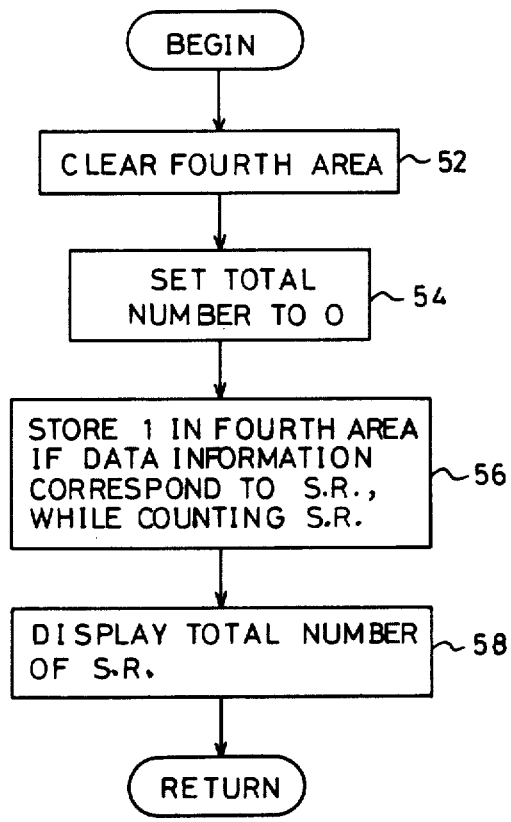

The following operations will be discussed by reference to flow charts shown in FIGS. 4A through 4E. The operations are controlled by CPU 24 under control of the firmware of ROM 26. CPU 24 counts a total number of the selected phenomena (or parts, words, different from reference logic signals) stored in the second or third area of RAM 28 at step 50 which is shown in FIG. 4C in detail. Of course, the present mode is the search word mode, however, it should be noted that the flow charts of FIGS. 4A through 4E are available to all the search word, search glitch and comparison modes. In FIG. 4C, CPU 24 clears a fourth area of RAM 28 at step 52, and sets a memory address of the first area for storing the total number to zero at step 54. In step 56, CPU 24 compares the search word stored in the first area of RAM 28 with the data information stored in each address of the second area, and stores "1" in a corresponding address of the fourth area if the data information is the same as the search word. If the data information and the search word are different from each other, the data of the fourth area is not changed, i.e, "0" remains in the corresponding address of the fourth area. CPU 24 counts the total number of the search word stored in the second area at step 56 by counting one when the data information corresponds to the search word. The counted total number is stored in the first area of RAM 28. In FIG. 4C, "S.R." means the search phenomenon (word or glitch) or the reference logic signal. The total number is two hundred in this example, and is displayed as "200" on CRT 34 by converting it into the character information to be stored in the display RAM area in step 58.

Returning to FIG. 4A, CPU 24 judges whether the total number is zero or not at step 60. Step 84 of FIG. 4B is followed through 62 if so, and step 64 is followed if not so. In step 62, CPU 24 displays "0" on CRT 34 as a search number that is a number of the search word stored in the addresses of the second area of RAM 28 on or before the cursor position address. The cursor position address may be obtained from the cursor position information in the first area. In step 64, CPU 24 sets the search number to zero and further sets a pointer to zero. CPU 24 judges whether the pointer position is equal to the cursor position in step 66, wherein step 74 of FIG. 4B is led if so, and step 68 is led if not so. In step 68, CPU 24 judges whether the contents of the fourth area of RAM 28 corresponding to the pointer position is one or not. If the pointer's contents is "1", i.e., if the data information at the pointer position is the same as the search word, step 70 is followed. If the pointer's contents is not "1", i.e., if the data information at the pointer position is different from the search word, step 72 is followed. In step 70, CPU 24 adds one to the search number, and step 72 is led. In step 72, CPU 24 increases the pointer position by one and returns to step 66. In other words, CPU 24 counts the search number on or before the cursor position by counting "1" in the fourth area of RAM 28 through steps 66–72.

Figure 5:
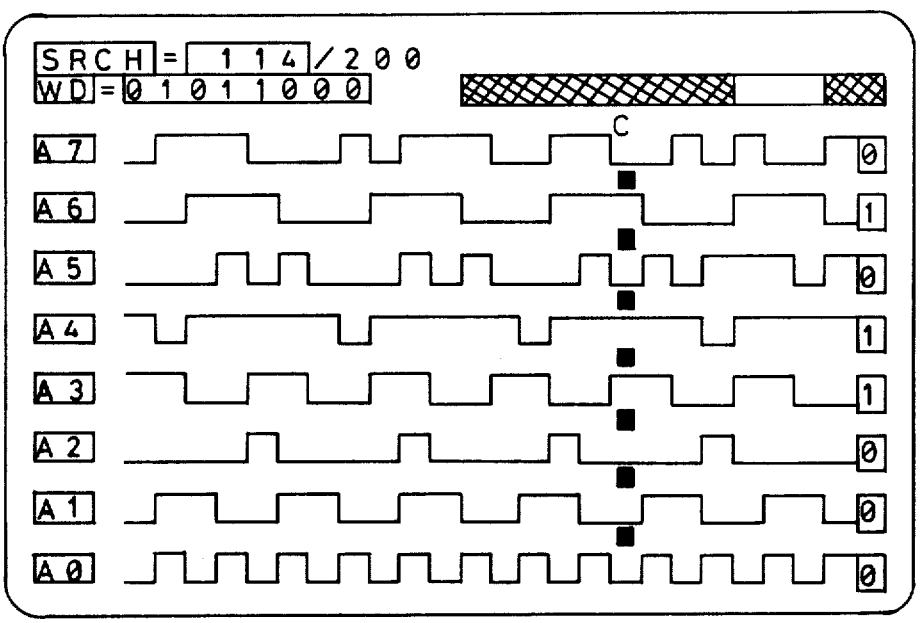
FIG. 5 illustrates another display of the word search mode when in the timing display mode according to the present invention.

Referring to FIG. 4B, CPU 24 judges the search number counted through steps 66–72 is zero or not in step 74, wherein step 76 or 78 are followed if so or not so respectively. In step 76, CPU 24 displays " ↓ 1" (state display mode) or "→1" (timing display mode) on CRT 34, and the display means that the first search word is positioned after the cursor position. After step 76, this mode ends. In step 78, CPU 24 judges whether the data information at the cursor position is the search word (S.R.) and leads to step 80 or 82. When the cursor positions' data (cursor word) corresponds to the search word, CPU 24 displays the search number on CRT 34 in step 80 and leads to step 84. When the cursor word differs from the search word, CPU 24 displays " ↑ (search number)" (state display mode) or "←(search number)" (timing display mode) on CRT 34 in step 82 and leads to step 84. This display indicates that the search word at the search number is located before the cursor position. In the embodiment of FIG. 3, there are 113 search words prior to the cursor, and the 114th search word is positioned after the cursor. "←113" indicates that the 113rd search word is positioned before the cursor, and the corresponding character information is stored in the display RAM area by CPU 24. When the cursor position corresponds to the 114th search word by sequentially moving the cursor to the right via keyboard 30, CRT 34 displays as shown in FIG. 5, where "SRCH=114/200" indicates that the cursor position corresponds to the 114th of the 200 search words. It should be noted that the arrow is erased, because CPU 24 counts the search words on and before the cursor position, and detects the cursor position is on the search word. After the detection, CPU 24 changes the ATTRIBUTE of the character information of the cursor word stored in the display RAM area for reversing the black and white of the cursor word display. This reverse operation is controlled as follows.

Figure 4D:
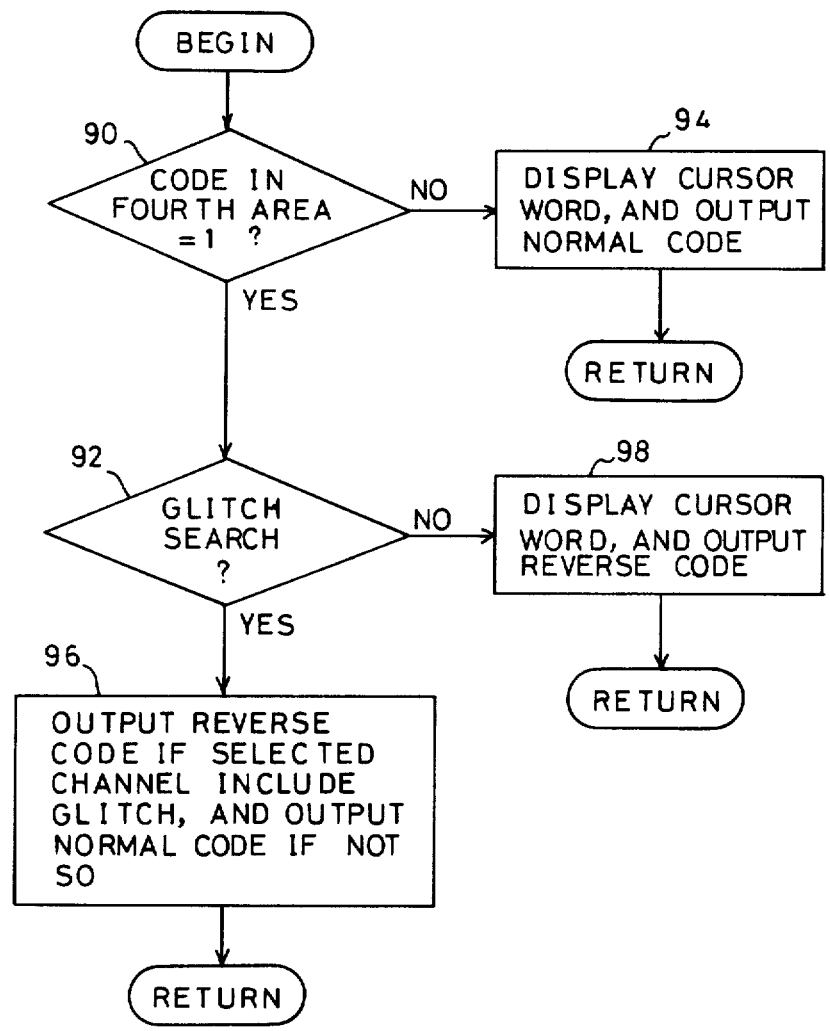
Figure 4E:
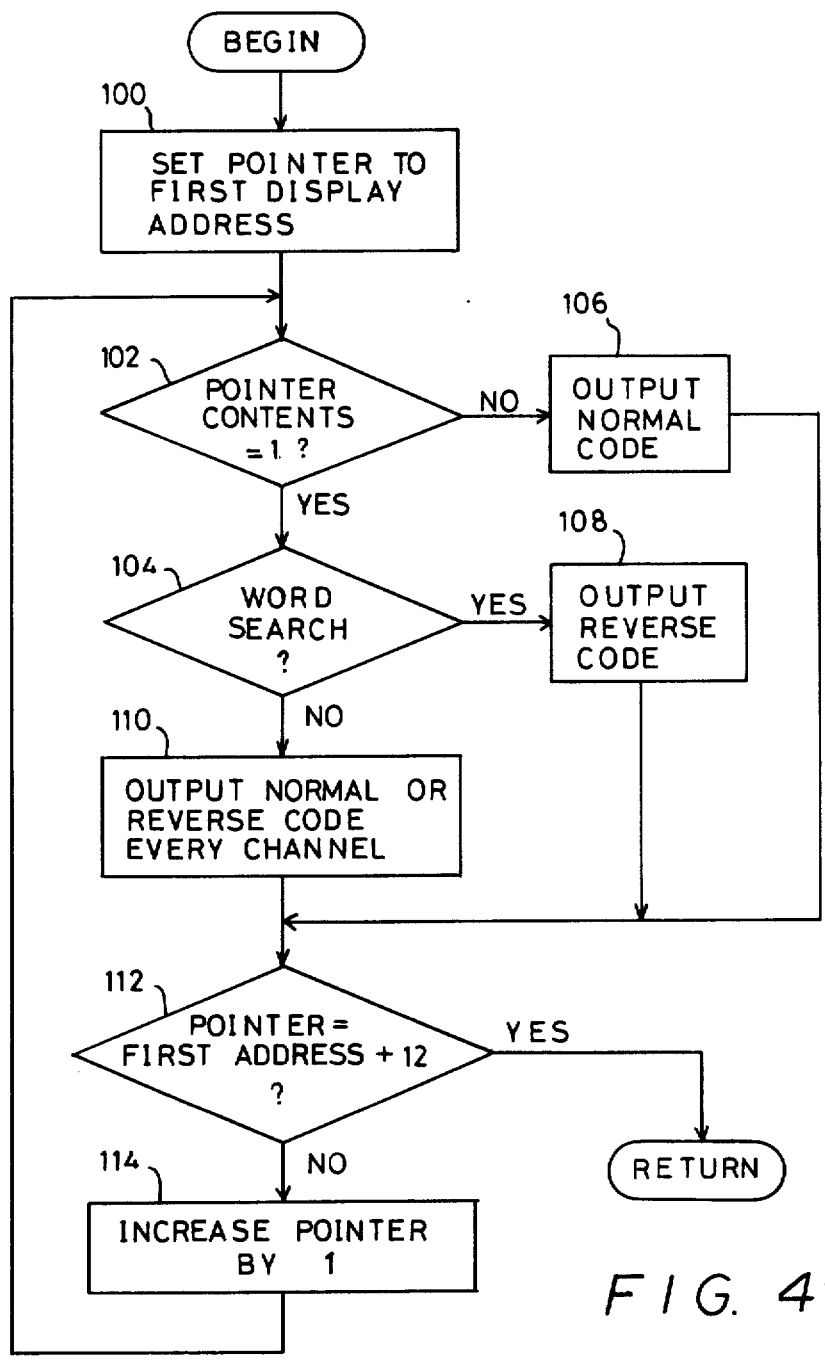

Returning to FIG. 4B, CPU 24 judges whether the present mode is the timing display mode or not in step 84. If the timing display mode is selected, step 86 is followed (this step is shown in FIG. 4D). If the timing display mode is not selected (the state display mode is selected), step 88 shown in FIG. 4E is followed. After step 86 or 88, the mode ends.

The reverse operation in the timing display mode will be discussed by reference to FIG. 4D. In step 90, CPU 24 judges whether the code in the fourth area of RAM 28 at the cursor position is "1" or not. If the code is "1", i.e., if the data at the cursor position is the search word, step 92 is followed. If not so, i.e., if the search word is not located on the cursor position, step 94 is followed wherein CPU 24 displays the cursor word by reading the data information in the second area at the cursor position and outputs a normal code as the ATTRIBUTE. Thus, the cursor word is displayed normally as shown in FIG. 3. After step 94, CPU 24 returns to the sequence of FIG. 4B. In step 92, CPU 24 judges whether the present mode is the glitch search mode or not. If the glitch search mode is selected, CPU 24 processes step 96 and returns to the main routine. If the word search mode is selected, CPU 24 outputs a reverse code as the ATTRIBUTE for reversing the cursor word display in step 98 as shown in FIG. 5. After step 98, CPU 24 returns to the main routine.

Therefore, the logic signal measurement becomes very easy because of the relationship between the cursor position and the total number of the search word in the logic signals stored in the memory means. Moreover, the search function is available in the timing display mode, so that the measurement is further improved. If the search word is positioned after (at the right of) the cursor position, the display may be "SRCH=113/200". In the case to display the search word with the arrow (the cursor word is not the search word), it is convenient to display the arrow "←" when the cursor is moved to the right and the arrow "→" when the cursor is moved to the left because the cursor movement process can be judged. The search word can be detected automatically (automatic search mode) by moving the cursor sequentially and stopping automatically the cursor movement when the cursor position is on the search word under control of the firmware of ROM 26. For this automatic search mode, the counter counts the low frequency clock pulse to renew sequentially the cursor position information in the first area of RAM 38, and CPU 24 stops the counter to count when the cursor word corresponds to the search word. The next search word can be detected to restart the counter operation.

Figure 6:
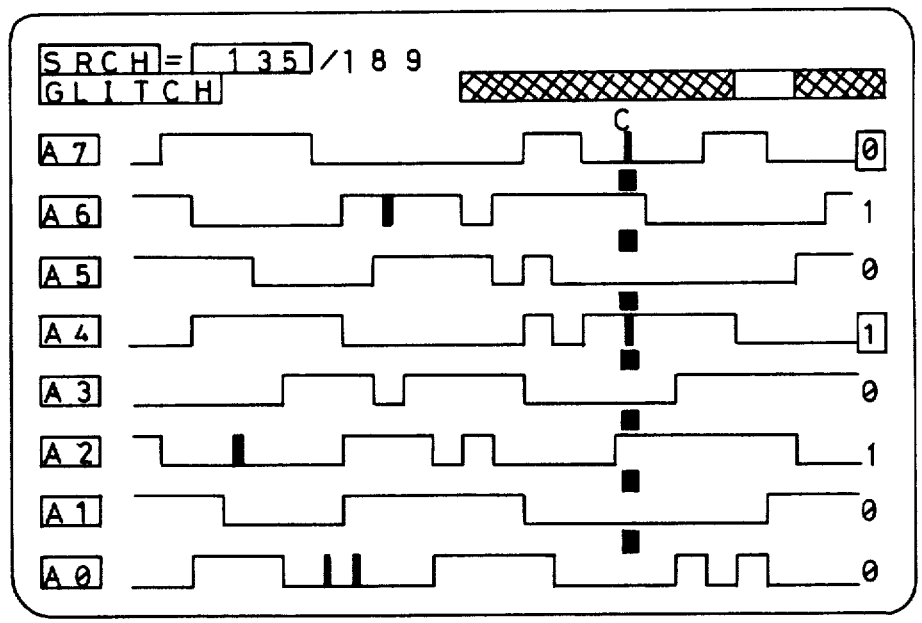
FIG. 6 illustrates a display of a glitch search mode when in the timing display mode according to the present invention.

FIG. 6 is an example display, wherein the search phenomenon is the glitch in the timing display mode. In the display, the glitches are displayed as black thick lines in the logic waveforms by converting the glitch information in the third area of RAM 28 into the ATTRIBUTE information and storing it in the display play RAM area under control of CPU 24. When the glitch search instruction is input via keyboard 30, CPU 24 stores the character information of "GLITCH" in the display RAM area and displays it on CRT 34 in accordance with the firmware of ROM 26. Similarly to the search word mode, CPU 24 counts a total number of the glitches stored in the third area of RAM 28 in accordance with steps 52–58 of FIG. 4C, counts a number of the glitches (search number) on and before the cursor position in accordance with steps 60–72 of FIG. 4A, and stores these counted values as the character information in the display RAM area for displaying on CRT 34. In the glitch search mode, even if the glitches are present on the same address of a plurality of channels (i.e., a plurality of glitches are present on the same time point of the display), these glitches are counted as one in step 56. For applying the flow charts of FIGS. 4A–4E to the glitch search mode, the word "search word" of the above description is changed to "glitch". In the glitch search mode, step 96 is followed after step 92. It should be noted that step 96 is led when the input logic signals at the cursor position include a least one glitch. After CPU 24 detects "1" of the fourth area of RAM 28 at the cursor position, CPU 24 reads the contents of the third area at the cursor position which are glitch information for checking each channel includes the glitch. CPU 24 outputs the reverse code as the ATTRIBUTE of the cursor word if the selected channel includes the glitch, and outputs the normal code as the ATTRIBUTE thereof if not so. Therefore the cursor word display is reversed at only the channel including the glitch. In example of FIG. 6, the total number of the glitches is one hundred and eighty-nine, and the glitches at the cursor position (channels A4 and A7) are the 135th. As described hereinbefore, only the channel data of the cursor word including the glitch is inverted (surrounded by the squares), however, all the channel data may be reversed.

Figure 7:
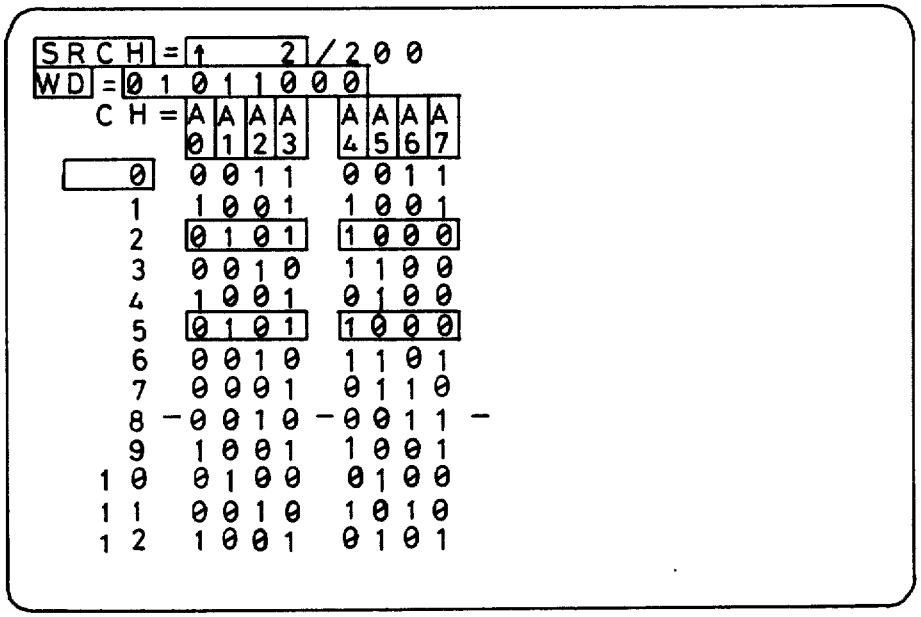
FIG. 7 illustrates a display of the word search mode when in a state display mode according to the present invention.

FIG. 7 shows a display example, wherein the search phenomenon is the word in the state display mode. A different point from the operations of FIGS. 3 and 5 is that the logic signals are displayed with only characters "1" and "0". For this end, CPU 24 converts the data of the second area appointed by keyboard 30 into the character information to be stored in the display RAM area. In the display of FIG. 7, "A0" through "A7" on the third line indicate the channel numbers, and the display under them indicates the data of each channel. "0, 1, 2 ... 11, 12" arranged longitudinally at the left side indicate the address numbers of the second area of RAM 28. These channel numbers and address numbers are displayed in accordance with the firmware of ROM 26. Three lines at the address number "8" are the cursor controlled by keyboard 30. A display "SRCH= ↑ 2/200" at the top indicates that the total number of the search word is two hundreds, and the second search word is positioned before (higher than) the cursor position of the address "8". If "SRCH= ↓ 3/200" is displayed, the third search word is positioned after (lower than) the cursor position. Since the data at the addresses 2 and 5 are the search word, the display is inverted. This inversion is done by controlling the ATTRIBUTE of the character information corresponding to the addresses of the search word detected by comparing the data of the second area of RAM 28 with the search word. This display method is the same as the aforementioned word search mode of the timing display mode by reference to FIGS. 4A–4C except step 84.

In step 84, step 88 is followed since the timing display mode is not selected. Step 88 will be described in detail by reference to FIG. 4E. In step 100, CPU 24 sets the pointer to the address of the fourth area of RAM 28 corresponding to the selected first display address of the second area, e.g., the address 0 in the case of FIG. 7. CPU 24 judges whether the pointer contents (contents of the fourth area at the pointer position) is one or not in step 102. If the data information of the second area at the first display address is the same as the search word, the pointer contents are "1" and thereby step 104 is followed. If the pointer contents are not "1", step 106 is followed wherein CPU 24 generates the normal code as the ATTRIBUTE for displaying the selected (first) line of the state table in the normal display. After step 106, the next is step 112. In step 104, CPU 24 judges whether the word search mode is selected or not. If the word search mode is selected, CPU 24 generates the reverse code as the ATTRIBUTE for reversing the selected line display in step 108, since the selected line includes the search word. The next of step 108 is step 112. If the word search mode is not selected, i.e., if the glitch search or the comparison mode is selected, step 112 is followed through step 110. In step 112, CPU 24 judges whether the pointer position is equal to the first address plus twelve or not. Since, only thirteen lines (date) is displayed simultaneously in the state display mode, CPU 24 checks the pointer address corresponds to the final line of the state display in step 112. If the pointer address is the final line, CPU 24 returns to the main routine. If the pointer address is before the final line, CPU 24 increases the pointer address by one and returns to step 102. Thus, CPU 24 controls the display of the state table via steps 110–114, and inverses only the search words as shown in FIG. 7.

FIG. 8 shows a display example of CRT 34 wherein the search phenomenon is the glitch in the state display mode. Since the operation of the search mode is substantially equal to that of FIG. 6 and the operation of the state display is substantially equal to that of FIG. 7, only differences will be discussed. The display of FIG. 8 is obtained via the steps of FIGS. 4A, 4B, 4C and 4E. In step 104 of FIG. 4E, since the glitch search mode is selected, step 110 is followed. This step 110 is similar to step 96, and CPU 24 reads each channel of the third area of RAM 28 at the address including at least one glitch. If the selected channel does not include the glitch, CPU 24 outputs the normal code as the ATTRIBUTE for displaying the normal state table. If the selected channel includes the glitch, CPU 24 outputs the reverse code as the ATTRIBUTE for displaying the reversed state table. Thus, only the channel data including the glitch are reversed every address. The display of FIG. 8 indicated that a total number of the glitches is one hundred and twenty-four, the seventy third glitch is located on the cursor position at the address "104", and the inverted data include the glitches. The state display mode is different from the timing display mode, since the former does not display the glitch in the prior arts. Thus, it is useful to invert the data including the glitch in the state display mode. All the data at the address including the glitch may be inverted.

FIG. 9 shows another display example of CRT 34, wherein the search phenomenon is the glitch in the state display mode. This display is similar to the display of FIG. 8, however, the data are displayed in hexadecimal. CPU 24 divides the data stored in the second area of RAM 28 into two groups, one consisting of the channels 0, 1, 2 and 3 and the other one consisting of the channels 4, 5, 6, and 7, and converts the divided data to the hexadecimal in accordance with the firmware of ROM 26. A display "H" at the third line indicates the hexadecimal.

The scroll mode described in the timing display mode is available in the state display mode. When the cursor is instructed to move to the outside of the display by keyboard 30 after the cursor is positioned at the top or bottom of the display, the display is moved with fixing the cursor at the top or bottom of the display so that the cursor is substantially moved. For example, if the cursor is instructed to move upward after the cursor is positioned at the top of the display, the display data is moved downward, wherein the data corresponding to the cursor movement value is erased from the bottom end of the display, and new data corresponding to the erased data value appears from the top end of the display. In the scroll mode, the display area is determined by the cursor, and CPU 24 may read all the logic signals of a new display area from the second and third areas of RAM 28 for repeating the above described display operation. However, it is effective to shift the data information (logic signals) in the display RAM area of RAM 28 by a number of the addresses corresponding to the cursor movement value, read the new data information corresponding to the value lacked by shifting (the end part of the data information is erased by shifting) from the second and third areas of RAM 28, and store the new data information in the display RAM area under control of CPU 24.

In the comparison mode, input logic signals are detected by probe 10 and stored in data memory circuit 14 as described hereinbefore. When the transfer instruction is input from keyboard 30, CPU 24 transfers the contents of memory circuit 14 to the second area of RAM 28 in accordance with the firmware of ROM 26. The second area is first memory means, and the logic signals stored in this first memory means are reference logic signals. In this instance, it is desirable that probe 10 detects logic signals from a reference apparatus.

Similarly to the aforementioned operation, logic signals from an apparatus to be measured are stored in memory circuit 14. In response to a display instruction from keyboard 30, CPU 24 transfers the contents of memory circuit 14 to a third area of RAM 28 under control of the firmware of ROM 26. The third area is second memory means, and the logic signals stored in this second memory means are the input logic signals. When the display mode and a display area (a part of the stored logic signals to be displayed) are selected via keyboard 30, CRT 34 displays one of or both of the contents of the second and third areas of RAM 28 in accordance with the processes described hereinbefore by reference to FIGS. 7, 8 and 9. FIG. 10 shows a display of both of the contents of the second and third areas. "1" and "0" at the left half of CRT 34 are logic states of the selected addresses in the third area of RAM 28. "ACQ" at the third line of the left half means the acquired input logic signals, and a display "CH=0 1 2 3 4 5 6 7" under the third line indicates a channel number of each logic signal which corresponds to each tip of probe 10. In other words, the display under the channel number is its data. These display "ACQ" and the channel numbers are displayed via the display RAM area by CPU 24 under control of the firmware of ROM 26. "123, 124 . . . 134, 135" at the left side of the display indicates the addresses of the third area of RAM 28, and is displayed by CPU 24 in accordance with the display area code in the first area of RAM 28 under control of the firmware of ROM 26.

Similarly, the contents of the second area of RAM 28 corresponding to the selected (displayed) addresses of the third area are displayed at the right half of the display. "REF" at the first line of the right half display means the reference logic signals, and "CH=0 1 2 3 4 5 6 7" under the first line indicates the channel numbers. These displays are based on FONT information stored in the display RAM area of RAM 28.

CPU 24 compares all the contents of the second and third areas of RAM 28 under control of the firmware of ROM 26. This comparison operation is made between the addresses 0 and 255 in accordance with step 50 (FIG. 4C) of the aforementioned flow charts. In step 56, CPU 24 stores "1" in the corresponding address of the fourth area of RAM 28, when the data information (acquired logic signals) at the selected address of the third area is different from the reference logic signal at the corresponding address of the second area. In this mode, "S.R." in steps 56, 58 and 78 means the data different from the reference logic signals. CPU 24 counts the total number of different parts (words) between the input (acquired) and reference logic signals through steps 52–56, the displays the total number on CRT 34 in step 58. In the example of FIG. 10, the total number is 225. The search number is counted via steps 60–72, wherein the search number is a number of the different parts on or before the cursor position. This search number is displayed in accordance with steps 74–82 as shown in FIG. 10. In this example, the search number is 103, and "CMPR= ↑ 103/225" is displayed. "CMPR" means the comparison mode, and " ↑ 103/225" indicates that the total number of the different parts is 225 and the 103rd different part is located at an upper portion ( ↑ ), a prior address (129) with respect to the cursor position (130). The arrow is displayed, since the input and reference logic signals at the address 130 are equal to each other. If the cursor is located at the address 129 or 131, the display may respectively be "103/225" or "104/225". The total number and the search number may be directly converted to the FONT information and stored in the display RAM area, instead of staring them in the first area of RAM 28.

The different parts (words) of the displayed data are reversed in accordance with steps 100–114 similarly to the glitch search mode. Especially in step 110, after CPU 24 detects the different part by reference to the fourth area of RAM 28, CPU 24 obtains an exclusive OR of each channel of the input and reference logic signals at the different parts. The results of the exclusive OR is "1" at a channel including different logic signals, and it is "0" at a channel including the same logic signal. In accordance with this exclusive OR operation, CPU 24 controls the ATTRIBUTE of the state display, so that the different parts are reversed every channel. Thus, the display of FIG. 10 is obtained.

When the cursor position is moved by keyboard 30, the cursor position information in the first area of RAM 28 is changed, and CPU 24 counts the search number by a use of the fourth area of RAM 28 to obtain the relationship between the total number of the different parts and the cursor position. If the cursor is moved upward from the bottom end and reaches to the address 130, the relationship may be displayed as "CMPR= ↓ 104/225". This indicates that the 104th different part is located under (after) the cursor.

A display "CMPR WDO=0-255" at the second line of FIG. 10 indicates that the data between the addresses 0 and 255 are compared. In other words, "CMPR WDO" means a comparison window, and "0-255" indicates the address range. The addresses are selected by keyboard 30, and stored in the first area of RAM 28. The total number of the different parts is within this comparison range. When CPU 24 judges that the addresses of the displayed data are within the comparison range in accordance with the firmware of ROM 26, a character "C" is displayed at the left side of the address number. "C" is stored at the FONT information in the display RAM area of RAM 28. Therefore, it is easy to judge the comparison range.

In the above explanation, CPU 24 counts the different parts of the logic signals stored in the second and third areas of RAM 28, and obtains the relationship between the total number and the cursor position. However, CPU 24 may count the same parts and obtain the relationship between the total number of the same parts and the cursor position. Moreover, the display of the same parts may be inverted between black and white. In this instance, when the outputs of the comparison function of CPU 24, an exclusive OR function, are zero in all channels, the counting operation is enabled. The other operations are the same as the above-described operations.

In the embodiment of FIG. 10, the comparison is made every address and channel. However, the comparison operation may be done by regarding the data of a plurality of addresses in the reference logic signals as one pattern (pattern search mode). This operation will be discussed by reference to FIGS. 1 and 11. Firstly, the data of the desired addresses are selected from the reference logic signals via keyboard 30. In this embodiment, the addresses 39, 45, and 41 are selected in this order. For selecting the addresses, all the reference logic signals may be displayed in the scroll mode, and the selected address display by keyboard 30 may be inverted between black and white. The selected addresses are stored in the first area of RAM 28, and they are displayed on CRT 34 as the right half of FIG. 11 simultaneously with the data of these addresses. After that, the address order may be exchanged. the data of the three addresses are regarded as a single reference pattern. CPU 24 compares the data of the address 39 in the second area (reference logic signal) of RAM 28 with the data of each address in the third area (input logic signal) under control of the firmware of ROM 26. When CPU 24 finds the data in the third area corresponding to the address 39's data of the second area, CPU 24 compares the data at the next address of the third area with the data at the address 45 of the second area. If these data are equal to each other, CPU 24 compares the data at the further next address of the third area with the data at the address 41 of the second area. If the data at the further next address of the third area is the same as the address 41's data of the second area, the reference pattern is detected in the third area, and thereby CPU 24 counts by one and reverses the reference pattern portion of the acquired logic signal display. If the data at the next address of the third area is different from the address 45's data of the second area, or the data at the further next address of the third area is different from the address 41's data of the second area, CPU 24 continues to find the address 39's data of the second area in the third area and repeats the foregoing operation. Thus, CPU 24 can search the reference pattern in the third area and counts the total number of the corresponding patterns. In addition, CPU 24 counts the corresponding patterns on and before the cursor position, displays "CMPR PATER=13/13" at the first line of FIG. 11 similarly to FIG. 10, and inverts the display of the corresponding pattern. "CMPR PATER" indicates the comparison pattern mode, and "13/13" indicates that the total number of the reference patterns is 13 and the cursor position (address 203 in the example) is located on the thirteenth reference pattern. If the cursor position is the address 205, a display may be " ↑ 13/13". Since the comparison window is from the addresses 0 to 206 in this example, the character "C" is not displayed at the left sides of the addresses 207, 208, and 209.

In the above description, CPU 24 displays the relationship between the total number of the input logic signals corresponding to the reference pattern and the cursor position, and inverts the input logic signals' display corresponding to the reference pattern. However, the relationship between the total number of the input logic signals different from the reference pattern and the cursor position may be displayed. The address number of the reference pattern may be any number including three.

As described hereinbefore, the logic analyzer of the present invention can obtain the relationship between the total number of the predetermined phenomenon (search word or glitch) included in the input logic signals stored in the memory means and the cursor position of the display means, so that the search mode is very useful. Since the word and glitch search modes are available in the timing and state display modes, the measurement is more convenient. In addition, the present invention compares the input logic signal with the reference logic signal, counts the total number of different or equal parts, and obtains the relationship of the total number and the cursor position.

The software controlling CPU 24 in the preferred embodiment described with respect to FIGS. 4A-4E is shown in Appendix A. This software is the machine code of the Z80A.

While we have shown and described herein the preferred embodiment of our invention, it will be apparent to those skilled in the art that many changes and modifications may be made without departing from our invention in its broader aspects. For example, the automatic search function described in conjunction with FIGS. 3 and 5 may be applied to the operations of the state display mode. In this instance, when the predetermined phenomenon or the different (or same) part is detected, the inversion technique may be applied to the display. However, an intensity modulation technique or an underline may be used to indicate the desired portions. In the comparison mode, the reference logic signals may be obtained by inputting via the keyboard or modifying a part of the signals detected by the probe by the keyboard instead of using the signals detected by the probe. The display means may be a flat display such as liquid crystal and plasma displays, and an X-Y plotter instead of the CRT. The state table may be displayed in the octal or hexadecimal by dividing the input logic signals to groups each consisting of three or four channels. A number of the probe tips, namely, a number of the channel, may be any desired number. The addresses of the input or reference logic signals may be offset when displaying and comparing the input and reference logic signals. If the addresses of the reference logic signals are offset by, for example, +50, the input logic signals at the addresses 0 through 205 and the reference logic signals at the addresses 50 through 255 are displayed and compared with each other. There may be a case that the data at one addres of the input logic signals is the common parts of two reference patterns in the comparison of the reference pattern and the input logic signals, if the data of the first address of the reference pattern is the same as the last address. However, there is no problem, if the reference pattern is detected only when the cursor is positioned on the first address of the reference pattern. Therefore, the scope of the present invention should be determined only by the following claims.

APPENDIX A

| LOC | INST | MNEM | OPER |
|---|---|---|---|
| DA56 | 2A2A20 | LD | HL,(202A) |
| DA59 | 53 | LD | D,E |
| DA5A | 2F | CPL | |
| DA5B | 57 | LD | D,A |
| DA5C | 204D | JR | NZ,4F |
| DA5E | 45 | LD | B,L |
| DA5F | 4D | LD | C,L |
| DA60 | 42 | LD | B,D |
| DA61 | 45 | LD | B,L |
| DA62 | 52 | LD | D,D |
| DA63 | 53 | LD | D,E |
| DA64 | 202A | JR | NZ,2C |
| DA66 | 2A2059 | LD | HL,(5920) |
| DA69 | 4F | LD | C,A |
| DA6A | 4B | LD | C,E |
| DA6B | 4F | LD | C,A |
| DA6C | 4B | LD | C,E |
| DA6D | 41 | LD | B,C |
| DA6E | 57 | LD | D,A |
| DA6F | 41 | LD | B,C |
| DA70 | 204D | JR | NZ,4F |
| DA72 | 41 | LD | B,C |

| LOC | INST | MNEM | OPER |
|---|---|---|---|
| DA73 | 4E | LD | C,(HL) |
| DA74 | 4F | LD | C,A |
| DA75 | 4D | LD | C,L |
| DA76 | 45 | LD | B,L |
| DA77 | 2054 | JR | NZ,56 |
| DA79 | 53 | LD | D,E |
| DA7A | 55 | LD | D,L |
| DA7B | 4B | LD | C,E |
| DA7C | 41 | LD | B,C |
| DA7D | 4D | LD | C,L |
| DA7E | 4F | LD | C,A |
| DA7F | 54 | LD | D,H |
| DA80 | 4F | LD | C,A |
| DA81 | 2059 | JR | NZ,5B |
| DA83 | 55 | LD | D,L |
| DA84 | 4D | LD | C,L |
| DA85 | 4F | LD | C,A |
| DA86 | 54 | LD | D,H |
| DA87 | 4F | LD | C,A |
| DA88 | 2046 | JR | NZ,48 |
| DA8A | 55 | LD | D,L |
| DA8B | 4B | LD | C,E |

| LOC | INST | MNEM | OPER |
|---|---|---|---|
| DB7D | C3C419 | JP | 19C4 |
| DB80 | C3D028 | JP | 28D0 |
| DB83 | C32329 | JP | 2923 |
| DB86 | C3BA24 | JP | 24BA |
| DB89 | C34826 | JP | 2648 |
| DB8C | C32728 | JP | 2827 |

| LOC | INST | MNEM | OPER |
|---|---|---|---|
| DA8C | 55 | LD | D,L |
| DA8D | 5A | LD | E,D |
| DA8E | 41 | LD | B,C |
| DA8F | 57 | LD | D,A |
| DA90 | 41 | LD | B,C |
| DA91 | 2054 | JR | NZ,56 |
| DA93 | 4F | LD | C,A |
| DA94 | 4D | LD | C,L |
| DA95 | 49 | LD | C,C |
| DA96 | 4F | LD | C,A |
| DA97 | 4B | LD | C,E |
| DA98 | 41 | LD | B,C |
| DA99 | C30082 | JP | 8200 |
| DA9C | C37E80 | JP | 807E |
| DA9F | C3BC81 | JP | 81BC |
| DAA2 | C32D82 | JP | 822D |
| DAA5 | C3E782 | JP | 82E7 |
| DAA8 | C38C85 | JP | 858C |
| DAAB | C3EC86 | JP | 86EC |
| DAAE | C3038C | JP | 8C03 |
| DAB1 | C3058E | JP | 8E05 |
| DAB4 | C34E8E | JP | 8E4E |

| LOC | INST | MNEM | OPER |
|---|---|---|---|
| DAB7 | C3968F | JP | 8F96 |
| DABA | C30D94 | JP | 940D |
| DABD | C35593 | JP | 9355 |
| DAC0 | C3D597 | JP | 97D5 |
| DAC3 | C36398 | JP | 9863 |
| DAC6 | C33D99 | JP | 993D |
| DAC9 | C3779A | JP | 9A77 |
| DACC | C3319D | JP | 9D31 |
| DACF | C36A9D | JP | 9D6A |
| DAD2 | C3429F | JP | 9F42 |
| DAD5 | C3BE9E | JP | 9EBE |
| DAD8 | C3FBA3 | JP | A3FB |
| DADB | C3F2A4 | JP | A4F2 |
| DADE | C3D4A5 | JP | A5D4 |
| DAE1 | C338A6 | JP | A638 |
| DAE4 | C314A7 | JP | A714 |
| DAE7 | C38DA7 | JP | A78D |
| DAEA | C3E2A7 | JP | A7E2 |
| DAED | C396A8 | JP | A896 |
| DAF0 | C396A9 | JP | A996 |
| DAF3 | C32BAB | JP | AB2B |
| DAF6 | C3B3B1 | JP | B1B3 |

| LOC | INST | MNEM | OPER |
|---|---|---|---|
| DAF9 | C394B2 | JP | B294 |
| DAFC | C3B3BC | JP | BCB3 |
| DAFF | C3C7BD | JP | BDC7 |
| DB02 | C3D183 | JP | 83D1 |
| DB05 | C3988E | JP | 8E98 |
| DB08 | C30B93 | JP | 930B |

```
DB8F C3F527    JP    27F5
DB92 C3FF24    JP    24FF
DB95 C31523    JP    2315
DB98 C30080    JP    8000
DB9B C3DC84    JP    84DC
DB9E C32F85    JP    852F
DBA1 C39886    JP    8698
DBA4 C31A88    JP    881A
DBA7 C3D688    JP    88D6
DBAA C33E8B    JP    8B3E
DBAD C3AA8B    JP    8BAA
DBB0 C3C18C    JP    8CC1
DBB3 C34B8D    JP    8D4B
DBB6 C3918E    JP    8E91
DBB9 C32781    JP    8127
DBBC C3F48F    JP    8FF4

LOC  INST     MNEM  OPER
DBBF C35A91    JP    915A
DBC2 C35D92    JP    925D
DBC5 C32894    JP    9428
DBC8 C3AB94    JP    94AB
DBCB C33695    JP    9536
DBCE C39695    JP    9596
DBD1 C3F695    JP    95F6
DBD4 C31D97    JP    971D
DBD7 C32B98    JP    982B
DBDA C39897    JP    9798
DBDD C33299    JP    9932
DBE0 C3C59A    JP    9AC5
DBE3 C34998    JP    9849
DBE6 C3B09C    JP    9CB0
DBE9 C3469E    JP    9E46
DBEC C3099F    JP    9F09
DBEF C317A0    JP    A017
DBF2 C347A1    JP    A147
DBF5 C3D4A1    JP    A1D4
DBF8 C3F0A2    JP    A2F0
DBFB C3FE83    JP    83FE
DBFE C38DA3    JP    A38D
LOC  INST     MNEM  OPER
DC01 C3C3A3    JP    A3C3
DC04 C304A4    JP    A404
DC07 C303A6    JP    A603
DC0A C367A6    JP    A667
DC0D C399A6    JP    A699
DC10 C39EA7    JP    A79E
DC13 C3ACA7    JP    A7AC
DC16 C3C6A8    JP    A8C6
DC19 C32BAA    JP    AA2B
DC1C C326AB    JP    AB26
DC1F C3A8AC    JP    ACA8
DC22 C36EAD    JP    AD6E
DC25 C363AE    JP    AE63
DC28 C3D5AE    JP    AED5
DC2B C392AF    JP    AF92
DC2E C309B1    JP    B109
DC31 C398B2    JP    B298
DC34 C3DEB1    JP    B1DE

DB08 C30E91    JP    910E
DB0E C3C395    JP    95C3
DB11 C3EC8E    JP    8EEC
DB14 C38F96    JP    968F
DB17 C3BA8D    JP    8DBA
DB1A C343A8    JP    A843
DB1D C37A8D    JP    8D7A
DB20 C3B4AA    JP    AAB4
DB23 C30EB0    JP    B00E
DB26 C30D87    JP    870D
DB29 C3BC9B    JP    9BBC
DB2C C3DEBE    JP    BEDE
DB2F C3879C    JP    9C87
DB32 C3E884    JP    84E8
DB35 C3188E    JP    8E18
DB38 C3CDA2    JP    A2CD

LOC  INST     MNEM  OPER
DB3B C37FA2    JP    A27F
DB3E C377A3    JP    A377
DB41 C3ACA3    JP    A3AC
DB44 C35FAC    JP    AC5F
DB47 C3A194    JP    94A1
DB4A C3D5AD    JP    ADD5
DB4D C328A2    JP    A228
DB50 C33780    JP    8037
DB53 C3428A    JP    8A42
DB56 C32088    JP    8820
DB59 C3398B    JP    8B39
DB5C C31B99    JP    991B
DB5F C3D088    JP    88D0
DB62 C33689    JP    8936
DB65 C39C89    JP    899C
DB68 C335B4    JP    B435
DB6B C378B4    JP    B478
DB6E C396B5    JP    B596
DB71 C3C7B5    JP    B5C7
DB74 C3FDB8    JP    B8FD
DB77 C32AB9    JP    B92A
DB7A C37E8B    JP    8B7E
LOC  INST     MNEM  OPER
DC85 C3BF89    JP    89BF
DC88 C31C8A    JP    8A1C
DC8B C37F8A    JP    8A7F
DC8E C3D58A    JP    8AD5
DC91 C3B48B    JP    8BB4
DC94 C3178D    JP    8D17
DC97 C3C58D    JP    8DC5
DC9A C3038E    JP    8E03
DC9D C3DE8E    JP    8EDE
DCA0 C3358F    JP    8F35
DCA3 C3CC8F    JP    8FCC
DCA6 C31D91    JP    911D
DCA9 C3B291    JP    91B2
DCAC C3F891    JP    91F8
DCAF C38B92    JP    928B
DCB2 C32A93    JP    932A
DCB5 C36B93    JP    936B
DCB8 C3A594    JP    94A5
DCBB C3E596    JP    96E5
```

| LOC | INST | MNEM | OPER |
|---|---|---|---|
| DC37 | C32EB3 | JP | B32E |
| DC3A | C3F0B3 | JP | B3F0 |
| DC3D | C34AB4 | JP | B44A |
| DC40 | C39EB5 | JP | B59E |

| LOC | INST | MNEM | OPER |
|---|---|---|---|
| DC43 | C3FAB6 | JP | B6FA |
| DC46 | C3DEB7 | JP | B7DE |
| DC49 | C344B8 | JP | B844 |
| DC4C | C3ACB8 | JP | B8AC |
| DC4F | C390B9 | JP | B990 |
| DC52 | C306BB | JP | BB06 |
| DC55 | C3B5BC | JP | BCB5 |
| DC58 | C330BD | JP | BD30 |
| DC5B | C310B3 | JP | B310 |
| DC5E | C3BBBD | JP | BDBB |
| DC61 | C318BE | JP | BE18 |
| DC64 | C30080 | JP | 8000 |
| DC67 | C3F882 | JP | 82F8 |
| DC6A | C35B81 | JP | 815B |
| DC6D | C39381 | JP | 8193 |
| DC70 | C3F681 | JP | 81F6 |
| DC73 | C32384 | JP | 8423 |
| DC76 | C3FB84 | JP | 84FB |
| DC79 | C38385 | JP | 8583 |
| DC7C | C31A86 | JP | 861A |
| DC7F | C35586 | JP | 8655 |
| DC82 | C33889 | JP | 8938 |

| LOC | INST | MNEM | OPER |
|---|---|---|---|
| DD09 | C388B0 | JP | B088 |
| DD0C | C3B8B0 | JP | B0B8 |
| DD0F | C3F4B0 | JP | B0F4 |
| DD12 | C330B1 | JP | B130 |
| DD15 | C399B3 | JP | B399 |
| DD18 | C367B5 | JP | B567 |
| DD1B | C3ECB5 | JP | B5EC |
| DD1E | C376B7 | JP | B776 |
| DD21 | C349BE | JP | BE49 |
| DD24 | C3A8AA | JP | AAA8 |
| DD27 | C3F7AD | JP | ADF7 |
| DD2A | C3C3AB | JP | ABC3 |
| DD2D | C3D9AE | JP | AED9 |
| DD30 | C3CDAF | JP | AFCD |
| DD33 | C32CAF | JP | AF2C |
| DD36 | C359AD | JP | AD59 |
| DD39 | C37AAF | JP | AF7A |
| DD3C | C39CAD | JP | AD9C |
| DD3F | C3B3B1 | JP | B1B3 |
| DD42 | C36EB9 | JP | B96E |
| DD45 | C3FEBB | JP | BBFE |
| DD48 | C392BC | JP | BC92 |

| LOC | INST | MNEM | OPER |
|---|---|---|---|
| DD4B | C30FBD | JP | BD0F |
| DD4E | C30080 | JP | 8000 |
| DD51 | C37A81 | JP | 817A |
| DD54 | C3B082 | JP | 82B0 |
| DD57 | C3D883 | JP | 83D8 |
| DD5A | C3AB84 | JP | 84AB |
| DD5D | C34985 | JP | 8549 |
| DD60 | C3DE87 | JP | 87DE |

| LOC | INST | MNEM | OPER |
|---|---|---|---|
| DCBE | C32D98 | JP | 982D |
| DCC1 | C3BE99 | JP | 99BE |
| DCC4 | C3F999 | JP | 99F9 |

| LOC | INST | MNEM | OPER |
|---|---|---|---|
| DCC7 | C34D9B | JP | 9B4D |
| DCCA | C32C9C | JP | 9C2C |
| DCCD | C3299D | JP | 9D29 |
| DCD0 | C30B9E | JP | 9E0B |
| DCD3 | C3A69E | JP | 9EA6 |
| DCD6 | C3469F | JP | 9F46 |
| DCD9 | C3A99F | JP | 9FA9 |
| DCDC | C3D79F | JP | 9FD7 |
| DCDF | C398A0 | JP | A098 |
| DCE2 | C327A1 | JP | A127 |
| DCE5 | C3D9A1 | JP | A1D9 |
| DCE8 | C382A2 | JP | A282 |
| DCEB | C3E4A2 | JP | A2E4 |
| DCEE | C3C1A3 | JP | A3C1 |
| DCF1 | C30AA4 | JP | A40A |
| DCF4 | C3C9A4 | JP | A4C9 |
| DCF7 | C3FBA4 | JP | A4FB |
| DCFA | C30BA6 | JP | A60B |
| DCFD | C3A8A6 | JP | A6A8 |
| DD00 | C3E4A7 | JP | A7E4 |
| DD03 | C398A8 | JP | A898 |
| DD06 | C349A9 | JP | A949 |

| LOC | INST | MNEM | OPER |
|---|---|---|---|
| DD8D | C3579E | JP | 9E57 |
| DD90 | C34EA0 | JP | A04E |
| DD93 | C3B2A1 | JP | A1B2 |
| DD96 | C3F6A2 | JP | A2F6 |
| DD99 | C340A3 | JP | A340 |
| DD9C | C3D0A3 | JP | A3D0 |
| DD9F | C325A4 | JP | A425 |
| DDA2 | C386A4 | JP | A486 |
| DDA5 | C333A5 | JP | A533 |
| DDA8 | C3FFA5 | JP | A5FF |
| DDAB | C32EA7 | JP | A72E |
| DDAE | C379A8 | JP | A879 |
| DDB1 | C399A9 | JP | A999 |
| DDB4 | C3DEAA | JP | AADE |
| DDB7 | C38FAB | JP | AB8F |
| DDBA | C3AEAD | JP | ADAE |
| DDBD | C37EAF | JP | AF7E |
| DDC0 | C3C9B0 | JP | B0C9 |
| DDC3 | C3FAB4 | JP | B4FA |
| DDC6 | C334B7 | JP | B734 |
| DDC9 | C357B8 | JP | B857 |
| DDCC | C303BD | JP | BD03 |

| LOC | INST | MNEM | OPER |
|---|---|---|---|
| DDCF | C3E7B4 | JP | B4E7 |
| DDD2 | C315B4 | JP | B415 |
| DDD5 | C33C80 | JP | 803C |
| DDD8 | C3F580 | JP | 80F5 |
| DDDB | C39682 | JP | 8296 |
| DDDE | C3FAB2 | JP | B2FA |
| DDE1 | C3BCB2 | JP | B2BC |
| DDE4 | C3538F | JP | 8F53 |

```
DD63 C3CC89    JP    89CC        DDE7 C338B3    JP    B338
DD66 C36F8B    JP    8B6F        DDEA C36198    JP    9861
DD69 C3F88C    JP    8CF8        DDED C3DB9C    JP    9CDB
DD6C C30390    JP    9003        DDF0 C308B2    JP    B208
DD6F C3B690    JP    90B6        DDF3 C3C2B3    JP    B3C2
DD72 C3E592    JP    92E5        DDF6 C3E6A8    JP    A8E6
DD75 C38093    JP    9380        DDF9 C34BB2    JP    B24B
DD78 C3A196    JP    96A1        DDFC C39BBA    JP    BA9B
DD7B C3DA98    JP    98DA        DDFF C3BEBA    JP    BABE
DD7E C36699    JP    9966        DE02 C3E4B8    JP    B8E4
DD81 C3D499    JP    99D4        DE05 C3B0B9    JP    B9B0
DD84 C31B9A    JP    9A1B        DE08 C370BB    JP    BB70
DD87 C3769A    JP    9A76        DE0B C34CBC    JP    BC4C
DD8A C35C9D    JP    9D5C        DE0E C3000A    JP    0A00

LOC  INST     MNEM OPER          LOC  INST     MNEM OPER
DE11 C3D20A    JP    0AD2        DE95 C37F63    JP    637F
DE14 C3300B    JP    0B30        DE98 C39863    JP    6398
DE17 C3970B    JP    0B97        DE9B C33B6A    JP    6A3B
DE1A C3940C    JP    0C94        DE9E C36264    JP    6462
DE1D C3020E    JP    0E02        DEA1 C33467    JP    6734
DE20 C3CD0F    JP    0FCD        DEA4 C38464    JP    6484
DE23 C3B110    JP    10B1        DEA7 C34E65    JP    654E
DE26 C33312    JP    1233        DEAA C3F869    JP    69F8
DE29 C3C412    JP    12C4        DEAD C3CF3A    JP    3ACF
DE2C C31716    JP    1617        DEB0 C3481E    JP    1E48
DE2F C34B16    JP    164B        DEB3 C3EF1F    JP    1FEF
DE32 C34918    JP    1849        DEB6 C30E22    JP    220E
DE35 C38118    JP    1881        DEB9 C3A322    JP    22A3
DE38 C3AE18    JP    18AE        DEBC C32C29    JP    292C
DE3B C3FC19    JP    19FC        DEBF C3B62A    JP    2AB6
DE3E C3781A    JP    1A78        DEC2 C3C42A    JP    2AC4
DE41 C3B51A    JP    1AB5        DEC5 C3AD2B    JP    2BAD
DE44 C3F21A    JP    1AF2        DEC8 C3082B    JP    2B08
DE47 C35C1B    JP    1B5C        DECB C3182C    JP    2C18
DE4A C3511C    JP    1C51        DECE C3952C    JP    2C95
DE4D C3A71C    JP    1CA7        DED1 C3652D    JP    2D65
DE50 C36D1D    JP    1D6D        DED4 C3B22D    JP    2DB2

LOC  INST     MNEM OPER          LOC  INST     MNEM OPER
DE53 C37863    JP    6378        DED7 C3E72D    JP    2DE7
DE56 C38463    JP    6384        DEDA C39A2F    JP    2F9A
DE59 C3AE63    JP    63AE        DEDD C33832    JP    3238
DE5C C37E63    JP    637E        DEE0 C31533    JP    3315
DE5F C3CF64    JP    64CF        DEE3 C3D433    JP    33D4
DE62 C3CE63    JP    63CE        DEE6 C37C35    JP    357C
DE65 C3A065    JP    65A0        DEE9 C3B335    JP    35B3
DE68 C31765    JP    6517        DEEC C3E735    JP    35E7
DE6B C3CC65    JP    65CC        DEEF C37836    JP    3678
DE6E C3FA65    JP    65FA        DEF2 C3E236    JP    36E2
DE71 C31C66    JP    661C        DEF5 C34237    JP    3742
DE74 C34666    JP    6646        DEF8 C33638    JP    3836
DE77 C37966    JP    6679        DEFB C37538    JP    3875
DE7A C3F567    JP    67F5        DEFE C3353A    JP    3A35
DE7D C39366    JP    6693        DF01 C3893B    JP    3B89
DE80 C33F68    JP    683F        DF04 C37A3C    JP    3C7A
DE83 C3A067    JP    67A0        DF07 C3203D    JP    3D20
DE86 C37769    JP    6977        DF0A C3F63D    JP    3DF6
DE89 C39969    JP    6999        DF0D C30E3E    JP    3E0E
DE8C C3EF66    JP    66EF        DF10 C3583E    JP    3E58
DE8F C3A869    JP    69A8        DF13 C3FD3E    JP    3EFD
DE92 C3D669    JP    69D6        DF16 C3253F    JP    3F25
```

| LOC | INST | MNEM | OPER |
|---|---|---|---|
| DF19 | C34540 | JP | 4045 |
| DF1C | C35C41 | JP | 415C |
| DF1F | C3D741 | JP | 41D7 |
| DF22 | C3F341 | JP | 41F3 |
| DF25 | C35242 | JP | 4252 |
| DF28 | C3E144 | JP | 44E1 |
| DF2B | C39347 | JP | 4793 |
| DF2E | C3144A | JP | 4A14 |
| DF31 | C30E6A | JP | 6A0E |
| DF34 | C31C4B | JP | 4B1C |
| DF37 | C3784B | JP | 4B78 |
| DF3A | C3354D | JP | 4D35 |
| DF3D | C30D4E | JP | 4E0D |
| DF40 | C3564E | JP | 4E56 |
| DF43 | C3E24F | JP | 4FE2 |
| DF46 | C3EF4F | JP | 4FEF |
| DF49 | C31951 | JP | 5119 |
| DF4C | C3BF51 | JP | 51BF |
| DF4F | C35D52 | JP | 525D |
| DF52 | C3C953 | JP | 53C9 |
| DF55 | C3B054 | JP | 54B0 |
| DF58 | C3A155 | JP | 55A1 |

| LOC | INST | MNEM | OPER |
|---|---|---|---|
| DF5B | C3F155 | JP | 55F1 |
| DF5E | C34156 | JP | 5641 |
| DF61 | C37E56 | JP | 567E |
| DF64 | C39956 | JP | 5699 |
| DF67 | C32457 | JP | 5724 |
| DF6A | C37557 | JP | 5775 |
| DF6D | C3256A | JP | 6A25 |
| DF70 | C39658 | JP | 5896 |
| DF73 | C32759 | JP | 5927 |
| DF76 | C3B759 | JP | 59B7 |
| DF79 | C3705A | JP | 5A70 |
| DF7C | C33C5B | JP | 5B3C |
| DF7F | C3215C | JP | 5C21 |
| DF82 | C3A45D | JP | 5DA4 |
| DF85 | C3905E | JP | 5E90 |
| DF88 | C3065F | JP | 5F06 |
| DF8B | C3AF5F | JP | 5FAF |
| DF8E | C31F60 | JP | 601F |
| DF91 | C30262 | JP | 6202 |
| DF94 | C31863 | JP | 6318 |
| DF97 | C3F362 | JP | 62F3 |
| DF9A | C33B63 | JP | 633B |

| LOC | INST | MNEM | OPER |
|---|---|---|---|
| 712B | CD53DE | CALL | DE53 |
| 712E | CDA3DF | CALL | DFA3 |
| 7131 | CD19DF | CALL | DF19 |
| 7134 | 3A4CF8 | LD | A,(F84C) |
| 7137 | B7 | OR | A |
| 7138 | C24671 | JP | NZ,7146 |
| 713B | 3A4BF8 | LD | A,(F84B) |
| 713E | FE01 | CP | 01 |
| 7140 | C24671 | JP | NZ,7146 |
| 7143 | C395DE | JP | DE95 |
| 7146 | 3A4BF8 | LD | A,(F84B) |
| 7149 | B7 | OR | A |

| LOC | INST | MNEM | OPER |
|---|---|---|---|
| DF9D | C36C63 | JP | 636C |
| DFA0 | C3786A | JP | 6A78 |
| DFA3 | C3346B | JP | 6B34 |
| DFA6 | C38D6C | JP | 6C8D |
| DFA9 | C3346D | JP | 6D34 |
| DFAC | C33F6E | JP | 6E3F |
| DFAF | C3816E | JP | 6E81 |
| DFB2 | C3AE6E | JP | 6EAE |
| DFB5 | C3756F | JP | 6F75 |
| DFB8 | C3C06F | JP | 6FC0 |
| DFBB | C33870 | JP | 7038 |
| DFBE | C32B71 | JP | 712B |
| DFC1 | C35971 | JP | 7159 |
| DFC4 | C36E71 | JP | 716E |
| DFC7 | C3B671 | JP | 71B6 |
| DFCA | C3D074 | JP | 74D0 |
| DFCD | C33375 | JP | 7533 |
| DFD0 | C39775 | JP | 7597 |
| DFD3 | C36876 | JP | 7668 |
| DFD6 | C35E77 | JP | 775E |
| DFD9 | C3A777 | JP | 77A7 |
| DFDC | C39B78 | JP | 789B |

| LOC | INST | MNEM | OPER |
|---|---|---|---|
| DFDF | C3D878 | JP | 78D8 |
| DFE2 | C3FD78 | JP | 78FD |
| DFE5 | C39C79 | JP | 799C |
| DFE8 | C3537A | JP | 7A53 |
| DFEB | C3C37B | JP | 7BC3 |

| LOC | INST | MNEM | OPER |
|---|---|---|---|
| 6B34 | CD56DE | CALL | DE56 |
| 6B37 | 3E00 | LD | A,00 |
| 6B39 | 3284FB | LD | (FB84),A |
| 6B3C | 87 | ADD | A,A |
| 6B3D | 9F | SBC | A,A |
| 6B3E | 3285FB | LD | (FB85),A |
| 6B41 | 2184FB | LD | HL,FB84 |
| 6B44 | 3EFF | LD | A,FF |
| 6B46 | 96 | SUB | (HL) |
| 6B47 | 3E00 | LD | A,00 |
| 6B49 | 23 | INC | HL |
| 6B4A | 9E | SBC | A,(HL) |

```
714A C25371    JP    NZ,7153
714D CDEDDA    CALL  DAED
7150 C35671    JP    7156
7153 CD38DB    CALL  DB38
7156 C395DE    JP    DE95
```

```
6B4B FA616B    JP    M,6B61
6B4E 2A84FB    LD    HL,(FB84)
6B51 0100EF    LD    BC,EF00
6B54 09        ADD   HL,BC
6B55 3600      LD    (HL),00
6B57 2A84FB    LD    HL,(FB84)
6B5A 23        INC   HL
6B5B 2284FB    LD    (FB84),HL
6B5E C3416B    JP    6B41
6B61 3E00      LD    A,00

LOC  INST     MNEM  OPER
6B63 328DF8    LD    (F88D),A
6B66 87        ADD   A,A
6B67 9F        SBC   A,A
6B68 328EF8    LD    (F88E),A
6B6B 3A4CF8    LD    A,(F84C)
6B6E B7        OR    A
6B6F C29C6B    JP    NZ,6B9C
6B72 3A4BF8    LD    A,(F84B)
6B75 B7        OR    A
6B76 C2AA6B    JP    NZ,6BAA
6B79 3A46F9    LD    A,(F946)
6B7C FE20      CP    20
6B7E C2F26B    JP    NZ,6BF2
6B81 3A47F9    LD    A,(F947)
6B84 FE20      CP    20
6B86 C2F26B    JP    NZ,6BF2
6B89 3A48F9    LD    A,(F948)
6B8C FE20      CP    20
6B8E C2F26B    JP    NZ,6BF2
6B91 3A49F9    LD    A,(F949)
6B94 FE20      CP    20
6B96 C2F26B    JP    NZ,6BF2
```

```
LOC  INST     MNEM  OPER
6B99 C3496C    JP    6C49
6B9C 3A7BF8    LD    A,(F87B)
6B9F FE01      CP    01
6BA1 C2386C    JP    NZ,6C38
6BA4 CD2CDB    CALL  DB2C
6BA7 C3496C    JP    6C49
6BAA 3A8AF8    LD    A,(F88A)
6BAD 4F        LD    C,A
6BAE 87        ADD   A,A
6BAF 9F        SBC   A,A
6BB0 47        LD    B,A
6BB1 69        LD    L,C
6BB2 60        LD    H,B
6BB3 29        ADD   HL,HL
6BB4 29        ADD   HL,HL
6BB5 29        ADD   HL,HL
6BB6 227CFB    LD    (FB7C),HL
6BB9 3E00      LD    A,00
6BBB 3284FB    LD    (FB84),A
6BBE 87        ADD   A,A
6BBF 9F        SBC   A,A
6BC0 3285FB    LD    (FB85),A

LOC  INST     MNEM  OPER
6BC3 2184FB    LD    HL,FB84
```

```
LOC  INST     MNEM  OPER
6BE6 78        LD    A,B
6BE7 E600      AND   00
6BE9 47        LD    B,A
6BEA 79        LD    A,C
6BEB B0        OR    B
6BEC C2136C    JP    NZ,6C13
6BEF C3206C    JP    6C20
6BF2 3A7BF8    LD    A,(F87B)
6BF5 FE01      CP    01
6BF7 C21D6C    JP    NZ,6C1D
6BFA CD42DF    CALL  DF42
6BFD C3496C    JP    6C49
6C00 3A84FB    LD    A,(FB84)
6C03 FE08      CP    08
6C05 C20D6C    JP    NZ,6C0D
6C08 3A85FB    LD    A,(FB85)
6C0B FE00      CP    00
6C0D C2F26B    JP    NZ,6BF2
6C10 C3496C    JP    6C49
6C13 2A84FB    LD    HL,(FB84)
6C16 23        INC   HL
6C17 2284FB    LD    (FB84),HL

LOC  INST     MNEM  OPER
6C1A C3C36B    JP    6BC3
```

```
6BC6  3E07      LD    A,07
6BC8  96        SUB   (HL)
6BC9  3E00      LD    A,00
6BCB  23        INC   HL
6BCC  9E        SBC   A,(HL)
6BCD  FA006C    JP    M,6C00
6BD0  2A7CFB    LD    HL,(FB7C)
6BD3  E5        PUSH  HL
6BD4  2A84FB    LD    HL,(FB84)
6BD7  0163F9    LD    BC,F963
6BDA  09        ADD   HL,BC
6BDB  E3        EX    (SP),HL
6BDC  C1        POP   BC
6BDD  09        ADD   HL,BC
6BDE  7E        LD    A,(HL)
6BDF  4F        LD    C,A
6BE0  97        SUB   A
6BE1  47        LD    B,A
6BE2  79        LD    A,C
6BE3  E688      AND   88
6BE5  4F        LD    C,A

LOC   INST     MNEM  OPER
6C55  3251E8    LD    (E851),A
6C58  3A51E8    LD    A,(E851)
6C5B  324FE8    LD    (E84F),A
6C5E  3A4FE8    LD    A,(E84F)
6C61  324DE8    LD    (E84D),A
6C64  3E2F      LD    A,2F
6C66  3252E8    LD    (E852),A
6C69  215400    LD    HL,0054
6C6C  E5        PUSH  HL
6C6D  2A8DF8    LD    HL,(F88D)
6C70  E5        PUSH  HL
6C71  CD4DDE    CALL  DE4D
6C74  F1        POP   AF
6C75  F1        POP   AF
6C76  C398DE    JP    DE98

6C1D  3A7BF8    LD    A,(F87B)
6C20  FE02      CP    02
6C22  C22B6C    JP    NZ,6C2B
6C25  CD37DF    CALL  DF37
6C28  C3496C    JP    6C49
6C2B  3A4BF8    LD    A,(F84B)
6C2E  B7        OR    A
6C2F  C2496C    JP    NZ,6C49
6C32  CDD2DA    CALL  DAD2
6C35  C3496C    JP    6C49
6C38  3A7BF8    LD    A,(F87B)
6C3B  FE02      CP    02
6C3D  C2466C    JP    NZ,6C46
6C40  CD2FDB    CALL  DB2F
6C43  C3496C    JP    6C49
6C46  CD32DB    CALL  DB32
6C49  3E3D      LD    A,3D
6C4B  3248E8    LD    (E848),A
6C4E  3E49      LD    A,49
6C50  324BE8    LD    (E84B),A
6C53  3E48      LD    A,48

LOC   INST     MNEM  OPER
1CA7  CD53DE    CALL  DE53
1CAA  21F9FF    LD    HL,FFF9
1CAD  39        ADD   HL,SP
1CAE  F9        LD    SP,HL
1CAF  210400    LD    HL,0004
1CB2  19        ADD   HL,DE
1CB3  7E        LD    A,(HL)
1CB4  D60A      SUB   A,0A
1CB6  23        INC   HL
1CB7  7E        LD    A,(HL)
1CB8  DE00      SBC   A,00
1CBA  F2E41C    JP    P,1CE4
1CBD  21F9FF    LD    HL,FFF9
1CC0  19        ADD   HL,DE
1CC1  3600      LD    (HL),00
1CC3  210600    LD    HL,0006
1CC6  19        ADD   HL,DE
1CC7  7E        LD    A,(HL)
1CC8  23        INC   HL
1CC9  66        LD    H,(HL)
1CCA  6F        LD    L,A
1CCB  0102E8    LD    BC,E802

LOC   INST     MNEM  OPER
1CCE  09        ADD   HL,BC
1CCF  E5        PUSH  HL
1CD0  210600    LD    HL,0006
1CD3  19        ADD   HL,DE
1CD4  7E        LD    A,(HL)
1CD5  23        INC   HL
1CD6  66        LD    H,(HL)
1CD7  6F        LD    L,A
1CD8  0104E8    LD    BC,E804
1CDB  09        ADD   HL,BC
1CDC  3600      LD    (HL),00
1CDE  C1        POP   BC
1CDF  7E        LD    A,(HL)
1CE0  02        LD    (BC),A
```

| LOC | INST | MNEM | OPER |
|---|---|---|---|
| 1CE1 | C30F1D | JP | 1D0F |
| 1CE4 | 210400 | LD | HL,0004 |
| 1CE7 | 19 | ADD | HL,DE |
| 1CE8 | 7E | LD | A,(HL) |
| 1CE9 | D664 | SUB | A,64 |
| 1CEB | 23 | INC | HL |
| 1CEC | 7E | LD | A,(HL) |
| 1CED | DE00 | SBC | A,00 |

| LOC | INST | MNEM | OPER |
|---|---|---|---|
| 1CEF | F2091D | JP | P,1D09 |
| 1CF2 | 21F9FF | LD | HL,FFF9 |
| 1CF5 | 19 | ADD | HL,DE |
| 1CF6 | 3602 | LD | (HL),2 |
| 1CF8 | 210600 | LD | HL,0006 |
| 1CFB | 19 | ADD | HL,DE |
| 1CFC | 7E | LD | A,(HL) |
| 1CFD | 23 | INC | HL |
| 1CFE | 66 | LD | H,(HL) |
| 1CFF | 6F | LD | L,A |
| 1D00 | 0104E8 | LD | BC,E804 |
| 1D03 | 09 | ADD | HL,BC |
| 1D04 | 3620 | LD | (HL),2 |
| 1D06 | C30F1D | JP | 1D0F |
| 1D09 | 21F9FF | LD | HL,FFF9 |
| 1D0C | 19 | ADD | HL,DE |
| 1D0D | 3604 | LD | (HL),4 |
| 1D0F | 21F9FF | LD | HL,FFF9 |
| 1D12 | 19 | ADD | HL,DE |
| 1D13 | 7E | LD | A,(HL) |
| 1D14 | 4F | LD | C,A |
| 1D15 | 87 | ADD | A,A |

| LOC | INST | MNEM | OPER |
|---|---|---|---|
| 1D16 | 9F | SBC | A,A |
| 1D17 | 47 | LD | B,A |
| 1D18 | 210600 | LD | HL,0006 |
| 1D1B | 19 | ADD | HL,DE |
| 1D1C | 7E | LD | A,(HL) |
| 1D1D | 23 | INC | HL |
| 1D1E | 66 | LD | H,(HL) |
| 1D1F | 6F | LD | L,A |
| 1D20 | 09 | ADD | HL,BC |
| 1D21 | 0100E8 | LD | BC,E800 |
| 1D24 | 09 | ADD | HL,BC |
| 1D25 | E5 | PUSH | HL |
| 1D26 | 210400 | LD | HL,0004 |
| 1D29 | 19 | ADD | HL,DE |
| 1D2A | 4E | LD | C,(HL) |
| 1D2B | 23 | INC | HL |
| 1D2C | 46 | LD | B,(HL) |
| 1D2D | C5 | PUSH | BC |
| 1D2E | 210A00 | LD | HL,000A |
| 1D31 | E5 | PUSH | HL |
| 1D32 | CD62DE | CALL | DE62 |
| 1D35 | E1 | POP | HL |

| LOC | INST | MNEM | OPER |
|---|---|---|---|
| 1D36 | 013000 | LD | BC,0030 |
| 1D39 | 09 | ADD | HL,BC |
| 1D3A | C1 | POP | BC |
| 1D3B | 7D | LD | A,L |
| 1D3C | 02 | LD | (BC),A |
| 1D3D | 21F9FF | LD | HL,FFF9 |
| 1D40 | 19 | ADD | HL,DE |
| 1D41 | 7E | LD | A,(HL) |
| 1D42 | D602 | SUB | A,02 |
| 1D44 | 77 | LD | (HL),A |
| 1D45 | 210400 | LD | HL,0004 |
| 1D48 | 19 | ADD | HL,DE |
| 1D49 | E5 | PUSH | HL |
| 1D4A | E1 | POP | HL |
| 1D4B | E5 | PUSH | HL |
| 1D4C | 4E | LD | C,(HL) |
| 1D4D | 23 | INC | HL |
| 1D4E | 46 | LD | B,(HL) |
| 1D4F | C5 | PUSH | BC |
| 1D50 | 210A00 | LD | HL,000A |
| 1D53 | E5 | PUSH | HL |
| 1D54 | CD59DE | CALL | DE59 |

| LOC | INST | MNEM | OPER |
|---|---|---|---|
| 1D57 | E1 | POP | HL |
| 1D58 | C1 | POP | BC |
| 1D59 | 7D | LD | A,L |
| 1D5A | 02 | LD | (BC),A |
| 1D5B | 7C | LD | A,H |
| 1D5C | 03 | INC | BC |
| 1D5D | 02 | LD | (BC),A |
| 1D5E | 0B | DEC | BC |
| 1D5F | 69 | LD | L,C |
| 1D60 | 60 | LD | H,B |
| 1D61 | 97 | SUB | A |
| 1D62 | 96 | SUB | (HL) |
| 1D63 | 3E00 | LD | A,00 |
| 1D65 | 23 | INC | HL |
| 1D66 | 9E | SBC | A,(HL) |
| 1D67 | FA0F1D | JP | M,1D0F |
| 1D6A | C395DE | JP | DE95 |

| LOC | INST | MNEM | OPER |
|---|---|---|---|
| 4045 | CD53DE | CALL | DE53 |
| 4048 | F5 | PUSH | AF |
| 4049 | F5 | PUSH | AF |

| LOC | INST | MNEM | OPER |
|---|---|---|---|
| 408C | C20D41 | JP | NZ,410D |
| 408F | 2A8FF8 | LD | HL,(F88F) |
| 4092 | 23 | INC | HL |

```
404A F5        PUSH AF
404B F5        PUSH AF
404C 218DF8    LD   HL,F88D
404F 7E        LD   A,(HL)
4050 23        INC  HL
4051 B6        OR   (HL)
4052 CA9940    JP   Z,4099
4055 3E00      LD   A,00
4057 328FF8    LD   (F88F),A
405A 87        ADD  A,A
405B 9F        SBC  A,A
405C 3290F8    LD   (F890),A
405F 21F8FF    LD   HL,FFF8
4062 19        ADD  HL,DE
4063 3E00      LD   A,00
4065 77        LD   (HL),A
4066 87        ADD  A,A
4067 9F        SBC  A,A
4068 23        INC  HL

LOC  INST     MNEM OPER
4069 77        LD   (HL),A
406A 21F8FF    LD   HL,FFF8
406D 19        ADD  HL,DE
406E 3A92F8    LD   A,(F892)
4071 96        SUB  (HL)
4072 3A93F8    LD   A,(F893)
4075 23        INC  HL
4076 9E        SBC  A,(HL)
4077 FAE040    JP   M,40E0
407A 2100EF    LD   HL,EF00
407D E5        PUSH HL
407E 21F8FF    LD   HL,FFF8
4081 19        ADD  HL,DE
4082 7E        LD   A,(HL)
4083 23        INC  HL
4084 66        LD   H,(HL)
4085 6F        LD   L,A
4086 E3        EX   (SP),HL
4087 C1        POP  BC
4088 09        ADD  HL,BC
4089 7E        LD   A,(HL)
408A FE01      CP   01

LOC  INST     MNEM OPER
40E9 3A4BF8    LD   A,(F84B)
40EC B7        OR   A
40ED C2F640    JP   NZ,40F6
40F0 016E00    LD   BC,006E
40F3 C3F940    JP   40F9
40F6 016F00    LD   BC,006F
40F9 79        LD   A,C
40FA 324AE8    LD   (E84A),A
40FD 214C00    LD   HL,004C
4100 E5        PUSH HL
4101 218100    LD   HL,0081
4104 E5        PUSH HL
4105 CDECDE    CALL DEEC
4108 F1        POP  AF
4109 F1        POP  AF
410A C3AB40    JP   40AB
410D 21F8FF    LD   HL,FFF8

4093 228FF8    LD   (F88F),HL
4096 C30D41    JP   410D
4099 3E20      LD   A,20
409B 324AE8    LD   (E84A),A
409E 214C00    LD   HL,004C
40A1 E5        PUSH HL
40A2 210000    LD   HL,0000
40A5 E5        PUSH HL
40A6 CDECDE    CALL DEEC
40A9 F1        POP  AF
40AA F1        POP  AF
40AB 3A4CF8    LD   A,(F84C)
40AE B7        OR   A
40AF C25941    JP   NZ,4159
40B2 3A4BF8    LD   A,(F84B)
40B5 FE01      CP   01
40B7 C25941    JP   NZ,4159
40BA 2100EF    LD   HL,EF00
40BD E5        PUSH HL

LOC  INST     MNEM OPER
40BE 2A92F8    LD   HL,(F892)
40C1 E3        EX   (SP),HL
40C2 C1        POP  BC
40C3 09        ADD  HL,BC
40C4 7E        LD   A,(HL)
40C5 FE01      CP   01
40C7 C2D540    JP   NZ,40D5
40CA 214800    LD   HL,0048
40CD E5        PUSH HL
40CE CDC3DD    CALL DDC3
40D1 F1        POP  AF
40D2 C3DD40    JP   40DD
40D5 212200    LD   HL,0022
40D8 E5        PUSH HL
40D9 CDC3DD    CALL DDC3
40DC F1        POP  AF
40DD C35941    JP   4159
40E0 218FF8    LD   HL,F88F
40E3 7E        LD   A,(HL)
40E4 23        INC  HL
40E5 B6        OR   (HL)
40E6 C21D41    JP   NZ,411D

LOC  INST     MNEM OPER
4145 79        LD   A,C
4146 324AE8    LD   (E84A),A
4149 214C00    LD   HL,004C
414C E5        PUSH HL
414D 2A8FF8    LD   HL,(F88F)
4150 E5        PUSH HL
4151 CDECDE    CALL DEEC
4154 F1        POP  AF
4155 F1        POP  AF
4156 C3AB40    JP   40AB
4159 C395DE    JP   DE95
```

```
4110 19        ADD  HL,DE
4111 7E        LD   A,(HL)
4112 C601      ADD  A,01
4114 77        LD   (HL),A
4115 23        INC  HL

LOC  INST     MNEM OPER
4116 7E        LD   A,(HL)
4117 CE00      ADC  A,00
4119 77        LD   (HL),A
411A C36A40    JP   406A
411D 2100EF    LD   HL,EF00
4120 E5        PUSH HL
4121 2A92F8    LD   HL,(F892)
4124 E3        EX   (SP),HL
4125 C1        POP  BC
4126 09        ADD  HL,BC
4127 7E        LD   A,(HL)
4128 FE01      CP   01
412A C23541    JP   NZ,4135
412D 3E20      LD   A,20
412F 324AE8    LD   (E84A),A
4132 C34941    JP   4149
4135 3A4BF8    LD   A,(F84B)
4138 B7        OR   A
4139 C24241    JP   NZ,4142
413C 016C00    LD   BC,006C
413F C34541    JP   4145
4142 016D00    LD   BC,006D

LOC  INST     MNEM OPER
3607 0102E8    LD   BC,E802
360A 09        ADD  HL,BC
360B 3620      LD   (HL),20
360D C1        POP  BC
360E 7E        LD   A,(HL)
360F 02        LD   (BC),A
3610 21F9FF    LD   HL,FFF9
3613 19        ADD  HL,DE
3614 3604      LD   (HL),04
3616 21F9FF    LD   HL,FFF9
3619 19        ADD  HL,DE
361A 7E        LD   A,(HL)
361B 4F        LD   C,A
361C 87        ADD  A,A
361D 9F        SBC  A,A
361E 47        LD   B,A
361F 210600    LD   HL,0006
3622 19        ADD  HL,DE
3623 7E        LD   A,(HL)
3624 23        INC  HL
3625 66        LD   H,(HL)
3626 6F        LD   L,A

LOC  INST     MNEM OPER
3627 09        ADD  HL,BC
3628 0100E8    LD   BC,E800
362B 09        ADD  HL,BC
362C E5        PUSH HL
362D 210400    LD   HL,0004

LOC  INST     MNEM OPER
35E7 CD53DE    CALL DE53
35EA 21F9FF    LD   HL,FFF9
35ED 39        ADD  HL,SP
35EE F9        LD   SP,HL
35EF 2100E8    LD   HL,E800
35F2 E5        PUSH HL
35F3 210600    LD   HL,0006
35F6 19        ADD  HL,DE
35F7 7E        LD   A,(HL)
35F8 23        INC  HL
35F9 66        LD   H,(HL)
35FA 6F        LD   L,A
35FB E3        EX   (SP),HL
35FC C1        POP  BC
35FD 09        ADD  HL,BC
35FE E5        PUSH HL
35FF 210600    LD   HL,0006
3602 19        ADD  HL,DE
3603 7E        LD   A,(HL)
3604 23        INC  HL
3605 66        LD   H,(HL)
3606 6F        LD   L,A

LOC  INST     MNEM OPER
3649 D602      SUB  A,02
364B 77        LD   (HL),A
364C 210400    LD   HL,0004
364F 19        ADD  HL,DE
3650 E5        PUSH HL
3651 E1        POP  HL
3652 E5        PUSH HL
3653 4E        LD   C,(HL)
3654 23        INC  HL
3655 46        LD   B,(HL)
3656 C5        PUSH BC
3657 210A00    LD   HL,000A
365A E5        PUSH HL
365B CD59DE    CALL DE59
365E E1        POP  HL
365F C1        POP  BC
3660 7D        LD   A,L
3661 02        LD   (BC),A
3662 7C        LD   A,H
3663 03        INC  BC
3664 02        LD   (BC),A
3665 0B        DEC  BC
```

```
3630 19        ADD  HL,DE
3631 4E        LD   C,(HL)
3632 23        INC  HL
3633 46        LD   B,(HL)
3634 C5        PUSH BC
3635 210A00    LD   HL,000A
3638 E5        PUSH HL
3639 CD62DE    CALL DE62
363C E1        POP  HL
363D 013000    LD   BC,0030
3640 09        ADD  HL,BC
3641 C1        POP  BC
3642 7D        LD   A,L
3643 02        LD   (BC),A
3644 21F9FF    LD   HL,FFF9
3647 19        ADD  HL,DE
3648 7E        LD   A,(HL)

LOC  INST     MNEM OPER
78A9 B6       OR   (HL)
78A9 BREAK

LOC  INST     MNEM OPER
A896 CD53DE   CALL DE53
A899 21F4FF   LD   HL,FFF4
A89C 39       ADD  HL,SP
A89D F9       LD   SP,HL
A89E 3A4CF8   LD   A,(F84C)
A8A1 B7       OR   A
A8A2 C29CA8   JP   NZ,A89C
A8A5 3A7BF8   LD   A,(F87B)
A8A8 FE01     CP   01
A8AA C244A9   JP   NZ,A944
A8AD 21F4FF   LD   HL,FFF4
A8B0 19       ADD  HL,DE
A8B1 01BDDA   LD   BC,DABD
A8B4 79       LD   A,C
A8B5 77       LD   (HL),A
A8B6 78       LD   A,B
A8B7 23       INC  HL
A8B8 77       LD   (HL),A
A8B9 C3DBA8   JP   A8DB
A8BC 21F4FF   LD   HL,FFF4
A8BF 19       ADD  HL,DE
A8C0 E5       PUSH HL

LOC  INST     MNEM OPER
A8C1 3A79F8   LD   A,(F879)
A8C4 B7       OR   A
A8C5 C2D0A8   JP   NZ,A8D0
A8C8 2135DB   LD   HL,DB35
A8CB 4D       LD   C,L
A8CC 44       LD   B,H
A8CD C3D5A8   JP   A8D5
A8D0 2102DB   LD   HL,DB02
A8D3 4D       LD   C,L
A8D4 44       LD   B,H
A8D5 E1       POP  HL
A8D6 79       LD   A,C
A8D7 77       LD   (HL),A
```

```
LOC  INST     MNEM OPER
3666 69       LD   L,C
3667 60       LD   H,B
3668 97       SUB  A
3669 96       SUB  (HL)
366A 3E00     LD   A,00
366C 23       INC  HL
366D 9E       SBC  A,(HL)
366E FA1636   JP   M,3616
3671 C395DE   JP   DE95
```

```
SP   RF RA RB RC RD RE RH RL IX   IY
FFC2 00 00 FF CB FF C9 FF CE C9A3 0000
```

```
A8D8  78       LD    A,B
A8D9  23       INC   HL
A8DA  77       LD    (HL),A
A8DB  21F8FF   LD    HL,FFF8
A8DE  19       ADD   HL,DE
A8DF  3A94F8   LD    A,(F894)
A8E2  77       LD    (HL),A
A8E3  3A95F8   LD    A,(F895)
A8E6  23       INC   HL

LOC   INST     MNEM  OPER
A92C  21F8FF   LD    HL,FFF8
A92F  19       ADD   HL,DE
A930  4E       LD    C,(HL)
A931  23       INC   HL
A932  46       LD    B,(HL)
A933  C5       PUSH  BC
A934  21F4FF   LD    HL,FFF4
A937  19       ADD   HL,DE
A938  7E       LD    A,(HL)
A939  23       INC   HL
A93A  66       LD    H,(HL)
A93B  6F       LD    L,A
A93C  CD5CDE   CALL  DE5C
A93F  F1       POP   AF
A940  F1       POP   AF
A941  C36DA9   JP    A96D
A944  3A7BF8   LD    A,(F87B)
A947  FE02     CP    02
A949  C25BA9   JP    NZ,A95B
A94C  21F4FF   LD    HL,FFF4
A94F  19       ADD   HL,DE
A950  01CFDA   LD    BC,DACF

LOC   INST     MNEM  OPER
A953  79       LD    A,C
A954  77       LD    (HL),A
A955  78       LD    A,B
A956  23       INC   HL
A957  77       LD    (HL),A
A958  C3DBA8   JP    A8DB
A95B  21F4FF   LD    HL,FFF4
A95E  19       ADD   HL,DE
A95F  01B7DA   LD    BC,DAB7
A962  79       LD    A,C
A963  77       LD    (HL),A
A964  78       LD    A,B
A965  23       INC   HL
A966  77       LD    (HL),A
A967  C3DBA8   JP    A8DB
A96A  C395DE   JP    DE95
A96D  21F6FF   LD    HL,FFF6
A970  19       ADD   HL,DE
A971  7E       LD    A,(HL)
A972  C640     ADD   A,40
A974  77       LD    (HL),A
A975  23       INC   HL

LOC   INST     MNEM  OPER
A976  7E       LD    A,(HL)
A977  CE00     ADC   A,00
A979  77       LD    (HL),A
A97A  21F8FF   LD    HL,FFF8
A97D  19       ADD   HL,DE
A97E  7E       LD    A,(HL)
A97F  C601     ADD   A,01
A981  77       LD    (HL),A
A982  23       INC   HL
A983  7E       LD    A,(HL)
A984  CE00     ADC   A,00
A986  77       LD    (HL),A
A987  C3F3A8   JP    A8F3
```

| LOC | INST | MNEM | OPER |
|---|---|---|---|
| A8E7 | 77 | LD | (HL),A |
| A8E8 | 21F6FF | LD | HL,FFF6 |
| A8EB | 19 | ADD | HL,DE |
| A8EC | 3E81 | LD | A,81 |
| A8EE | 77 | LD | (HL),A |
| A8EF | 3E01 | LD | A,01 |
| A8F1 | 23 | INC | HL |
| A8F2 | 77 | LD | (HL),A |
| A8F3 | 21F6FF | LD | HL,FFF6 |
| A8F6 | 19 | ADD | HL,DE |
| A8F7 | 3E83 | LD | A,83 |
| A8F9 | 96 | SUB | (HL) |
| A8FA | 3E04 | LD | A,04 |
| A8FC | 23 | INC | HL |
| A8FD | 9E | SBC | A,(HL) |
| A8FE | FA6AA9 | JP | M,A96A |
| A901 | 21F8FF | LD | HL,FFF8 |
| A904 | 19 | ADD | HL,DE |
| A905 | 3EFF | LD | A,FF |
| A907 | 96 | SUB | (HL) |
| A908 | 3E00 | LD | A,00 |
| A90A | 23 | INC | HL |

| LOC | INST | MNEM | OPER |
|---|---|---|---|
| A90B | 9E | SBC | A,(HL) |
| A90C | FA6AA9 | JP | M,A96A |
| A90F | 2100EF | LD | HL,EF00 |
| A912 | E5 | PUSH | HL |
| A913 | 21F8FF | LD | HL,FFF8 |
| A916 | 19 | ADD | HL,DE |
| A917 | 7E | LD | A,(HL) |
| A918 | 23 | INC | HL |
| A919 | 66 | LD | H,(HL) |
| A91A | 6F | LD | L,A |
| A91B | E3 | EX | (SP),HL |
| A91C | C1 | POP | BC |
| A91D | 09 | ADD | HL,BC |
| A91E | 7E | LD | A,(HL) |
| A91F | FE01 | CP | 01 |
| A921 | C26DA9 | JP | NZ,A96D |
| A924 | 21F6FF | LD | HL,FFF6 |
| A927 | 19 | ADD | HL,DE |
| A928 | 4E | LD | C,(HL) |
| A929 | 23 | INC | HL |
| A92A | 46 | LD | B,(HL) |
| A92B | C5 | PUSH | BC |

| LOC | INST | MNEM | OPER |
|---|---|---|---|
| 4EA3 | CDC6DD | CALL | DDC6 |
| 4EA6 | 3A7FF8 | LD | A,(F87F |
| 4EA9 | FE01 | CP | 01 |
| 4EAB | C2094F | JP | NZ,4F09 |
| 4EAE | 21F7FF | LD | HL,FFF7 |
| 4EB1 | 19 | ADD | HL,DE |
| 4EB2 | 3600 | LD | (HL),00 |
| 4EB4 | 21F7FF | LD | HL,FFF7 |
| 4EB7 | 19 | ADD | HL,DE |
| 4EB8 | 3E03 | LD | A,03 |
| 4EBA | BE | CP | (HL) |

| LOC | INST | MNEM | OPER |
|---|---|---|---|
| 4E56 | CD53DE | CALL | DE53 |
| 4E59 | 21F4FF | LD | HL,FFF4 |
| 4E5C | 39 | ADD | HL,SP |
| 4E5D | F9 | LD | SP,HL |
| 4E5E | 21F7FF | LD | HL,FFF7 |
| 4E61 | 19 | ADD | HL,DE |
| 4E62 | 3600 | LD | (HL),00 |
| 4E64 | 21F7FF | LD | HL,FFF7 |
| 4E67 | 19 | ADD | HL,DE |
| 4E68 | 3E03 | LD | A,03 |
| 4E6A | BE | CP | (HL) |
| 4E6B | FA964E | JP | M,4E96 |
| 4E6E | 21F7FF | LD | HL,FFF7 |
| 4E71 | 19 | ADD | HL,DE |
| 4E72 | 7E | LD | A,(HL) |
| 4E73 | 4F | LD | C,A |
| 4E74 | 87 | ADD | A,A |
| 4E75 | 9F | SBC | A,A |
| 4E76 | 47 | LD | B,A |
| 4E77 | 21ADF8 | LD | HL,F8AD |
| 4E7A | 09 | ADD | HL,BC |
| 4E7B | E5 | PUSH | HL |

| LOC | INST | MNEM | OPER |
|---|---|---|---|
| 4E7C | 21F7FF | LD | HL,FFF7 |
| 4E7F | 19 | ADD | HL,DE |
| 4E80 | 7E | LD | A,(HL) |
| 4E81 | 4F | LD | C,A |
| 4E82 | 87 | ADD | A,A |
| 4E83 | 9F | SBC | A,A |
| 4E84 | 47 | LD | B,A |
| 4E85 | 21B1F8 | LD | HL,F8B1 |
| 4E88 | 09 | ADD | HL,BC |
| 4E89 | 3600 | LD | (HL),00 |
| 4E8B | C1 | POP | BC |
| 4E8C | 7E | LD | A,(HL) |
| 4E8D | 02 | LD | (BC),A |
| 4E8E | 21F7FF | LD | HL,FFF7 |
| 4E91 | 19 | ADD | HL,DE |
| 4E92 | 34 | INC | (HL) |
| 4E93 | C3644E | JP | 4E64 |
| 4E96 | 3A4BF8 | LD | A,(F84B) |
| 4E99 | B7 | OR | A |
| 4E9A | C2A34E | JP | NZ,4EA3 |
| 4E9D | CDF9DA | CALL | DAF9 |
| 4EA0 | C3A64E | JP | 4EA6 |

| LOC | INST | MNEM | OPER |
|---|---|---|---|
| 4EEA | 7E | LD | A,(HL) |
| 4EEB | 4F | LD | C,A |
| 4EEC | 87 | ADD | A,A |
| 4EED | 9F | SBC | A,A |
| 4EEE | 47 | LD | B,A |
| 4EEF | 21B1F8 | LD | HL,F8B1 |
| 4EF2 | 09 | ADD | HL,BC |
| 4EF3 | 7E | LD | A,(HL) |
| 4EF4 | 4F | LD | C,A |
| 4EF5 | 97 | SUB | A |
| 4EF6 | 47 | LD | B,A |

```
4EBB  FA094F    JP    M,4F09
4EBE  21F7FF    LD    HL,FFF7
4EC1  19        ADD   HL,DE
4EC2  7E        LD    A,(HL)
4EC3  4F        LD    C,A
4EC4  87        ADD   A,A
4EC5  9F        SBC   A,A
4EC6  47        LD    B,A
4EC7  21ADF8    LD    HL,F8AD
4ECA  09        ADD   HL,BC
4ECB  E5        PUSH  HL

LOC   INST      MNEM  OPER
4ECC  21F7FF    LD    HL,FFF7
4ECF  19        ADD   HL,DE
4ED0  7E        LD    A,(HL)
4ED1  4F        LD    C,A
4ED2  87        ADD   A,A
4ED3  9F        SBC   A,A
4ED4  47        LD    B,A
4ED5  21ADF8    LD    HL,F8AD
4ED8  09        ADD   HL,BC
4ED9  7E        LD    A,(HL)
4EDA  4F        LD    C,A
4EDB  97        SUB   A
4EDC  47        LD    B,A
4EDD  79        LD    A,C
4EDE  EEFF      XOR   FF
4EE0  4F        LD    C,A
4EE1  78        LD    A,B
4EE2  EE00      XOR   00
4EE4  47        LD    B,A
4EE5  C5        PUSH  BC
4EE6  21F7FF    LD    HL,FFF7
4EE9  19        ADD   HL,DE

LOC   INST      MNEM  OPER
4F2E  E5        PUSH  HL
4F2F  21F4FF    LD    HL,FFF4
4F32  19        ADD   HL,DE
4F33  7E        LD    A,(HL)
4F34  23        INC   HL
4F35  66        LD    H,(HL)
4F36  6F        LD    L,A
4F37  E3        EX    (SP),HL
4F38  C1        POP   BC
4F39  09        ADD   HL,BC
4F3A  C1        POP   BC
4F3B  7D        LD    A,L
4F3C  02        LD    (BC),A
4F3D  7C        LD    A,H
4F3E  03        INC   BC
4F3F  02        LD    (BC),A
4F40  21F7FF    LD    HL,FFF7
4F43  19        ADD   HL,DE
4F44  3600      LD    (HL),00
4F46  21F7FF    LD    HL,FFF7
4F49  19        ADD   HL,DE
4F4A  3E03      LD    A,03

4EF7  E1        POP   HL
4EF8  7D        LD    A,L
4EF9  A1        AND   C
4EFA  6F        LD    L,A
4EFB  7C        LD    A,H
4EFC  A0        AND   B
4EFD  67        LD    H,A
4EFE  C1        POP   BC
4EFF  7D        LD    A,L
4F00  02        LD    (BC),A
4F01  21F7FF    LD    HL,FFF7

LOC   INST      MNEM  OPER
4F04  19        ADD   HL,DE
4F05  34        INC   (HL)
4F06  C3B44E    JP    4EB4
4F09  21F4FF    LD    HL,FFF4
4F0C  19        ADD   HL,DE
4F0D  3AA9F8    LD    A,(F8A9)
4F10  77        LD    (HL),A
4F11  3AAAF8    LD    A,(F8AA)
4F14  23        INC   HL
4F15  77        LD    (HL),A
4F16  21F4FF    LD    HL,FFF4
4F19  19        ADD   HL,DE
4F1A  3AABF8    LD    A,(F8AB)
4F1D  96        SUB   (HL)
4F1E  3AACF8    LD    A,(F8AC)
4F21  23        INC   HL
4F22  9E        SBC   A,(HL)
4F23  FA954F    JP    M,4F95
4F26  21F8FF    LD    HL,FFF8
4F29  19        ADD   HL,DE
4F2A  E5        PUSH  HL
4F2B  2A86F8    LD    HL,(F886)

LOC   INST      MNEM  OPER
4F6A  47        LD    B,A
4F6B  21B1F8    LD    HL,F8B1
4F6E  09        ADD   HL,BC
4F6F  7E        LD    A,(HL)
4F70  4F        LD    C,A
4F71  97        SUB   A
4F72  47        LD    B,A
4F73  C5        PUSH  BC
4F74  21F8FF    LD    HL,FFF8
4F77  19        ADD   HL,DE
4F78  7E        LD    A,(HL)
4F79  23        INC   HL
4F7A  66        LD    H,(HL)
4F7B  6F        LD    L,A
4F7C  7E        LD    A,(HL)
4F7D  4F        LD    C,A
4F7E  97        SUB   A
4F7F  47        LD    B,A
4F80  E1        POP   HL
4F81  7D        LD    A,L
4F82  A1        AND   C
4F83  6F        LD    L,A
```

| LOC | INST | MNEM | OPER |
|---|---|---|---|
| 4F4C | BE | CP | (HL) |
| 4F4D | FAA84F | JP | M,4FA8 |
| 4F50 | 21F7FF | LD | HL,FFF7 |
| 4F53 | 19 | ADD | HL,DE |
| 4F54 | 7E | LD | A,(HL) |
| 4F55 | 4F | LD | C,A |
| 4F56 | 87 | ADD | A,A |
| 4F57 | 9F | SBC | A,A |
| 4F58 | 47 | LD | B,A |
| 4F59 | 21ADF8 | LD | HL,F8AD |
| 4F5C | 09 | ADD | HL,BC |
| 4F5D | 7E | LD | A,(HL) |
| 4F5E | 4F | LD | C,A |
| 4F5F | 97 | SUB | A |
| 4F60 | 47 | LD | B,A |
| 4F61 | C5 | PUSH | BC |
| 4F62 | 21F7FF | LD | HL,FFF7 |
| 4F65 | 19 | ADD | HL,DE |
| 4F66 | 7E | LD | A,(HL) |
| 4F67 | 4F | LD | C,A |
| 4F68 | 87 | ADD | A,A |
| 4F69 | 9F | SBC | A,A |

| LOC | INST | MNEM | OPER |
|---|---|---|---|
| 4FA8 | 21F7FF | LD | HL,FFF7 |
| 4FAB | 19 | ADD | HL,DE |
| 4FAC | 7E | LD | A,(HL) |
| 4FAD | FE04 | CP | 04 |
| 4FAF | C2984F | JP | NZ,4F98 |
| 4FB2 | 2100EF | LD | HL,EF00 |
| 4FB5 | E5 | PUSH | HL |
| 4FB6 | 21F4FF | LD | HL,FFF4 |
| 4FB9 | 19 | ADD | HL,DE |
| 4FBA | 7E | LD | A,(HL) |
| 4FBB | 23 | INC | HL |
| 4FBC | 66 | LD | H,(HL) |
| 4FBD | 6F | LD | L,A |
| 4FBE | E3 | EX | (SP),HL |
| 4FBF | C1 | POP | BC |
| 4FC0 | 09 | ADD | HL,BC |
| 4FC1 | 3601 | LD | (HL),01 |
| 4FC3 | 2A8DF8 | LD | HL,(F88D) |
| 4FC6 | 23 | INC | HL |
| 4FC7 | 228DF8 | LD | (F88D),HL |
| 4FCA | C3984F | JP | 4F98 |
| 4FCD | 21F7FF | LD | HL,FFF7 |

| LOC | INST | MNEM | OPER |
|---|---|---|---|
| 4FD0 | 19 | ADD | HL,DE |
| 4FD1 | 34 | INC | (HL) |
| 4FD2 | 21F8FF | LD | HL,FFF8 |
| 4FD5 | 19 | ADD | HL,DE |
| 4FD6 | 7E | LD | A,(HL) |
| 4FD7 | C600 | ADD | A,00 |
| 4FD9 | 77 | LD | (HL),A |
| 4FDA | 23 | INC | HL |
| 4FDB | 7E | LD | A,(HL) |
| 4FDC | CE01 | ADC | A,01 |
| 4FDE | 77 | LD | (HL),A |
| 4FDF | C3464F | JP | 4F46 |

| LOC | INST | MNEM | OPER |
|---|---|---|---|
| 4F84 | 7C | LD | A,H |
| 4F85 | A0 | AND | B |
| 4F86 | 67 | LD | H,A |
| 4F87 | C1 | POP | BC |
| 4F88 | 79 | LD | A,C |
| 4F89 | BD | CP | L |
| 4F8A | C28F4F | JP | NZ,4F8F |
| 4F8D | 78 | LD | A,B |
| 4F8E | BC | CP | H |
| 4F8F | CACD4F | JP | Z,4FCD |
| 4F92 | C3A84F | JP | 4FA8 |
| 4F95 | C395DE | JP | DE95 |
| 4F98 | 21F4FF | LD | HL,FFF4 |
| 4F9B | 19 | ADD | HL,DE |
| 4F9C | 7E | LD | A,(HL) |
| 4F9D | C601 | ADD | A,01 |
| 4F9F | 77 | LD | (HL),A |
| 4FA0 | 23 | INC | HL |
| 4FA1 | 7E | LD | A,(HL) |
| 4FA2 | CE00 | ADC | A,00 |
| 4FA4 | 77 | LD | (HL),A |
| 4FA5 | C3164F | JP | 4F16 |

| LOC | INST | MNEM | OPER |
|---|---|---|---|
| B294 | CD53DE | CALL | DE53 |
| B297 | 21EEFF | LD | HL,FFEE |
| B29A | 39 | ADD | HL,SP |
| B29B | F9 | LD | SP,HL |
| B29C | 21F6FF | LD | HL,FFF6 |
| B29F | 19 | ADD | HL,DE |
| B2A0 | 3600 | LD | (HL),00 |
| B2A2 | 21F6FF | LD | HL,FFF6 |
| B2A5 | 19 | ADD | HL,DE |
| B2A6 | 3E03 | LD | A,03 |
| B2A8 | BE | CP | (HL) |
| B2A9 | FAD8B3 | JP | M,B3D8 |
| B2AC | 21F5FF | LD | HL,FFF5 |
| B2AF | 19 | ADD | HL,DE |
| B2B0 | E5 | PUSH | HL |
| B2B1 | 21F6FF | LD | HL,FFF6 |
| B2B4 | 19 | ADD | HL,DE |
| B2B5 | 7E | LD | A,(HL) |
| B2B6 | 4F | LD | C,A |
| B2B7 | 87 | ADD | A,A |
| B2B8 | 9F | SBC | A,A |
| B2B9 | 47 | LD | B,A |

| LOC | INST | MNEM | OPER |
|---|---|---|---|
| B2BA | 2191F9 | LD | HL,F991 |
| B2BD | 09 | ADD | HL,BC |
| B2BE | 7E | LD | A,(HL) |
| B2BF | 4F | LD | C,A |
| B2C0 | 87 | ADD | A,A |
| B2C1 | 9F | SBC | A,A |
| B2C2 | 47 | LD | B,A |
| B2C3 | 21FFFF | LD | HL,FFFF |
| B2C6 | 09 | ADD | HL,BC |
| B2C7 | C1 | POP | BC |
| B2C8 | 7D | LD | A,L |
| B2C9 | 02 | LD | (BC),A |

| LOC | INST | MNEM | OPER |
|---|---|---|---|
| B2CA | 21F8FF | LD | HL,FFF8 |
| B2CD | 19 | ADD | HL,DE |
| B2CE | E5 | PUSH | HL |
| B2CF | 21F6FF | LD | HL,FFF6 |
| B2D2 | 19 | ADD | HL,DE |
| B2D3 | 7E | LD | A,(HL) |
| B2D4 | 4F | LD | C,A |
| B2D5 | 87 | ADD | A,A |
| B2D6 | 9F | SBC | A,A |
| B2D7 | 47 | LD | B,A |

| LOC | INST | MNEM | OPER |
|---|---|---|---|
| B2D8 | 2146F9 | LD | HL,F946 |
| B2DB | 09 | ADD | HL,BC |
| B2DC | 7E | LD | A,(HL) |
| B2DD | 4F | LD | C,A |
| B2DE | 87 | ADD | A,A |
| B2DF | 9F | SBC | A,A |
| B2E0 | 47 | LD | B,A |
| B2E1 | 69 | LD | L,C |
| B2E2 | 60 | LD | H,B |
| B2E3 | 0126F9 | LD | BC,F926 |
| B2E6 | 09 | ADD | HL,BC |
| B2E7 | C1 | POP | BC |
| B2E8 | 7D | LD | A,L |
| B2E9 | 02 | LD | (BC),A |
| B2EA | 7C | LD | A,H |
| B2EB | 03 | INC | BC |
| B2EC | 02 | LD | (BC),A |
| B2ED | 21F0FF | LD | HL,FFF0 |
| B2F0 | 19 | ADD | HL,DE |
| B2F1 | E5 | PUSH | HL |
| B2F2 | 21F6FF | LD | HL,FFF6 |
| B2F5 | 19 | ADD | HL,DE |

| LOC | INST | MNEM | OPER |
|---|---|---|---|
| B2F6 | 7E | LD | A,(HL) |
| B2F7 | 4F | LD | C,A |
| B2F8 | 87 | ADD | A,A |
| B2F9 | 9F | SBC | A,A |
| B2FA | 47 | LD | B,A |
| B2FB | 69 | LD | L,C |
| B2FC | 60 | LD | H,B |
| B2FD | 29 | ADD | HL,HL |
| B2FE | 01C3F9 | LD | BC,F9C3 |
| B301 | 09 | ADD | HL,BC |
| B302 | C1 | POP | BC |
| B303 | 7E | LD | A,(HL) |
| B304 | 02 | LD | (BC),A |
| B305 | 23 | INC | HL |
| B306 | 7E | LD | A,(HL) |
| B307 | 03 | INC | BC |
| B308 | 02 | LD | (BC),A |
| B309 | 21EEFF | LD | HL,FFEE |
| B30C | 19 | ADD | HL,DE |
| B30D | E5 | PUSH | HL |
| B30E | 21F6FF | LD | HL,FFF6 |
| B311 | 19 | ADD | HL,DE |

| LOC | INST | MNEM | OPER |
|---|---|---|---|
| B312 | 7E | LD | A,(HL) |
| B313 | 4F | LD | C,A |
| B314 | 87 | ADD | A,A |
| B315 | 9F | SBC | A,A |
| B316 | 47 | LD | B,A |
| B317 | 69 | LD | L,C |
| B318 | 60 | LD | H,B |
| B319 | 29 | ADD | HL,HL |
| B31A | 01F9F9 | LD | BC,F9F9 |
| B31D | 09 | ADD | HL,BC |
| B31E | C1 | POP | BC |
| B31F | 7E | LD | A,(HL) |
| B320 | 02 | LD | (BC),A |
| B321 | 23 | INC | HL |
| B322 | 7E | LD | A,(HL) |
| B323 | 03 | INC | BC |
| B324 | 02 | LD | (BC),A |
| B325 | 21F7FF | LD | HL,FFF7 |
| B328 | 19 | ADD | HL,DE |
| B329 | 3600 | LD | (HL),00 |
| B32B | 21F5FF | LD | HL,FFF5 |
| B32E | 19 | ADD | HL,DE |

| LOC | INST | MNEM | OPER |
|---|---|---|---|
| B32F | E5 | PUSH | HL |
| B330 | 21F7FF | LD | HL,FFF7 |
| B333 | 19 | ADD | HL,DE |
| B334 | C1 | POP | BC |
| B335 | 0A | LD | A,(BC) |
| B336 | BE | CP | (HL) |
| B337 | FADBB3 | JP | M,B3DB |
| B33A | 21F4FF | LD | HL,FFF4 |
| B33D | 19 | ADD | HL,DE |
| B33E | E5 | PUSH | HL |
| B33F | 21F7FF | LD | HL,FFF7 |
| B342 | 19 | ADD | HL,DE |
| B343 | 7E | LD | A,(HL) |
| B344 | 4F | LD | C,A |
| B345 | 87 | ADD | A,A |
| B346 | 9F | SBC | A,A |
| B347 | 47 | LD | B,A |
| B348 | 21F8FF | LD | HL,FFF8 |
| B34B | 19 | ADD | HL,DE |
| B34C | 7E | LD | A,(HL) |
| B34D | 23 | INC | HL |
| B34E | 66 | LD | H,(HL) |

| LOC | INST | MNEM | OPER |
|---|---|---|---|
| B34F | 6F | LD | L,A |
| B350 | 09 | ADD | HL,BC |
| B351 | 7E | LD | A,(HL) |
| B352 | 4F | LD | C,A |
| B353 | 97 | SUB | A |
| B354 | 47 | LD | B,A |
| B355 | C5 | PUSH | BC |
| B356 | 210400 | LD | HL,0004 |
| B359 | E5 | PUSH | HL |
| B35A | CD68DE | CALL | DE68 |
| B35D | E1 | POP | HL |
| B35E | C1 | POP | BC |
| B35F | 7D | LD | A,L |
| B360 | 02 | LD | (BC),A |
| B361 | 21F3FF | LD | HL,FFF3 |
| B364 | 19 | ADD | HL,DE |
| B365 | E5 | PUSH | HL |
| B366 | 21F7FF | LD | HL,FFF7 |
| B369 | 19 | ADD | HL,DE |
| B36A | 7E | LD | A,(HL) |
| B36B | 4F | LD | C,A |
| B36C | 87 | ADD | A,A |

| LOC | INST | MNEM | OPER |
|---|---|---|---|
| B36D | 9F | SBC | A,A |
| B36E | 47 | LD | B,A |
| B36F | 21F8FF | LD | HL,FFF8 |
| B372 | 19 | ADD | HL,DE |
| B373 | 7E | LD | A,(HL) |
| B374 | 23 | INC | HL |
| B375 | 66 | LD | H,(HL) |
| B376 | 6F | LD | L,A |
| B377 | 09 | ADD | HL,BC |
| B378 | 7E | LD | A,(HL) |
| B379 | 4F | LD | C,A |
| B37A | 97 | SUB | A |
| B37B | 47 | LD | B,A |
| B37C | 79 | LD | A,C |
| B37D | E60F | AND | 0F |
| B37F | 4F | LD | C,A |
| B380 | 78 | LD | A,B |
| B381 | E600 | AND | 00 |
| B383 | 47 | LD | B,A |
| B384 | E1 | POP | HL |
| B385 | 79 | LD | A,C |
| B386 | 77 | LD | (HL),A |

| LOC | INST | MNEM | OPER |
|---|---|---|---|
| B3C9 | 87 | ADD | A,A |
| B3CA | 9F | SBC | A,A |
| B3CB | 47 | LD | B,A |
| B3CC | C5 | PUSH | BC |
| B3CD | CD5FDE | CALL | DE5F |
| B3D0 | E1 | POP | HL |
| B3D1 | C1 | POP | BC |
| B3D2 | 0A | LD | A,(BC) |
| B3D3 | B5 | OR | L |
| B3D4 | 02 | LD | (BC),A |
| B3D5 | C3EBB3 | JP | B3EB |

| LOC | INST | MNEM | OPER |
|---|---|---|---|
| B387 | 21F0FF | LD | HL,FFF0 |
| B38A | 19 | ADD | HL,DE |
| B38B | 4E | LD | C,(HL) |
| B38C | 23 | INC | HL |
| B38D | 46 | LD | B,(HL) |
| B38E | C5 | PUSH | BC |
| B38F | 21F7FF | LD | HL,FFF7 |
| B392 | 19 | ADD | HL,DE |
| B393 | 7E | LD | A,(HL) |
| B394 | 4F | LD | C,A |
| B395 | 87 | ADD | A,A |
| B396 | 9F | SBC | A,A |
| B397 | 47 | LD | B,A |
| B398 | C5 | PUSH | BC |
| B399 | CDA7DE | CALL | DEA7 |
| B39C | E1 | POP | HL |
| B39D | 7D | LD | A,L |
| B39E | E601 | AND | 01 |
| B3A0 | 6F | LD | L,A |
| B3A1 | 7C | LD | A,H |
| B3A2 | E602 | AND | 02 |
| B3A4 | 67 | LD | H,A |

| LOC | INST | MNEM | OPER |
|---|---|---|---|
| B3A5 | 7D | LD | A,L |
| B3A6 | FE01 | CP | 01 |
| B3A8 | C2AEB3 | JP | NZ,B3AE |
| B3AB | 7C | LD | A,H |
| B3AC | FE02 | CP | 02 |
| B3AE | C2EBB3 | JP | NZ,B3EB |
| B3B1 | 21F4FF | LD | HL,FFF4 |
| B3B4 | 19 | ADD | HL,DE |
| B3B5 | 7E | LD | A,(HL) |
| B3B6 | 4F | LD | C,A |
| B3B7 | 87 | ADD | A,A |
| B3B8 | 9F | SBC | A,A |
| B3B9 | 47 | LD | B,A |
| B3BA | 21ADF8 | LD | HL,F8AD |
| B3BD | 09 | ADD | HL,BC |
| B3BE | E5 | PUSH | HL |
| B3BF | 210100 | LD | HL,0001 |
| B3C2 | E5 | PUSH | HL |
| B3C3 | 21F3FF | LD | HL,FFF3 |
| B3C6 | 19 | ADD | HL,DE |
| B3C7 | 7E | LD | A,(HL) |
| B3C8 | 4F | LD | C,A |

```
B3D8  C395DE    JP   DE95
B3DB  21F6FF    LD   HL,FFF6
B3DE  19        ADD  HL,DE
B3DF  34        INC  (HL)
B3E0  C3A2B2    JP   B2A2
B3E3  21F7FF    LD   HL,FFF7
B3E6  19        ADD  HL,DE
B3E7  34        INC  (HL)
B3E8  C32BB3    JP   B32B
B3EB  21EEFF    LD   HL,FFEE
B3EE  19        ADD  HL,DE

LOC   INST     MNEM OPER
B3EF  4E        LD   C,(HL)
B3F0  23        INC  HL
B3F1  46        LD   B,(HL)
B3F2  C5        PUSH BC
B3F3  21F7FF    LD   HL,FFF7
B3F6  19        ADD  HL,DE
B3F7  7E        LD   A,(HL)
B3F8  4F        LD   C,A
B3F9  87        ADD  A,A
B3FA  9F        SBC  A,A
B3FB  47        LD   B,A
B3FC  C5        PUSH BC
B3FD  CDA7DE    CALL DEA7
B400  E1        POP  HL
B401  7D        LD   A,L
B402  E601      AND  01
B404  6F        LD   L,A
B405  7C        LD   A,H
B406  E602      AND  02
B408  67        LD   H,A
B409  7D        LD   A,L
B40A  B4        OR   H

LOC   INST     MNEM OPER
B40B  C2E3B3    JP   NZ,B3E3
B40E  21F4FF    LD   HL,FFF4
B411  19        ADD  HL,DE
B412  7E        LD   A,(HL)
B413  4F        LD   C,A
B414  87        ADD  A,A
B415  9F        SBC  A,A
B416  47        LD   B,A
B417  21B1F8    LD   HL,F8B1
         ADD  HL,BC
      E5        PUSH HL
B41C  210100    LD   HL,0001
B41F  E5        PUSH HL
B420  21F3FF    LD   HL,FFF3
B423  19        ADD  HL,DE
B424  7E        LD   A,(HL)
B425  4F        LD   C,A
B426  87        ADD  A,A
B427  9F        SBC  A,A
B428  47        LD   B,A
B429  C5        PUSH BC
B42A  CD5FDE    CALL DE5F
```

| LOC | INST | MNEM | OPER | | | | | | | | | | | |
|---|---|---|---|---|---|---|---|---|---|---|---|---|---|---|
| ?2D | E1 | POP | HL | | | | | | | | | | | |
| ?E | C1 | POP | BC | | | | | | | | | | | |
| B42F | 0A | LD | A,(BC) | | | | | | | | | | | |
| B430 | B5 | OR | L | | | | | | | | | | | |
| B431 | 02 | LD | (BC),A | | | | | | | | | | | |
| B432 | C3E3B3 | JP | B3E3 | | | | | | | | | | | |

| LOC | INST | MNEM | OPER | SP | RF | RA | RB | RC | RD | RE | RH | RL | IX | IY |
|---|---|---|---|---|---|---|---|---|---|---|---|---|---|---|
| 78CF | 77 | LD | (HL),A | FFC2 | 02 | 12 | FF | CB | FF | C9 | FF | CD | C9A3 | 0000 |
| 78CF | BREAK | | | | | | | | | | | | | |

| LOC | INST | MNEM | OPER | | LOC | INST | MNEM | OPER |
|---|---|---|---|---|---|---|---|---|
| B734 | CD53DE | CALL | DE53 | | B776 | 97 | SUB | A |
| B737 | 21F4FF | LD | HL,FFF4 | | B777 | 47 | LD | B,A |
| B73A | 39 | ADD | HL,SP | | B778 | C5 | PUSH | BC |
| B73B | F9 | LD | SP,HL | | B779 | 210400 | LD | HL,0004 |
| B73C | 21F4FF | LD | HL,FFF4 | | B77C | E5 | PUSH | HL |
| B73F | 19 | ADD | HL,DE | | B77D | CD68DE | CALL | DE68 |
| B740 | E5 | PUSH | HL | | B780 | E1 | POP | HL |
| B741 | 3A8AF8 | LD | A,(F88A) | | B781 | C1 | POP | BC |
| B744 | 4F | LD | C,A | | B782 | 7D | LD | A,L |
| B745 | 87 | ADD | A,A | | B783 | 02 | LD | (BC),A |
| B746 | 9F | SBC | A,A | | B784 | 21F8FF | LD | HL,FFF8 |
| B747 | 47 | LD | B,A | | B787 | 19 | ADD | HL,DE |
| B748 | 69 | LD | L,C | | B788 | E5 | PUSH | HL |
| B749 | 60 | LD | H,B | | B789 | 21F4FF | LD | HL,FFF4 |
| B74A | 29 | ADD | HL,HL | | B78C | 19 | ADD | HL,DE |
| B74B | 29 | ADD | HL,HL | | B78D | 7E | LD | A,(HL) |
| B74C | 29 | ADD | HL,HL | | B78E | 23 | INC | HL |
| B74D | 0163F9 | LD | BC,F963 | | B78F | 66 | LD | H,(HL) |
| B750 | 09 | ADD | HL,BC | | B790 | 6F | LD | L,A |
| B751 | C1 | POP | BC | | B791 | 7E | LD | A,(HL) |
| B752 | 7D | LD | A,L | | B792 | 4F | LD | C,A |
| B753 | 02 | LD | (BC),A | | B793 | 97 | SUB | A |

| LOC | INST | MNEM | OPER | | LOC | INST | MNEM | OPER |
|---|---|---|---|---|---|---|---|---|
| B754 | 7C | LD | A,H | | B794 | 47 | LD | B,A |
| B755 | 03 | INC | BC | | B795 | 79 | LD | A,C |
| B756 | 02 | LD | (BC),A | | B796 | E62F | AND | 2F |
| B757 | 21F7FF | LD | HL,FFF7 | | B798 | 4F | LD | C,A |
| B75A | 19 | ADD | HL,DE | | B799 | 78 | LD | A,B |
| B75B | 3600 | LD | (HL),00 | | B79A | E600 | AND | 00 |
| B75D | 21F7FF | LD | HL,FFF7 | | B79C | 47 | LD | B,A |
| B760 | 19 | ADD | HL,DE | | B79D | E1 | POP | HL |
| B761 | 3E07 | LD | A,07 | | B79E | 79 | LD | A,C |
| B763 | BE | CP | (HL) | | B79F | 77 | LD | (HL),A |
| B764 | FAEDB7 | JP | M,B7ED | | B7A0 | 2ADFF9 | LD | HL,(F9DF) |
| B767 | 21F9FF | LD | HL,FFF9 | | B7A3 | E5 | PUSH | HL |
| B76A | 19 | ADD | HL,DE | | B7A4 | 21F7FF | LD | HL,FFF7 |
| B76B | E5 | PUSH | HL | | B7A7 | 19 | ADD | HL,DE |
| B76C | 21F4FF | LD | HL,FFF4 | | B7A8 | 7E | LD | A,(HL) |
| B76F | 19 | ADD | HL,DE | | B7A9 | 4F | LD | C,A |
| B770 | 7E | LD | A,(HL) | | B7AA | 87 | ADD | A,A |
| B771 | 23 | INC | HL | | B7AB | 9F | SBC | A,A |
| B772 | 66 | LD | H,(HL) | | B7AC | 47 | LD | B,A |
| B773 | 6F | LD | L,A | | B7AD | C5 | PUSH | BC |
| B774 | 7E | LD | A,(HL) | | B7AE | CDA7DE | CALL | DEA7 |
| B775 | 4F | LD | C,A | | B7B1 | E1 | POP | HL |

| LOC | INST | MNEM | OPER |
|---|---|---|---|
| B7B2 | 7D | LD | A,L |
| B7B3 | E601 | AND | 01 |
| B7B5 | 6F | LD | L,A |
| B7B6 | 7C | LD | A,H |
| B7B7 | E600 | AND | 00 |
| B7B9 | 67 | LD | H,A |
| B7BA | 7D | LD | A,L |
| B7BB | FE01 | CP | 01 |
| B7BD | C2C3B7 | JP | NZ,B7C3 |
| B7C0 | 7C | LD | A,H |
| B7C1 | FE00 | CP | 00 |
| B7C3 | C205B8 | JP | NZ,B805 |
| B7C6 | 21F9FF | LD | HL,FFF9 |
| B7C9 | 19 | ADD | HL,DE |
| B7CA | 7E | LD | A,(HL) |
| B7CB | 4F | LD | C,A |
| B7CC | 87 | ADD | A,A |
| B7CD | 9F | SBC | A,A |
| B7CE | 47 | LD | B,A |
| B7CF | 21ADF8 | LD | HL,F8AD |
| B7D2 | 09 | ADD | HL,BC |
| B7D3 | E5 | PUSH | HL |

| LOC | INST | MNEM | OPER |
|---|---|---|---|
| B7D4 | 210100 | LD | HL,0001 |
| B7D7 | E5 | PUSH | HL |
| B7D8 | 21F8FF | LD | HL,FFF8 |
| B7DB | 19 | ADD | HL,DE |
| B7DC | 7E | LD | A,(HL) |
| B7DD | 4F | LD | C,A |
| B7DE | 87 | ADD | A,A |
| B7DF | 9F | SBC | A,A |
| B7E0 | 47 | LD | B,A |
| B7E1 | C5 | PUSH | BC |
| B7E2 | CD5FDE | CALL | DE5F |
| B7E5 | E1 | POP | HL |
| B7E6 | C1 | POP | BC |
| B7E7 | 0A | LD | A,(BC) |
| B7E8 | B5 | OR | L |
| B7E9 | 02 | LD | (BC),A |
| B7EA | C305B8 | JP | B805 |
| B7ED | C395DE | JP | DE95 |
| B7F0 | 21F7FF | LD | HL,FFF7 |
| B7F3 | 19 | ADD | HL,DE |
| B7F4 | 34 | INC | (HL) |
| B7F5 | 21F4FF | LD | HL,FFF4 |

| LOC | INST | MNEM | OPER |
|---|---|---|---|
| B83A | 7E | LD | A,(HL) |
| B83B | 4F | LD | C,A |
| B83C | 87 | ADD | A,A |
| B83D | 9F | SBC | A,A |
| B83E | 47 | LD | B,A |
| B83F | C5 | PUSH | BC |
| B840 | CD5FDE | CALL | DE5F |
| B843 | E1 | POP | HL |
| B844 | C1 | POP | BC |
| B845 | 0A | LD | A,(BC) |
| B846 | B5 | OR | L |
| B847 | 02 | LD | (BC),A |
| B848 | C3F0B7 | JP | B7F0 |

| LOC | INST | MNEM | OPER |
|---|---|---|---|
| B7F8 | 19 | ADD | HL,DE |
| B7F9 | 7E | LD | A,(HL) |
| B7FA | C601 | ADD | A,01 |
| B7FC | 77 | LD | (HL),A |
| B7FD | 23 | INC | HL |
| B7FE | 7E | LD | A,(HL) |
| B7FF | CE00 | ADC | A,00 |
| B801 | 77 | LD | (HL),A |
| B802 | C35DB7 | JP | B75D |
| B805 | 2A15FA | LD | HL,(FA15) |
| B808 | E5 | PUSH | HL |
| B809 | 21F7FF | LD | HL,FFF7 |
| B80C | 19 | ADD | HL,DE |
| B80D | 7E | LD | A,(HL) |
| B80E | 4F | LD | C,A |
| B80F | 87 | ADD | A,A |
| B810 | 9F | SBC | A,A |
| B811 | 47 | LD | B,A |
| B812 | C5 | PUSH | BC |
| B813 | CDA7DE | CALL | DEA7 |
| B816 | E1 | POP | HL |
| B817 | 7D | LD | A,L |

| LOC | INST | MNEM | OPER |
|---|---|---|---|
| B818 | E601 | AND | 01 |
| B81A | 6F | LD | L,A |
| B81B | 7C | LD | A,H |
| B81C | E600 | AND | 00 |
| B81E | 67 | LD | H,A |
| B81F | 7D | LD | A,L |
| B820 | B4 | OR | H |
| B821 | C2F0B7 | JP | NZ,B7F0 |
| B824 | 21F9FF | LD | HL,FFF9 |
| B827 | 19 | ADD | HL,DE |
| B828 | 7E | LD | A,(HL) |
| B829 | 4F | LD | C,A |
| B82A | 87 | ADD | A,A |
| B82B | 9F | SBC | A,A |
| B82C | 47 | LD | B,A |
| B82D | 21B1F8 | LD | HL,F8B1 |
| B830 | 09 | ADD | HL,BC |
| B831 | E5 | PUSH | HL |
| B832 | 210100 | LD | HL,0001 |
| B835 | E5 | PUSH | HL |
| B836 | 21F8FF | LD | HL,FFF8 |
| B839 | 19 | ADD | HL,DE |

| LOC | INST | MNEM | OPER |
|---|---|---|---|
| 4B78 | CD53DE | CALL | DE53 |
| 4B7B | 21F4FF | LD | HL,FFF4 |
| 4B7E | 39 | ADD | HL,SP |
| 4B7F | F9 | LD | SP,HL |
| 4B80 | 3A4BF8 | LD | A,(F84B) |
| 4B83 | FE01 | CP | 01 |
| 4B85 | C2B84B | JP | NZ,4B88 |
| 4B88 | CDA8DD | CALL | DDA8 |
| 4B8B | 3A00F8 | LD | A,(F800) |
| 4B8E | B7 | OR | A |
| 4B8F | C2204C | JP | NZ,4C20 |
| 4B92 | 21F6FF | LD | HL,FFF6 |

| LOC | INST | MNEM | OPER |
|---|---|---|---|
| 4B95 | 19 | ADD | HL,DE |
| 4B96 | E5 | PUSH | HL |
| 4B97 | 2A86F8 | LD | HL,(F886) |
| 4B9A | 010002 | LD | BC,0200 |
| 4B9D | 09 | ADD | HL,BC |
| 4B9E | E5 | PUSH | HL |
| 4B9F | 2AA9F8 | LD | HL,(F8A9) |
| 4BA2 | E3 | EX | (SP),HL |
| 4BA3 | C1 | POP | BC |
| 4BA4 | 09 | ADD | HL,BC |

| LOC | INST | MNEM | OPER |
|---|---|---|---|
| 4BA5 | C1 | POP | BC |
| 4BA6 | 7D | LD | A,L |
| 4BA7 | 02 | LD | (BC),A |
| 4BA8 | 7C | LD | A,H |
| 4BA9 | 03 | INC | BC |
| 4BAA | 02 | LD | (BC),A |
| 4BAB | 21F4FF | LD | HL,FFF4 |
| 4BAE | 19 | ADD | HL,DE |
| 4BAF | E5 | PUSH | HL |
| 4BB0 | 21F6FF | LD | HL,FFF6 |
| 4BB3 | 19 | ADD | HL,DE |
| 4BB4 | 7E | LD | A,(HL) |
| 4BB5 | 23 | INC | HL |
| 4BB6 | 66 | LD | H,(HL) |
| 4BB7 | 6F | LD | L,A |
| 4BB8 | 010001 | LD | BC,0100 |
| 4BBB | 09 | ADD | HL,BC |
| 4BBC | C1 | POP | BC |
| 4BBD | 7D | LD | A,L |
| 4BBE | 02 | LD | (BC),A |
| 4BBF | 7C | LD | A,H |
| 4BC0 | 03 | INC | BC |

| LOC | INST | MNEM | OPER |
|---|---|---|---|
| 4BC1 | 02 | LD | (BC),A |
| 4BC2 | 21F8FF | LD | HL,FFF8 |
| 4BC5 | 19 | ADD | HL,DE |
| 4BC6 | 3AA9F8 | LD | A,(F8A9) |
| 4BC9 | 77 | LD | (HL),A |
| 4BCA | 3AAAF8 | LD | A,(F8AA) |
| 4BCD | 23 | INC | HL |
| 4BCE | 77 | LD | (HL),A |
| 4BCF | 21F8FF | LD | HL,FFF8 |
| 4BD2 | 19 | ADD | HL,DE |
| 4BD3 | 3AABF8 | LD | A,(F8AB) |
| 4BD6 | 96 | SUB | (HL) |
| 4BD7 | 3AACF8 | LD | A,(F8AC) |
| 4BDA | 23 | INC | HL |
| 4BDB | 9E | SBC | A,(HL) |
| 4BDC | FAE94C | JP | M,4CE9 |
| 4BDF | 21F6FF | LD | HL,FFF6 |
| 4BE2 | 19 | ADD | HL,DE |
| 4BE3 | 7E | LD | A,(HL) |
| 4BE4 | 23 | INC | HL |
| 4BE5 | 66 | LD | H,(HL) |
| 4BE6 | 6F | LD | L,A |

| LOC | INST | MNEM | OPER |
|---|---|---|---|
| 4C03 | 23 | INC | HL |
| 4C04 | 66 | LD | H,(HL) |
| 4C05 | 6F | LD | L,A |
| 4C06 | 7E | LD | A,(HL) |
| 4C07 | 4F | LD | C,A |
| 4C08 | 97 | SUB | A |
| 4C09 | 47 | LD | B,A |
| 4C0A | C5 | PUSH | BC |
| 4C0B | 3AB6F8 | LD | A,(F8B6) |
| 4C0E | 4F | LD | C,A |
| 4C0F | 97 | SUB | A |
| 4C10 | 47 | LD | B,A |
| 4C11 | E1 | POP | HL |
| 4C12 | 7D | LD | A,L |
| 4C13 | A1 | AND | C |
| 4C14 | 6F | LD | L,A |
| 4C15 | 7C | LD | A,H |
| 4C16 | A0 | AND | B |
| 4C17 | 67 | LD | H,A |
| 4C18 | 7D | LD | A,L |
| 4C19 | B4 | OR | H |
| 4C1A | CABF4C | JP | Z,4CBF |

| LOC | INST | MNEM | OPER |
|---|---|---|---|
| 4BE7 | 7E | LD | A,(HL) |
| 4BE8 | 4F | LD | C,A |
| 4BE9 | 97 | SUB | A |
| 4BEA | 47 | LD | B,A |
| 4BEB | C5 | PUSH | BC |
| 4BEC | 3AB5F8 | LD | A,(F8B5) |
| 4BEF | 4F | LD | C,A |
| 4BF0 | 97 | SUB | A |
| 4BF1 | 47 | LD | B,A |
| 4BF2 | E1 | POP | HL |
| 4BF3 | 7D | LD | A,L |
| 4BF4 | A1 | AND | C |
| 4BF5 | 6F | LD | L,A |
| 4BF6 | 7C | LD | A,H |
| 4BF7 | A0 | AND | B |
| 4BF8 | 67 | LD | H,A |
| 4BF9 | 7D | LD | A,L |
| 4BFA | B4 | OR | H |
| 4BFB | C2A74C | JP | NZ,4CA7 |
| 4BFE | 21F4FF | LD | HL,FFF4 |
| 4C01 | 19 | ADD | HL,DE |
| 4C02 | 7E | LD | A,(HL) |

| LOC | INST | MNEM | OPER |
|---|---|---|---|
| 4C43 | E5 | PUSH | HL |
| 4C44 | 21A9F8 | LD | HL,F8A9 |
| 4C47 | C1 | POP | BC |
| 4C48 | 0A | LD | A,(BC) |
| 4C49 | 86 | ADD | A,(HL) |
| 4C4A | 02 | LD | (BC),A |
| 4C4B | 03 | INC | BC |
| 4C4C | 0A | LD | A,(BC) |
| 4C4D | 23 | INC | HL |
| 4C4E | 8E | ADC | A,(HL) |
| 4C4F | 02 | LD | (BC),A |
| 4C50 | 21F8FF | LD | HL,FFF8 |
| 4C53 | 19 | ADD | HL,DE |
| 4C54 | 3AA9F8 | LD | A,(F8A9) |
| 4C57 | 77 | LD | (HL),A |
| 4C58 | 3AAAF8 | LD | A,(F8AA) |
| 4C5B | 23 | INC | HL |
| 4C5C | 77 | LD | (HL),A |
| 4C5D | 21F8FF | LD | HL,FFF8 |
| 4C5D | 19 | ADD | HL,DE |
| 4C61 | 3AABF8 | LD | A,(F8AB) |
| 4C64 | 96 | SUB | (HL) |

| LOC | INST | MNEM | OPER |
|---|---|---|---|
| | ACF8 | LD | A,(F8AC) |
| 4C68 | 23 | INC | HL |
| 4C69 | 9E | SBC | A,(HL) |
| 4C6A | FAE94C | JP | M,4CE9 |
| 4C6D | 21F6FF | LD | HL,FFF6 |
| 4C70 | 19 | ADD | HL,DE |
| 4C71 | 7E | LD | A,(HL) |
| 4C72 | 23 | INC | HL |
| 4C73 | 66 | LD | H,(HL) |
| 4C74 | 6F | LD | L,A |
| 4C75 | 7E | LD | A,(HL) |

| LOC | INST | MNEM | OPER |
|---|---|---|---|
| 4C1D | C3A74C | JP | 4CA7 |
| 4C20 | 21F6FF | LD | HL,FFF6 |
| 4C23 | 19 | ADD | HL,DE |
| 4C24 | E5 | PUSH | HL |
| 4C25 | 3A88F8 | LD | A,(F888) |
| 4C28 | B7 | OR | A |
| 4C29 | C2344C | JP | NZ,4C34 |
| 4C2C | 2100ED | LD | HL,ED00 |
| 4C2F | 4D | LD | C,L |
| 4C30 | 44 | LD | B,H |
| 4C31 | C3394C | JP | 4C39 |
| 4C34 | 2100EE | LD | HL,EE00 |
| 4C37 | 4D | LD | C,L |
| 4C38 | 44 | LD | B,H |
| 4C39 | E1 | POP | HL |
| 4C3A | 79 | LD | A,C |
| 4C3B | 77 | LD | (HL),A |
| 4C3C | 78 | LD | A,B |
| 4C3D | 23 | INC | HL |
| 4C3E | 77 | LD | (HL),A |
| 4C3F | 21F6FF | LD | HL,FFF6 |
| 4C42 | 19 | ADD | HL,DE |

| LOC | INST | MNEM | OPER |
|---|---|---|---|
| 4C83 | 6F | LD | L,A |
| 4C84 | 7C | LD | A,H |
| 4C85 | A0 | AND | B |
| 4C86 | 67 | LD | H,A |
| 4C87 | 7D | LD | A,L |
| 4C88 | B4 | OR | H |
| 4C89 | CAEC4C | JP | Z,4CEC |
| 4C8C | 2100EF | LD | HL,EF00 |
| 4C8F | E5 | PUSH | HL |
| 4C90 | 21F8FF | LD | HL,FFF8 |
| 4C93 | 19 | ADD | HL,DE |
| 4C94 | 7E | LD | A,(HL) |
| 4C95 | 23 | INC | HL |
| 4C96 | 66 | LD | H,(HL) |
| 4C97 | 6F | LD | L,A |
| 4C98 | E3 | EX | (SP),HL |
| 4C99 | C1 | POP | BC |
| 4C9A | 09 | ADD | HL,BC |
| 4C9B | 3601 | LD | (HL),01 |
| 4C9D | 2A8DF8 | LD | HL,(F88D) |
| 4CA0 | 23 | INC | HL |
| 4CA1 | 228DF8 | LD | (F88D),HL |

| LOC | INST | MNEM | OPER |
|---|---|---|---|
| 4CA4 | C3EC4C | JP | 4CEC |
| 4CA7 | 2100EF | LD | HL,EF00 |
| 4CAA | E5 | PUSH | HL |
| 4CAB | 21F8FF | LD | HL,FFF8 |
| 4CAE | 19 | ADD | HL,DE |
| 4CAF | 7E | LD | A,(HL) |
| 4CB0 | 23 | INC | HL |
| 4CB1 | 66 | LD | H,(HL) |
| 4CB2 | 6F | LD | L,A |
| 4CB3 | E3 | EX | (SP),HL |
| 4CB4 | C1 | POP | BC |

| LOC | INST | MNEM | OPER |
|---|---|---|---|
| 4C76 | 4F | LD | C,A |
| 4C77 | 97 | SUB | A |
| 4C78 | 47 | LD | B,A |
| 4C79 | C5 | PUSH | BC |
| 4C7A | 3AB5F8 | LD | A,(F8B5) |
| 4C7D | 4F | LD | C,A |
| 4C7E | 97 | SUB | A |
| 4C7F | 47 | LD | B,A |
| 4C80 | E1 | POP | HL |
| 4C81 | 7D | LD | A,L |
| 4C82 | A1 | AND | C |

| LOC | INST | MNEM | OPER |
|---|---|---|---|
| 4CC8 | 7E | LD | A,(HL) |
| 4CC9 | CE00 | ADC | A,00 |
| 4CCB | 77 | LD | (HL),A |
| 4CCC | 21F6FF | LD | HL,FFF6 |
| 4CCF | 19 | ADD | HL,DE |
| 4CD0 | 7E | LD | A,(HL) |
| 4CD1 | C601 | ADD | A,01 |
| 4CD3 | 77 | LD | (HL),A |
| 4CD4 | 23 | INC | HL |
| 4CD5 | 7E | LD | A,(HL) |
| 4CD6 | CE00 | ADC | A,00 |
| 4CD8 | 77 | LD | (HL),A |
| 4CD9 | 21F4FF | LD | HL,FFF4 |
| 4CDC | 19 | ADD | HL,DE |
| 4CDD | 7E | LD | A,(HL) |
| 4CDE | C601 | ADD | A,01 |
| 4CE0 | 77 | LD | (HL),A |
| 4CE1 | 23 | INC | HL |
| 4CE2 | 7E | LD | A,(HL) |
| 4CE3 | CE00 | ADC | A,00 |
| 4CE5 | 77 | LD | (HL),A |
| 4CE6 | C3CF4B | JP | 4BCF |

| LOC | INST | MNEM | OPER |
|---|---|---|---|
| 4CE9 | C395DE | JP | DE95 |
| 4CEC | 21F8FF | LD | HL,FFF8 |
| 4CEF | 19 | ADD | HL,DE |
| 4CF0 | 7E | LD | A,(HL) |
| 4CF1 | C601 | ADD | A,01 |
| 4CF3 | 77 | LD | (HL),A |
| 4CF4 | 23 | INC | HL |
| 4CF5 | 7E | LD | A,(HL) |
| 4CF6 | CE00 | ADC | A,00 |
| 4CF8 | 77 | LD | (HL),A |
| 4CF9 | 21F6FF | LD | HL,FFF6 |
| 4CFC | 19 | ADD | HL,DE |
| 4CFD | 7E | LD | A,(HL) |
| 4CFE | C601 | ADD | A,01 |
| 4D00 | 77 | LD | (HL),A |
| 4D01 | 23 | INC | HL |
| 4D02 | 7E | LD | A,(HL) |
| 4D03 | CE00 | ADC | A,00 |
| 4D05 | 77 | LD | (HL),A |
| 4D06 | C35D4C | JP | 4C5D |

| LOC | INST | MNEM | OPER |
|---|---|---|---|
| 4CB5 | 09 | ADD | HL,BC |
| 4CB6 | 3601 | LD | (HL),01 |
| 4CB8 | 2A8DF8 | LD | HL,(F88D) |
| 4CBB | 23 | INC | HL |
| 4CBC | 228DF8 | LD | (F88D),HL |
| 4CBF | 21F8FF | LD | HL,FFF8 |
| 4CC2 | 19 | ADD | HL,DE |
| 4CC3 | 7E | LD | A,(HL) |
| 4CC4 | C601 | ADD | A,01 |
| 4CC6 | 77 | LD | (HL),A |
| 4CC7 | 23 | INC | HL |

| LOC | INST | MNEM | OPER |
|---|---|---|---|
| A5FF | CD53DE | CALL | DE53 |
| A602 | 21F4FF | LD | HL,FFF4 |
| A605 | 39 | ADD | HL,SP |
| A606 | F9 | LD | SP,HL |
| A607 | 3E00 | LD | A,00 |
| A609 | 32B6F8 | LD | (F8B6),A |
| A60C | 3AB6F8 | LD | A,(F8B6) |
| A60F | 32B5F8 | LD | (F8B5),A |
| A612 | 21F7FF | LD | HL,FFF7 |
| A615 | 19 | ADD | HL,DE |
| A616 | E5 | PUSH | HL |
| A617 | 3A00F8 | LD | A,(F800) |
| A61A | B7 | OR | A |
| A61B | C224A6 | JP | NZ,A624 |
| A61E | 010100 | LD | BC,0001 |
| A621 | C327A6 | JP | A627 |
| A624 | 010000 | LD | BC,0000 |
| A627 | E1 | POP | HL |
| A628 | 79 | LD | A,C |
| A629 | 77 | LD | (HL),A |
| A62A | 21F4FF | LD | HL,FFF4 |
| A62D | 19 | ADD | HL,DE |

| LOC | INST | MNEM | OPER |
|---|---|---|---|
| A62E | E5 | PUSH | HL |
| A62F | 3A8AF8 | LD | A,(F88A) |
| A632 | 4F | LD | C,A |
| A633 | 87 | ADD | A,A |
| A634 | 9F | SBC | A,A |
| A635 | 47 | LD | B,A |
| A636 | 69 | LD | L,C |
| A637 | 60 | LD | H,B |
| A638 | 29 | ADD | HL,HL |
| A639 | 29 | ADD | HL,HL |
| A63A | 29 | ADD | HL,HL |
| A63B | 0163F9 | LD | BC,F963 |
| A63E | 09 | ADD | HL,BC |
| A63F | C1 | POP | BC |
| A640 | 7D | LD | A,L |
| A641 | 02 | LD | (BC),A |
| A642 | 7C | LD | A,H |
| A643 | 03 | INC | BC |
| A644 | 02 | LD | (BC),A |
| A645 | 21F9FF | LD | HL,FFF9 |
| A648 | 19 | ADD | HL,DE |
| A649 | 3600 | LD | (HL),00 |

| LOC | INST | MNEM | OPER |
|---|---|---|---|
| A64B | 21F9FF | LD | HL,FFF9 |
| A64E | 19 | ADD | HL,DE |
| A64F | 3E07 | LD | A,07 |
| A651 | BE | CP | (HL) |
| A652 | FACEA6 | JP | M,A6CE |
| A655 | 21F8FF | LD | HL,FFF8 |
| A658 | 19 | ADD | HL,DE |
| A659 | E5 | PUSH | HL |
| A65A | 21F4FF | LD | HL,FFF4 |
| A65D | 19 | ADD | HL,DE |
| A65E | 7E | LD | A,(HL) |
| A65F | 23 | INC | HL |
| A660 | 66 | LD | H,(HL) |
| A661 | 6F | LD | L,A |
| A662 | 7E | LD | A,(HL) |
| A663 | 4F | LD | C,A |
| A664 | 97 | SUB | A |
| A665 | 47 | LD | B,A |
| A666 | C5 | PUSH | BC |
| A667 | 210400 | LD | HL,0004 |
| A66A | E5 | PUSH | HL |
| A66B | CD68DE | CALL | DE68 |

| LOC | INST | MNEM | OPER |
|---|---|---|---|
| A66E | E1 | POP | HL |
| A66F | C1 | POP | BC |
| A670 | 7D | LD | A,L |
| A671 | 02 | LD | (BC),A |
| A672 | 21F6FF | LD | HL,FFF6 |
| A675 | 19 | ADD | HL,DE |
| A676 | E5 | PUSH | HL |
| A677 | 21F4FF | LD | HL,FFF4 |
| A67A | 19 | ADD | HL,DE |
| A67B | 7E | LD | A,(HL) |
| A67C | 23 | INC | HL |
| A67D | 66 | LD | H,(HL) |
| A67E | 6F | LD | L,A |
| A67F | 7E | LD | A,(HL) |
| A680 | 4F | LD | C,A |
| A681 | 97 | SUB | A |
| A682 | 47 | LD | B,A |
| A683 | 79 | LD | A,C |
| A684 | E60F | AND | 0F |
| A686 | 4F | LD | C,A |
| A687 | 78 | LD | A,B |
| A688 | E600 | AND | 00 |

| LOC | INST | MNEM | OPER |
|---|---|---|---|
| A6CB | C3D1A6 | JP | A6D1 |
| A6CE | C395DE | JP | DE95 |
| A6D1 | 21F9FF | LD | HL,FFF9 |
| A6D4 | 19 | ADD | HL,DE |
| A6D5 | 34 | INC | (HL) |
| A6D6 | 21F4FF | LD | HL,FFF4 |
| A6D9 | 19 | ADD | HL,DE |
| A6DA | 7E | LD | A,(HL) |
| A6DB | C601 | ADD | A,01 |
| A6DD | 77 | LD | (HL),A |
| A6DE | 23 | INC | HL |

| LOC | INST | MNEM | OPER |
|---|---|---|---|
| A68A | 47 | LD | B,A |
| A68B | E1 | POP | HL |
| A68C | 79 | LD | A,C |
| A68D | 77 | LD | (HL),A |
| A68E | 21F7FF | LD | HL,FFF7 |
| A691 | 19 | ADD | HL,DE |
| A692 | E5 | PUSH | HL |
| A693 | 21F8FF | LD | HL,FFF8 |
| A696 | 19 | ADD | HL,DE |
| A697 | C1 | POP | BC |
| A698 | 0A | LD | A,(BC) |
| A699 | BE | CP | (HL) |
| A69A | FAD1A6 | JP | M,A6D1 |
| A69D | 21F6FF | LD | HL,FFF6 |
| A6A0 | 19 | ADD | HL,DE |
| A6A1 | 7E | LD | A,(HL) |
| A6A2 | FE0F | CP | 0F |
| A6A4 | CAD1A6 | JP | Z,A6D1 |
| A6A7 | 21F8FF | LD | HL,FFF8 |
| A6AA | 19 | ADD | HL,DE |
| A6AB | 7E | LD | A,(HL) |
| A6AC | 4F | LD | C,A |

| LOC | INST | MNEM | OPER |
|---|---|---|---|
| A6AD | 87 | ADD | A,A |
| A6AE | 9F | SBC | A,A |
| A6AF | 47 | LD | B,A |
| A6B0 | 21B5F8 | LD | HL,F8B5 |
| A6B3 | 09 | ADD | HL,BC |
| A6B4 | E5 | PUSH | HL |
| A6B5 | 210122 | LD | HL,2201 |
| A6B8 | E5 | PUSH | HL |
| A6B9 | 21F6FF | LD | HL,FFF6 |
| A6BC | 19 | ADD | HL,DE |
| A6BD | 7E | LD | A,(HL) |
| A6BE | 4F | LD | C,A |
| A6BF | 87 | ADD | A,A |
| A6C0 | 9F | SBC | A,A |
| A6C1 | 47 | LD | B,A |
| A6C2 | C5 | PUSH | BC |
| A6C3 | CD5FDE | CALL | DE5F |
| A6C6 | E1 | POP | HL |
| A6C7 | C1 | POP | BC |
| A6C8 | 0A | LD | A,(BC) |
| A6C9 | B5 | OR | L |
| A6CA | 02 | LD | (BC),A |

```
A6DF  7E        LD    A,(HL)
A6E0  CE00      ADC   A,00
A6E2  77        LD    (HL),A
A6E3  C34BA6    JP    A64B

LOC   INST      MNEM  OPER         SP   RF  RA  RB  RC  RD  RE  RH  RL  IX   IY
78CC  7E        LD    A,(HL)       FFC2 A8  10  FF  CB  FF  C9  FF  CD  C9A3 0000
78CC  BREAK

LOC   INST      MNEM  OPER                LOC   INST      MNEM  OPER
A638  CD53DE    CALL  DE53                A678  19        ADD   HL,DE
A63B  21F6FF    LD    HL,FFF6             A679  3600      LD    (HL),00
A63E  39        ADD   HL,SP               A67B  21F9FF    LD    HL,FFF9
A63F  F9        LD    SP,HL               A67E  19        ADD   HL,DE
A640  21F8FF    LD    HL,FFF8             A67F  3E03      LD    A,03
A643  19        ADD   HL,DE               A681  BE        CP    (HL)
A644  E5        PUSH  HL                  A682  FA9CA6    JP    M,A69C
A645  3A91F9    LD    A,(F991)            A685  21F9FF    LD    HL,FFF9
A648  4F        LD    C,A                 A688  19        ADD   HL,DE
A649  87        ADD   A,A                 A689  7E        LD    A,(HL)
A64A  9F        SBC   A,A                 A68A  4F        LD    C,A
A64B  47        LD    B,A                 A68B  87        ADD   A,A
A64C  69        LD    L,C                 A68C  9F        SBC   A,A
A64D  60        LD    H,B                 A68D  47        LD    B,A
A64E  3A92F9    LD    A,(F992)            A68E  21B5F8    LD    HL,F8B5
A651  4F        LD    C,A                 A691  09        ADD   HL,BC
A652  87        ADD   A,A                 A692  3600      LD    (HL),00
A653  9F        SBC   A,A                 A694  21F9FF    LD    HL,FFF9
A654  47        LD    B,A                 A697  19        ADD   HL,DE
A655  09        ADD   HL,BC               A698  34        INC   (HL)
A656  3A93F9    LD    A,(F993)            A699  C37BA6    JP    A67B
A659  4F        LD    C,A                 A69C  21F9FF    LD    HL,FFF9

LOC   INST      MNEM  OPER                LOC   INST      MNEM  OPER
A65A  87        ADD   A,A                 A69F  19        ADD   HL,DE
A65B  9F        SBC   A,A                 A6A0  3600      LD    (HL),00
A65C  47        LD    B,A                 A6A2  21F9FF    LD    HL,FFF9
A65D  09        ADD   HL,BC               A6A5  19        ADD   HL,DE
A65E  3A94F9    LD    A,(F994)            A6A6  E5        PUSH  HL
A661  4F        LD    C,A                 A6A7  21F8FF    LD    HL,FFF8
A662  87        ADD   A,A                 A6AA  19        ADD   HL,DE
A663  9F        SBC   A,A                 A6AB  C1        POP   BC
A664  47        LD    B,A                 A6AC  0A        LD    A,(BC)
A665  09        ADD   HL,BC               A6AD  BE        CP    (HL)
A666  C1        POP   BC                  A6AE  F201A7    JP    P,A701
A667  7D        LD    A,L                 A6B1  21F6FF    LD    HL,FFF6
A668  02        LD    (BC),A              A6B4  19        ADD   HL,DE
A669  21F6FF    LD    HL,FFF6             A6B5  7E        LD    A,(HL)
A66C  19        ADD   HL,DE               A6B6  23        INC   HL
A66D  0126F9    LD    BC,F926             A6B7  66        LD    H,(HL)
A670  79        LD    A,C                 A6B8  6F        LD    L,A
A671  77        LD    (HL),A              A6B9  7E        LD    A,(HL)
A672  78        LD    A,B                 A6BA  4F        LD    C,A
A673  23        INC   HL                  A6BB  97        SUB   A
A674  77        LD    (HL),A              A6BC  47        LD    B,A
A675  21F9FF    LD    HL,FFF9             A6BD  C5        PUSH  BC

LOC   INST      MNEM  OPER
A6BE  210400    LD    HL,0004
A6C1  E5        PUSH  HL                  LOC   INST      MNEM  OPER
A6C2  CD68DE    CALL  DE68                9F42  CD53DE    CALL  DE53
```

```
A6C5 E1        POP   HL
A6C6 01B5F8    LD    BC,F8B5
A6C9 09        ADD   HL,BC
A6CA E5        PUSH  HL
A6CB 210100    LD    HL,0001
A6CE E5        PUSH  HL
A6CF 21F6FF    LD    HL,FFF6
A6D2 19        ADD   HL,DE
A6D3 7E        LD    A,(HL)
A6D4 23        INC   HL
A6D5 66        LD    H,(HL)
A6D6 6F        LD    L,A
A6D7 7E        LD    A,(HL)
A6D8 4F        LD    C,A
A6D9 97        SUB   A
A6DA 47        LD    B,A
A6DB 79        LD    A,C
A6DC E60F      AND   0F
A6DE 4F        LD    C,A

LOC  INST     MNEM  OPER
A6DF 78        LD    A,B
A6E0 E600      AND   00
A6E2 47        LD    B,A
A6E3 C5        PUSH  BC
A6E4 CD5FDE    CALL  DE5F
A6E7 E1        POP   HL
A6E8 C1        POP   BC
A6E9 0A        LD    A,(BC)
A6EA B5        OR    L
A6EB 02        LD    (BC),A
A6EC 21F9FF    LD    HL,FFF9
A6EF 19        ADD   HL,DE
A6F0 34        INC   (HL)
A6F1 21F6FF    LD    HL,FFF6
A6F4 19        ADD   HL,DE
A6F5 7E        LD    A,(HL)
A6F6 C601      ADD   A,01
A6F8 77        LD    (HL),A
A6F9 23        INC   HL
A6FA 7E        LD    A,(HL)
A6FB CE00      ADC   A,00
A6FD 77        LD    (HL),A

LOC  INST     MNEM  OPER
A6FE C3A2A6    JP    A6A2
A701 C395DE    JP    DE95

LOC  INST     MNEM  OPER
9F87 19        ADD   HL,DE
9F88 C1        POP   BC
9F89 7E        LD    A,(HL)
9F8A 02        LD    (BC),A
9F8B 23        INC   HL
9F8C 7E        LD    A,(HL)
9F8D 03        INC   BC
9F8E 02        LD    (BC),A
9F8F 21F3FF    LD    HL,FFF3
9F92 19        ADD   HL,DE
9F93 3E03      LD    A,03

9F45 21F3FF    LD    HL,FFF3
9F48 39        ADD   HL,SP
9F49 F9        LD    SP,HL
9F4A 21F6FF    LD    HL,FFF6
9F4D 19        ADD   HL,DE
9F4E E5        PUSH  HL
9F4F CD58DF    CALL  DF58
9F52 E1        POP   HL
9F53 79        LD    A,C
9F54 77        LD    (HL),A
9F55 78        LD    A,B
9F56 23        INC   HL
9F57 77        LD    (HL),A
9F58 21F8FF    LD    HL,FFF8
9F5B 19        ADD   HL,DE
9F5C E5        PUSH  HL
9F5D CD5BDF    CALL  DF5B
9F60 E1        POP   HL
9F61 79        LD    A,C
9F62 77        LD    (HL),A
9F63 78        LD    A,B

LOC  INST     MNEM  OPER
9F64 23        INC   HL
9F65 77        LD    (HL),A
9F66 21F6FF    LD    HL,FFF6
9F69 19        ADD   HL,DE
9F6A E5        PUSH  HL
9F6B 21F8FF    LD    HL,FFF8
9F6E 19        ADD   HL,DE
9F6F C1        POP   BC
9F70 0A        LD    A,(BC)
9F71 96        SUB   (HL)
9F72 03        INC   BC
9F73 0A        LD    A,(BC)
9F74 23        INC   HL
9F75 9E        SBC   A,(HL)
9F76 FA22A2    JP    M,A222
9F79 21F3FF    LD    HL,FFF3
9F7C 19        ADD   HL,DE
9F7D 3600      LD    (HL),00
9F7F 21F4FF    LD    HL,FFF4
9F82 19        ADD   HL,DE
9F83 E5        PUSH  HL
9F84 21F8FF    LD    HL,FFF8

LOC  INST     MNEM  OPER
9FC0 E1        POP   HL
9FC1 7D        LD    A,L
9FC2 A9        XOR   C
9FC3 6F        LD    L,A
9FC4 7C        LD    A,H
9FC5 A8        XOR   B
9FC6 67        LD    H,A
9FC7 E5        PUSH  HL
9FC8 21F3FF    LD    HL,FFF3
9FCB 19        ADD   HL,DE
9FCC 7E        LD    A,(HL)
```

```
9F95  BE         CP    (HL)
9F96  FA03A0     JP    M,A003
9F99  2100F0     LD    HL,F000
9F9C  E5         PUSH  HL
9F9D  21F4FF     LD    HL,FFF4
9FA0  19         ADD   HL,DE
9FA1  7E         LD    A,(HL)
9FA2  23         INC   HL
9FA3  66         LD    H,(HL)
9FA4  6F         LD    L,A
9FA5  E3         EX    (SP),HL

LOC   INST       MNEM  OPER
9FA6  C1         POP   BC
9FA7  09         ADD   HL,BC
9FA8  7E         LD    A,(HL)
9FA9  4F         LD    C,A
9FAA  97         SUB   A
9FAB  47         LD    B,A
9FAC  C5         PUSH  BC
9FAD  2100F4     LD    HL,F400
9FB0  E5         PUSH  HL
9FB1  21F4FF     LD    HL,FFF4
9FB4  19         ADD   HL,DE
9FB5  7E         LD    A,(HL)
9FB6  23         INC   HL
9FB7  66         LD    H,(HL)
9FB8  6F         LD    L,A
9FB9  E3         EX    (SP),HL
9FBA  C1         POP   BC
9FBB  09         ADD   HL,BC
9FBC  7E         LD    A,(HL)
9FBD  4F         LD    C,A
9FBE  97         SUB   A
9FBF  47         LD    B,A

LOC   INST       MNEM  OPER
9FF9  23         INC   HL
9FFA  228DF8     LD    (F88D)
9FFD  C303A0     JP    A003
A000  C395DE     JP    DE95
A003  21F8FF     LD    HL,FFF
A006  19         ADD   HL,DE
A007  7E         LD    A,(HL)
A008  C601       ADD   A,01
A00A  77         LD    (HL),A
A00B  23         INC   HL
A00C  7E         LD    A,(HL)
A00D  CE00       ADC   A,00
A00F  77         LD    (HL),A
A010  C3669F     JP    9F66
A013  21F4FF     LD    HL,FFF
A016  19         ADD   HL,DE
A017  7E         LD    A,(HL)
A018  C600       ADD   A,00
A01A  77         LD    (HL),A
A01B  23         INC   HL
A01C  7E         LD    A,(HL)
A01D  CE01       ADC   A,01
```

```
9FCD  4F         LD    C,A
9FCE  87         ADD   A,A
9FCF  9F         SBC   A,A
9FD0  47         LD    B,A
9FD1  2185F8     LD    HL,F885
9FD4  09         ADD   HL,BC
9FD5  7E         LD    A,(HL)
9FD6  4F         LD    C,A
9FD7  97         SUB   A
9FD8  47         LD    B,A
9FD9  E1         POP   HL

LOC   INST       MNEM  OPER
9FDA  7D         LD    A,L
9FDB  A1         AND   C
9FDC  6F         LD    L,A
9FDD  7C         LD    A,H
9FDE  A0         AND   B
9FDF  67         LD    H,A
9FE0  7D         LD    A,L
9FE1  B4         OR    H
9FE2  CA13A0     JP    Z,A013
9FE5  2100EF     LD    HL,EF00
9FE8  E5         PUSH  HL
9FE9  21F8FF     LD    HL,FFF8
9FEC  19         ADD   HL,DE
9FED  7E         LD    A,(HL)
9FEE  23         INC   HL
9FEF  66         LD    H,(HL)
9FF0  6F         LD    L,A
9FF1  E3         EX    (SP),HL
9FF2  C1         POP   BC
9FF3  09         ADD   HL,BC
9FF4  3601       LD    (HL),01
9FF6  2A8DF8     LD    HL,(F88D)

LOC   INST       MNEM  OPER
55A1  CD53DE     CALL  DE53
55A4  21A3F8     LD    HL,F8A3
55A7  3A9FF9     LD    A,(F99F)
55AA  96         SUB   (HL)
55AB  3AA0F9     LD    A,(F9A0)
55AE  23         INC   HL
55AF  9E         SBC   A,(HL)
55B0  F2CA55     JP    P,55CA
55B3  21A7F8     LD    HL,F8A7
55B6  3A9FF9     LD    A,(F99F)
55B9  96         SUB   (HL)
55BA  3AA0F9     LD    A,(F9A0)
55BD  23         INC   HL
55BE  9E         SBC   A,(HL)
55BF  F2E155     JP    P,55E1
55C2  2A9FF9     LD    HL,(F99F)
55C5  4D         LD    C,L
55C6  44         LD    B,H
55C7  C395DE     JP    DE95
55CA  21A7F8     LD    HL,F8A7
55CD  3AA3F8     LD    A,(F8A3)
55D0  96         SUB   (HL)
```

| LOC | INST | MNEM | OPER |
|---|---|---|---|
| A01F | 77 | LD | (HL),A |
| A020 | 21F3FF | LD | HL,FFF |
| A023 | 19 | ADD | HL,DE |
| A024 | 34 | INC | (HL) |
| A025 | C38F9F | JP | 9F8F |

| LOC | INST | MNEM | OPER |
|---|---|---|---|
| 55D1 | 3AA4F8 | LD | A,(F8A4) |
| 55D4 | 23 | INC | HL |
| 55D5 | 9E | SBC | A,(HL) |
| 55D6 | F2E955 | JP | P,55E9 |
| 55D9 | 2AA3F8 | LD | HL,(F8A3) |
| 55DC | 4D | LD | C,L |
| 55DD | 44 | LD | B,H |
| 55DE | C395DE | JP | DE95 |
| 55E1 | 2AA7F8 | LD | HL,(F8A7) |
| 55E4 | 4D | LD | C,L |
| 55E5 | 44 | LD | B,H |
| 55E6 | C395DE | JP | DE95 |
| 55E9 | 2AA7F8 | LD | HL,(F8A7) |
| 55EC | 4D | LD | C,L |
| 55ED | 44 | LD | B,H |
| 55EE | C395DE | JP | DE95 |
| 55F1 | CD53DE | CALL | DE53 |
| 55F4 | 219DF9 | LD | HL,F99D |
| 55F7 | 3AA1F8 | LD | A,(F8A1) |
| 55FA | 96 | SUB | (HL) |
| 55FB | 3AA2F8 | LD | A,(F8A2) |
| 55FE | 23 | INC | HL |

| LOC | INST | MNEM | OPER |
|---|---|---|---|
| 55FF | 9E | SBC | A,(HL) |
| 5600 | F21A56 | JP | P,561A |
| 5603 | 219DF9 | LD | HL,F99D |
| 5606 | 3AA5F8 | LD | A,(F8A5) |
| 5609 | 96 | SUB | (HL) |
| 560A | 3AA6F8 | LD | A,(F8A6) |
| 560D | 23 | INC | HL |
| 560E | 9E | SBC | A,(HL) |
| 560F | F23156 | JP | P,5631 |
| 5612 | 2A9DF9 | LD | HL,(F99D) |
| 5615 | 4D | LD | C,L |
| 5616 | 44 | LD | B,H |
| 5617 | C395DE | JP | DE95 |
| 561A | 21A1F8 | LD | HL,F8A1 |
| 561D | 3AA5F8 | LD | A,(F8A5) |
| 5620 | 96 | SUB | (HL) |
| 5621 | 3AA6F8 | LD | A,(F8A6) |
| 5624 | 23 | INC | HL |
| 5625 | 9E | SBC | A,(HL) |
| 5626 | F23956 | JP | P,5639 |
| 5629 | 2AA1F8 | LD | HL,(F8A1) |
| 562C | 4D | LD | C,L |

| LOC | INST | MNEM | OPER |
|---|---|---|---|
| 562D | 44 | LD | B,H |
| 562E | C395DE | JP | DE95 |
| 5631 | 2AA5F8 | LD | HL,(F8A5) |
| 5634 | 4D | LD | C,L |
| 5635 | 44 | LD | B,H |
| 5636 | C395DE | JP | DE95 |
| 5639 | 2AA5F8 | LD | HL,(F8A5) |
| 563C | 4D | LD | C,L |
| 563D | 44 | LD | B,H |
| 563E | C395DE | JP | DE95 |

| LOC | INST | MNEM | OPER |
|---|---|---|---|
| BEDE | CD53DE | CALL | DE53 |
| BEE1 | 21F4FF | LD | HL,FFF4 |
| BEE4 | 39 | ADD | HL,SP |
| BEE5 | F9 | LD | SP,HL |
| BEE6 | 21F4FF | LD | HL,FFF4 |
| BEE9 | 19 | ADD | HL,DE |
| BEEA | E5 | PUSH | HL |
| BEEB | 3A21FA | LD | A,(FA21) |
| BEEE | 4F | LD | C,A |
| BEEF | 97 | SUB | A |
| BEF0 | 47 | LD | B,A |
| BEF1 | 2111FA | LD | HL,FA11 |
| BEF4 | 79 | LD | A,C |
| BEF5 | 96 | SUB | (HL) |
| BEF6 | 4F | LD | C,A |
| BEF7 | 78 | LD | A,B |
| BEF8 | 23 | INC | HL |
| BEF9 | 9E | SBC | A,(HL) |
| BEFA | 47 | LD | B,A |
| BEFB | E1 | POP | HL |
| BEFC | 79 | LD | A,C |
| BEFD | 77 | LD | (HL),A |

| LOC | INST | MNEM | OPER |
|---|---|---|---|
| BEFE | 21F5FF | LD | HL,FFF5 |
| BF01 | 19 | ADD | HL,DE |
| BF02 | E5 | PUSH | HL |
| BF03 | 3A7FF8 | LD | A,(F87F) |
| BF06 | B7 | OR | A |
| BF07 | C212BF | JP | NZ,BF12 |
| BF0A | 2ADBF9 | LD | HL,(F9DB) |
| BF0D | 4D | LD | C,L |
| BF0E | 44 | LD | B,H |
| BF0F | C31DBF | JP | BF1D |
| BF12 | 2ADBF9 | LD | HL,(F9DB) |

| LOC | INST | MNEM | OPER |
|---|---|---|---|
| BF15 | 4D | LD | C,L |
| BF16 | 44 | LD | B,H |
| BF17 | 79 | LD | A,C |
| BF18 | 2F | CPL | |
| BF19 | 4F | LD | C,A |
| BF1A | 78 | LD | A,B |
| BF1B | 2F | CPL | |
| BF1C | 47 | LD | B,A |
| BF1D | E1 | POP | HL |
| BF1E | 79 | LD | A,C |
| BF1F | 77 | LD | (HL),A |

| LOC | INST | MNEM | OPER |
|---|---|---|---|
| BF20 | 21F8FF | LD | HL,FFF8 |
| BF23 | 19 | ADD | HL,DE |
| BF24 | 3AA9F8 | LD | A,(F8A9) |
| BF27 | 77 | LD | (HL),A |
| BF28 | 3AAAF8 | LD | A,(F8AA) |
| BF2B | 23 | INC | HL |
| BF2C | 77 | LD | (HL),A |
| BF2D | 21F8FF | LD | HL,FFF8 |
| BF30 | 19 | ADD | HL,DE |
| BF31 | 3AABF8 | LD | A,(F8AB) |
| BF34 | 96 | SUB | (HL) |
| BF35 | 3AACF8 | LD | A,(F8AC) |
| BF38 | 23 | INC | HL |
| BF39 | 9E | SBC | A,(HL) |
| BF3A | FAB2BF | JP | M,BFB2 |
| BF3D | 21F6FF | LD | HL,FFF6 |
| BF40 | 19 | ADD | HL,DE |
| BF41 | E5 | PUSH | HL |
| BF42 | 2A86F8 | LD | HL,(F886) |
| BF45 | E5 | PUSH | HL |
| BF46 | 21F8FF | LD | HL,FFF8 |
| BF49 | 19 | ADD | HL,DE |

| LOC | INST | MNEM | OPER |
|---|---|---|---|
| BF4A | 7E | LD | A,(HL) |
| BF4B | 23 | INC | HL |
| BF4C | 66 | LD | H,(HL) |
| BF4D | 6F | LD | L,A |
| BF4E | E3 | EX | (SP),HL |
| BF4F | C1 | POP | BC |
| BF50 | 09 | ADD | HL,BC |
| BF51 | C1 | POP | BC |
| BF52 | 7D | LD | A,L |
| BF53 | 02 | LD | (BC),A |
| BF54 | 7C | LD | A,H |
| BF55 | 03 | INC | BC |
| BF56 | 02 | LD | (BC),A |
| BF57 | 21F5FF | LD | HL,FFF5 |
| BF5A | 19 | ADD | HL,DE |
| BF5B | 7E | LD | A,(HL) |
| BF5C | 4F | LD | C,A |
| BF5D | 97 | SUB | A |
| BF5E | 47 | LD | B,A |
| BF5F | C5 | PUSH | BC |
| BF60 | 21F4FF | LD | HL,FFF4 |
| BF63 | 19 | ADD | HL,DE |

| LOC | INST | MNEM | OPER |
|---|---|---|---|
| BF64 | 7E | LD | A,(HL) |
| BF65 | 4F | LD | C,A |
| BF66 | 97 | SUB | A |
| BF67 | 47 | LD | B,A |
| BF68 | E1 | POP | HL |
| BF69 | 7D | LD | A,L |
| BF6A | A1 | AND | C |
| BF6B | 6F | LD | L,A |
| BF6C | 7C | LD | A,H |
| BF6D | A0 | AND | B |
| BF6E | 67 | LD | H,A |
| BF6F | E5 | PUSH | HL |
| BF70 | 21F6FF | LD | HL,FFF6 |
| BF73 | 19 | ADD | HL,DE |
| BF74 | 7E | LD | A,(HL) |
| BF75 | 23 | INC | HL |
| BF76 | 66 | LD | H,(HL) |
| BF77 | 6F | LD | L,A |
| BF78 | 7E | LD | A,(HL) |
| BF79 | 4F | LD | C,A |
| BF7A | 97 | SUB | A |
| BF7B | 47 | LD | B,A |

| LOC | INST | MNEM | OPER |
|---|---|---|---|
| BF7C | C5 | PUSH | BC |
| BF7D | 21F4FF | LD | HL,FFF4 |
| BF80 | 19 | ADD | HL,DE |
| BF81 | 7E | LD | A,(HL) |
| BF82 | 4F | LD | C,A |
| BF83 | 97 | SUB | A |
| BF84 | 47 | LD | B,A |
| BF85 | E1 | POP | HL |
| BF86 | 7D | LD | A,L |
| BF87 | A1 | AND | C |
| BF88 | 6F | LD | L,A |
| BF89 | 7C | LD | A,H |
| BF8A | A0 | AND | B |
| BF8B | 67 | LD | H,A |
| BF8C | C1 | POP | BC |
| BF8D | 79 | LD | A,C |
| BF8E | BD | CP | L |
| BF8F | C294BF | JP | NZ,BF94 |
| BF92 | 78 | LD | A,B |
| BF93 | BC | CP | H |
| BF94 | C2B5BF | JP | NZ,BFB5 |
| BF97 | 2A8DF8 | LD | HL,(F88D) |

| LOC | INST | MNEM | OPER |
|---|---|---|---|
| BF9A | 23 | INC | HL |
| BF9B | 228DF8 | LD | (F88D),HL |
| BF9E | 2100EF | LD | HL,EF00 |
| BFA1 | E5 | PUSH | HL |
| BFA2 | 21F8FF | LD | HL,FFF8 |
| BFA5 | 19 | ADD | HL,DE |
| BFA6 | 7E | LD | A,(HL) |
| BFA7 | 23 | INC | HL |
| BFA8 | 66 | LD | H,(HL) |
| BFA9 | 6F | LD | L,A |
| BFAA | E3 | EX | (SP),HL |
| BFAB | C1 | POP | BC |
| BFAC | 09 | ADD | HL,BC |
| BFAD | 3601 | LD | (HL),01 |
| BFAF | C3B5BF | JP | BFB5 |
| BFB2 | C395DE | JP | DE95 |
| BFB5 | 21F8FF | LD | HL,FFF8 |
| BFB8 | 19 | ADD | HL,DE |
| BFB9 | 7E | LD | A,(HL) |
| BFBA | C601 | ADD | A,01 |
| BFBC | 77 | LD | (HL),A |
| BFBD | 23 | INC | HL |

| LOC | INST | MNEM | OPER |
|---|---|---|---|
| BFBE | 7E | LD | A,(HL) |
| BFBF | CE00 | ADC | A,00 |
| BFC1 | 77 | LD | (HL),A |
| BFC2 | C32DBF | JP | BF2D |

| LOC | INST | MNEM | OPER |
|---|---|---|---|
| 9C87 | CD53DE | CALL | DE53 |
| 9C8A | 21F5FF | LD | HL,FFF5 |
| 9C8D | 39 | ADD | HL,SP |
| 9C8E | F9 | LD | SP,HL |
| 9C8F | 21F5FF | LD | HL,FFF5 |
| 9C92 | 19 | ADD | HL,DE |
| 9C93 | E5 | PUSH | HL |
| 9C94 | 3A20FA | LD | A,(FA20) |
| 9C97 | B7 | OR | A |
| 9C98 | C2A19C | JP | NZ,9CA1 |
| 9C9B | 017200 | LD | BC,0072 |
| 9C9E | C3A49C | JP | 9CA4 |
| 9CA1 | 013200 | LD | BC,0032 |
| 9CA4 | E1 | POP | HL |
| 9CA5 | 79 | LD | A,C |
| 9CA6 | 77 | LD | (HL),A |
| 9CA7 | 21F8FF | LD | HL,FFF8 |
| 9CAA | 19 | ADD | HL,DE |
| 9CAB | 3AA9F8 | LD | A,(F8A9) |
| 9CAE | 77 | LD | (HL),A |
| 9CAF | 3AAAF8 | LD | A,(F8AA) |
| 9CB2 | 23 | INC | HL |

| LOC | INST | MNEM | OPER |
|---|---|---|---|
| 9CB3 | 77 | LD | (HL),A |
| 9CB4 | 21F8FF | LD | HL,FFF8 |
| 9CB7 | 19 | ADD | HL,DE |
| 9CB8 | 3AABF8 | LD | A,(F8AB) |
| 9CBB | 96 | SUB | (HL) |
| 9CBC | 3AACF8 | LD | A,(F8AC) |
| 9CBF | 23 | INC | HL |
| 9CC0 | 9E | SBC | A,(HL) |
| 9CC1 | FA1E9D | JP | M,9D1E |
| 9CC4 | 21F6FF | LD | HL,FFF6 |
| 9CC7 | 19 | ADD | HL,DE |
| 9CC8 | E5 | PUSH | HL |
| 9CC9 | 2A86F8 | LD | HL,(F886) |
| 9CCC | E5 | PUSH | HL |
| 9CCD | 21F8FF | LD | HL,FFF8 |
| 9CD0 | 19 | ADD | HL,DE |
| 9CD1 | 7E | LD | A,(HL) |
| 9CD2 | 23 | INC | HL |
| 9CD3 | 66 | LD | H,(HL) |
| 9CD4 | 6F | LD | L,A |
| 9CD5 | E3 | EX | (SP),HL |
| 9CD6 | C1 | POP | BC |

| LOC | INST | MNEM | OPER |
|---|---|---|---|
| 9CD7 | 09 | ADD | HL,BC |
| 9CD8 | 010001 | LD | BC,0100 |
| 9CDB | 09 | ADD | HL,BC |
| 9CDC | C1 | POP | BC |
| 9CDD | 7D | LD | A,L |
| 9CDE | 02 | LD | (BC),A |
| 9CDF | 7C | LD | A,H |
| 9CE0 | 03 | INC | BC |
| 9CE1 | 02 | LD | (BC),A |
| 9CE2 | 21F6FF | LD | HL,FFF6 |
| 9CE5 | 19 | ADD | HL,DE |

| LOC | INST | MNEM | OPER |
|---|---|---|---|
| 9D13 | 23 | INC | HL |
| 9D14 | 66 | LD | H,(HL) |
| 9D15 | 6F | LD | L,A |
| 9D16 | E3 | EX | (SP),HL |
| 9D17 | C1 | POP | BC |
| 9D18 | 09 | ADD | HL,BC |
| 9D19 | 3601 | LD | (HL),01 |
| 9D1B | C3219D | JP | 9D21 |
| 9D1E | C395DE | JP | DE95 |
| 9D21 | 21F8FF | LD | HL,FFF8 |
| 9D24 | 19 | ADD | HL,DE |

| LOC | INST | MNEM | OPER |
|---|---|---|---|
| 9CE6 | 7E | LD | A,(HL) |
| 9CE7 | 23 | INC | HL |
| 9CE8 | 66 | LD | H,(HL) |
| 9CE9 | 6F | LD | L,A |
| 9CEA | 7E | LD | A,(HL) |
| 9CEB | 4F | LD | C,A |
| 9CEC | 97 | SUB | A |
| 9CED | 47 | LD | B,A |
| 9CEE | C5 | PUSH | BC |
| 9CEF | 21F5FF | LD | HL,FFF5 |
| 9CF2 | 19 | ADD | HL,DE |

| LOC | INST | MNEM | OPER |
|---|---|---|---|
| 9CF3 | 7E | LD | A,(HL) |
| 9CF4 | 4F | LD | C,A |
| 9CF5 | 97 | SUB | A |
| 9CF6 | 47 | LD | B,A |
| 9CF7 | E1 | POP | HL |
| 9CF8 | 7D | LD | A,L |
| 9CF9 | A1 | AND | C |
| 9CFA | 6F | LD | L,A |
| 9CFB | 7C | LD | A,H |
| 9CFC | A0 | AND | B |
| 9CFD | 67 | LD | H,A |
| 9CFE | 7D | LD | A,L |
| 9CFF | B4 | OR | H |
| 9D00 | CA219D | JP | Z,9D21 |
| 9D03 | 2A8DF8 | LD | HL,(F88D) |
| 9D06 | 23 | INC | HL |
| 9D07 | 228DF8 | LD | (F88D),HL |
| 9D0A | 2100EF | LD | HL,EF00 |
| 9D0D | E5 | PUSH | HL |
| 9D0E | 21F8FF | LD | HL,FFF8 |
| 9D11 | 19 | ADD | HL,DE |
| 9D12 | 7E | LD | A,(HL) |

| LOC | INST | MNEM | OPER |
|---|---|---|---|
| 850A | 23 | INC | HL |
| 850B | 77 | LD | (HL),A |
| 850C | 21F8FF | LD | HL,FFF8 |
| 850F | 19 | ADD | HL,DE |
| 8510 | E5 | PUSH | HL |
| 8511 | 21F6FF | LD | HL,FFF6 |
| 8514 | 19 | ADD | HL,DE |
| 8515 | C1 | POP | BC |
| 8516 | 0A | LD | A,(BC) |
| 8517 | 96 | SUB | (HL) |
| 8518 | 03 | INC | BC |
| 8519 | 0A | LD | A,(BC) |
| 851A | 23 | INC | HL |
| 851B | 9E | SBC | A,(HL) |
| 851C | FA7985 | JP | M,8579 |
| 851F | 2100F0 | LD | HL,F000 |
| 8522 | E5 | PUSH | HL |
| 8523 | 21F6FF | LD | HL,FFF6 |
| 8526 | 19 | ADD | HL,DE |
| 8527 | 7E | LD | A,(HL) |
| 8528 | 23 | INC | HL |
| 8529 | 66 | LD | H,(HL) |

| LOC | INST | MNEM | OPER |
|---|---|---|---|
| 9D25 | 7E | LD | A,(HL) |
| 9D26 | C601 | ADD | A,01 |
| 9D28 | 77 | LD | (HL),A |
| 9D29 | 23 | INC | HL |
| 9D2A | 7E | LD | A,(HL) |
| 9D2B | CE00 | ADC | A,00 |
| 9D2D | 77 | LD | (HL),A |
| 9D2E | C3B49C | JP | 9CB4 |

| LOC | INST | MNEM | OPER |
|---|---|---|---|
| 84E8 | CD53DE | CALL | DE53 |
| 84EB | 21F6FF | LD | HL,FFF6 |
| 84EE | 39 | ADD | HL,SP |
| 84EF | F9 | LD | SP,HL |
| 84F0 | 21F8FF | LD | HL,FFF8 |
| 84F3 | 19 | ADD | HL,DE |
| 84F4 | E5 | PUSH | HL |
| 84F5 | CD58DF | CALL | DF58 |
| 84F8 | E1 | POP | HL |
| 84F9 | 79 | LD | A,C |
| 84FA | 77 | LD | (HL),A |
| 84FB | 78 | LD | A,B |
| 84FC | 23 | INC | HL |
| 84FD | 77 | LD | (HL),A |
| 84FE | 21F6FF | LD | HL,FFF6 |
| 8501 | 19 | ADD | HL,DE |
| 8502 | E5 | PUSH | HL |
| 8503 | CD5BDF | CALL | DF5B |
| 8506 | E1 | POP | HL |
| 8507 | 79 | LD | A,C |
| 8508 | 77 | LD | (HL),A |
| 8509 | 78 | LD | A,B |

| LOC | INST | MNEM | OPER |
|---|---|---|---|
| 8544 | 97 | SUB | A |
| 8545 | 47 | LD | B,A |
| 8546 | E1 | POP | HL |
| 8547 | 7D | LD | A,L |
| 8548 | A9 | XOR | C |
| 8549 | 6F | LD | L,A |
| 854A | 7C | LD | A,H |
| 854B | A8 | XOR | B |
| 854C | 67 | LD | H,A |
| 854D | 3A21FA | LD | A,(FA21) |
| 8550 | 4F | LD | C,A |
| 8551 | 97 | SUB | A |
| 8552 | 47 | LD | B,A |
| 8553 | 7D | LD | A,L |
| 8554 | A1 | AND | C |
| 8555 | 6F | LD | L,A |
| 8556 | 7C | LD | A,H |
| 8557 | A0 | AND | B |
| 8558 | 67 | LD | H,A |
| 8559 | 7D | LD | A,L |
| 855A | B4 | OR | H |
| 855B | CA7C85 | JP | Z,857C |

| LOC | INST | MNEM | OPER |
|---|---|---|---|
| 852A | 6F | LD | L,A |
| 852B | E3 | EX | (SP),HL |
| 852C | C1 | POP | BC |
| 852D | 09 | ADD | HL,BC |
| 852E | 7E | LD | A,(HL) |
| 852F | 4F | LD | C,A |
| 8530 | 97 | SUB | A |
| 8531 | 47 | LD | B,A |
| 8532 | C5 | PUSH | BC |
| 8533 | 2100F4 | LD | HL,F400 |
| 8536 | E5 | PUSH | HL |
| 8537 | 21F6FF | LD | HL,FFF6 |
| 853A | 19 | ADD | HL,DE |
| 853B | 7E | LD | A,(HL) |
| 853C | 23 | INC | HL |
| 853D | 66 | LD | H,(HL) |
| 853E | 6F | LD | L,A |
| 853F | E3 | EX | (SP),HL |
| 8540 | C1 | POP | BC |
| 8541 | 09 | ADD | HL,BC |
| 8542 | 7E | LD | A,(HL) |
| 8543 | 4F | LD | C,A |

| LOC | INST | MNEM | OPER |
|---|---|---|---|
| 8584 | 23 | INC | HL |
| 8585 | 7E | LD | A,(HL) |
| 8586 | CE00 | ADC | A,00 |
| 8588 | 77 | LD | (HL),A |
| 8589 | C30C85 | JP | 850C |

| LOC | INST | MNEM | OPER |
|---|---|---|---|
| 78BA | FAC878 | JP | M,78C8 |
| 78BA | BREAK | | |

| LOC | INST | MNEM | OPER |
|---|---|---|---|
| B4FA | CD53DE | CALL | DE53 |
| B4FD | 21EDFF | LD | HL,FFED |
| B500 | 39 | ADD | HL,SP |
| B501 | F9 | LD | SP,HL |
| B502 | 210400 | LD | HL,0004 |
| B505 | 19 | ADD | HL,DE |
| B506 | 7E | LD | A,(HL) |
| B507 | FE48 | CP | 48 |
| B509 | C210B5 | JP | NZ,B510 |
| B50C | 23 | INC | HL |
| B50D | 7E | LD | A,(HL) |
| B50E | FE00 | CP | 00 |
| B510 | C249B5 | JP | NZ,B549 |
| B513 | 3A7BF8 | LD | A,(F87B) |
| B516 | FE02 | CP | 02 |
| B518 | C249B5 | JP | NZ,B549 |
| B51B | 3A00F8 | LD | A,(F800) |
| B51E | B7 | OR | A |
| B51F | C289B5 | JP | NZ,B589 |
| B522 | 21F4FF | LD | HL,FFF4 |
| B525 | 19 | ADD | HL,DE |
| B526 | 3E20 | LD | A,20 |

| LOC | INST | MNEM | OPER |
|---|---|---|---|
| B528 | 77 | LD | (HL),A |
| B529 | 87 | ADD | A,A |

| LOC | INST | MNEM | OPER |
|---|---|---|---|
| 855E | 2A8DF8 | LD | HL,(F88D) |
| 8561 | 23 | INC | HL |
| 8562 | 228DF8 | LD | (F88D),HL |
| 8565 | 2100EF | LD | HL,EF00 |
| 8568 | E5 | PUSH | HL |
| 8569 | 21F6FF | LD | HL,FFF6 |
| 856C | 19 | ADD | HL,DE |
| 856D | 7E | LD | A,(HL) |
| 856E | 23 | INC | HL |
| 856F | 66 | LD | H,(HL) |
| 8570 | 6F | LD | L,A |
| 8571 | E3 | EX | (SP),HL |
| 8572 | C1 | POP | BC |
| 8573 | 09 | ADD | HL,BC |
| 8574 | 3601 | LD | (HL),01 |
| 8576 | C37C85 | JP | 857C |
| 8579 | C395DE | JP | DE95 |
| 857C | 21F6FF | LD | HL,FFF6 |
| 857F | 19 | ADD | HL,DE |
| 8580 | 7E | LD | A,(HL) |
| 8581 | C601 | ADD | A,01 |
| 8583 | 77 | LD | (HL),A |

| SP | RF | RA | RB | RC | RD | RE | RH | RL | IX | IY |
|---|---|---|---|---|---|---|---|---|---|---|
| FFC2 | 93 | 01 | FF | CB | FF | C9 | FF | C2 | C9A3 | 0202 |

| LOC | INST | MNEM | OPER |
|---|---|---|---|
| B546 | C3C7B5 | JP | B5C7 |
| B549 | 21F8FF | LD | HL,FFF8 |
| B54C | 19 | ADD | HL,DE |
| B54D | 3E3F | LD | A,3F |
| B54F | 77 | LD | (HL),A |
| B550 | 3E01 | LD | A,01 |
| B552 | 23 | INC | HL |
| B553 | 77 | LD | (HL),A |
| B554 | 21F8FF | LD | HL,FFF8 |
| B557 | 19 | ADD | HL,DE |
| B558 | 3EBF | LD | A,BF |
| B55A | 96 | SUB | (HL) |
| B55B | 3E04 | LD | A,04 |
| B55D | 23 | INC | HL |
| B55E | 9E | SBC | A,(HL) |
| B55F | FA31B7 | JP | M,B731 |
| B562 | 2100E8 | LD | HL,E800 |
| B565 | E5 | PUSH | HL |
| B566 | 21F8FF | LD | HL,FFF8 |
| B569 | 19 | ADD | HL,DE |
| B56A | 7E | LD | A,(HL) |
| B56B | 23 | INC | HL |

| LOC | INST | MNEM | OPER |
|---|---|---|---|
| B56C | 66 | LD | H,(HL) |
| B56D | 6F | LD | L,A |

```
B52A 9F       SBC   A,A                B56E E3       EX    (SP),HL
B52B 23       INC   HL                 B56F C1       POP   BC
B52C 77       LD    (HL),A             B570 09       ADD   HL,BC
B52D 21F2FF   LD    HL,FFF2            B571 E5       PUSH  HL
B530 19       ADD   HL,DE              B572 210400   LD    HL,0004
B531 E5       PUSH  HL                 B575 19       ADD   HL,DE
B532 2A86F8   LD    HL,(F886)          B576 C1       POP   BC
B535 010002   LD    BC,0200            B577 7E       LD    A,(HL)
B538 09       ADD   HL,BC              B578 02       LD    (BC),A
B539 E5       PUSH  HL                 B579 21F8FF   LD    HL,FFF8
B53A 2A92F8   LD    HL,(F892)          B57C 19       ADD   HL,DE
B53D E3       EX    (SP),HL            B57D 7E       LD    A,(HL)
B53E C1       POP   BC                 B57E C680     ADD   A,80
B53F 09       ADD   HL,BC              B580 77       LD    (HL),A
B540 C1       POP   BC                 B581 23       INC   HL
B541 7D       LD    A,L                B582 7E       LD    A,(HL)
B542 02       LD    (BC),A             B583 CE00     ADC   A,00
B543 7C       LD    A,H                B585 77       LD    (HL),A
B544 03       INC   BC                 B586 C3548B   JP    B554
B545 02       LD    (BC),A             B589 21F4FF   LD    HL,FFF4

LOC   INST    MNEM  OPER               LOC   INST    MNEM  OPER
B58C 19       ADD   HL,DE              B5CE 3E01     LD    A,01
B58D 3E10     LD    A,10               B5D0 23       INC   HL
B58F 77       LD    (HL),A             B5D1 77       LD    (HL),A
B590 87       ADD   A,A                B5D2 21F0FF   LD    HL,FFF0
B591 9F       SBC   A,A                B5D5 19       ADD   HL,DE
B592 23       INC   HL                 B5D6 E5       PUSH  HL
B593 77       LD    (HL),A             B5D7 3A8AF8   LD    A,(F88A)
B594 21F2FF   LD    HL,FFF2            B5DA 4F       LD    C,A
B597 19       ADD   HL,DE              B5DB 87       ADD   A,A
B598 E5       PUSH  HL                 B5DC 9F       SBC   A,A
B599 3A88F8   LD    A,(F888)           B5DD 47       LD    B,A
B59C B7       OR    A                  B5DE 69       LD    L,C
B59D C2AFB5   JP    NZ,B5AF            B5DF 60       LD    H,B
B5A0 2100ED   LD    HL,ED00            B5E0 29       ADD   HL,HL
B5A3 E5       PUSH  HL                 B5E1 29       ADD   HL,HL
B5A4 2A92F8   LD    HL,(F892)          B5E2 29       ADD   HL,HL
B5A7 E3       EX    (SP),HL            B5E3 0163F9   LD    BC,F963
B5A8 C1       POP   BC                 B5E6 09       ADD   HL,BC
B5A9 09       ADD   HL,BC              B5E7 C1       POP   BC
B5AA 4D       LD    C,L                B5E8 7D       LD    A,L
B5AB 44       LD    B,H                B5E9 02       LD    (BC),A
B5AC C3C1B5   JP    B5C1               B5EA 7C       LD    A,H

LOC   INST    MNEM  OPER               LOC   INST    MNEM  OPER
B5AF 2100ED   LD    HL,ED00            B5EB 03       INC   BC
B5B2 E5       PUSH  HL                 B5EC 02       LD    (BC),A
B5B3 2A92F8   LD    HL,(F892)          B5ED 21EDFF   LD    HL,FFED
B5B6 E3       EX    (SP),HL            B5F0 19       ADD   HL,DE
B5B7 C1       POP   BC                 B5F1 3627     LD    (HL),27
B5B8 09       ADD   HL,BC              B5F3 21EDFF   LD    HL,FFED
B5B9 4D       LD    C,L                B5F6 19       ADD   HL,DE
B5BA 44       LD    B,H                B5F7 7E       LD    A,(HL)
B5BB 210001   LD    HL,0100            B5F8 B7       OR    A
B5BE 09       ADD   HL,BC              B5F9 FA31B7   JP    M,B731
B5BF 4D       LD    C,L                B5FC 21EFFF   LD    HL,FFEF
B5C0 44       LD    B,H                B5FF 19       ADD   HL,DE
B5C1 E1       POP   HL                 B600 E5       PUSH  HL
B5C2 79       LD    A,C                B601 21EDFF   LD    HL,FFED
```

| LOC | INST | MNEM | OPER |
|---|---|---|---|
| B5C3 | 77 | LD | (HL),A |
| B5C4 | 78 | LD | A,B |
| B5C5 | 23 | INC | HL |
| B5C6 | 77 | LD | (HL),A |
| B5C7 | 21F8FF | LD | HL,FFF8 |
| B5CA | 19 | ADD | HL,DE |
| B5CB | 3E3F | LD | A,3F |
| B5CD | 77 | LD | (HL),A |

| LOC | INST | MNEM | OPER |
|---|---|---|---|
| B60E | 7E | LD | A,(HL) |
| B60F | 23 | INC | HL |
| B610 | 66 | LD | H,(HL) |
| B611 | 6F | LD | L,A |
| B612 | 09 | ADD | HL,BC |
| B613 | C1 | POP | BC |
| B614 | 7E | LD | A,(HL) |
| B615 | 02 | LD | (BC),A |
| B616 | 21F6FF | LD | HL,FFF6 |
| B619 | 19 | ADD | HL,DE |
| B61A | E5 | PUSH | HL |
| B61B | 21EFFF | LD | HL,FFEF |
| B61E | 19 | ADD | HL,DE |
| B61F | 7E | LD | A,(HL) |
| B620 | 4F | LD | C,A |
| B621 | 97 | SUB | A |
| B622 | 47 | LD | B,A |
| B623 | 79 | LD | A,C |
| B624 | E6F0 | AND | F0 |
| B626 | 4F | LD | C,A |
| B627 | 78 | LD | A,B |
| B628 | E600 | AND | 00 |

| LOC | INST | MNEM | OPER |
|---|---|---|---|
| B62A | 47 | LD | B,A |
| B62B | E1 | POP | HL |
| B62C | 79 | LD | A,C |
| B62D | 77 | LD | (HL),A |
| B62E | 78 | LD | A,B |
| B62F | 23 | INC | HL |
| B630 | 77 | LD | (HL),A |
| B631 | 21EEFF | LD | HL,FFEE |
| B634 | 19 | ADD | HL,DE |
| B635 | E5 | PUSH | HL |
| B636 | 21EFFF | LD | HL,FFEF |
| B639 | 19 | ADD | HL,DE |
| B63A | 7E | LD | A,(HL) |
| B63B | 4F | LD | C,A |
| B63C | 97 | SUB | A |
| B63D | 47 | LD | B,A |
| B63E | 79 | LD | A,C |
| B63F | E60F | AND | 0F |
| B641 | 4F | LD | C,A |
| B642 | 78 | LD | A,B |
| B643 | E600 | AND | 00 |
| B645 | 47 | LD | B,A |

| LOC | INST | MNEM | OPER |
|---|---|---|---|
| B688 | 35 | DEC | (HL) |
| B689 | C3F3B5 | JP | B5F3 |
| B68C | 21F6FF | LD | HL,FFF6 |

| LOC | INST | MNEM | OPER |
|---|---|---|---|
| B604 | 19 | ADD | HL,DE |
| B605 | 7E | LD | A,(HL) |
| B606 | 4F | LD | C,A |
| B607 | 87 | ADD | A,A |
| B608 | 9F | SBC | A,A |
| B609 | 47 | LD | B,A |
| B60A | 21F0FF | LD | HL,FFF0 |
| B60D | 19 | ADD | HL,DE |

| LOC | INST | MNEM | OPER |
|---|---|---|---|
| B646 | E1 | POP | HL |
| B647 | 79 | LD | A,C |
| B648 | 77 | LD | (HL),A |
| B649 | 21F6FF | LD | HL,FFF6 |
| B64C | 19 | ADD | HL,DE |
| B64D | E5 | PUSH | HL |
| B64E | 21F4FF | LD | HL,FFF4 |
| B651 | 19 | ADD | HL,DE |
| B652 | C1 | POP | BC |
| B653 | 0A | LD | A,(BC) |
| B654 | 96 | SUB | (HL) |
| B655 | 03 | INC | BC |
| B656 | 0A | LD | A,(BC) |
| B657 | 23 | INC | HL |
| B658 | 9E | SBC | A,(HL) |
| B659 | F266B6 | JP | P,B666 |
| B65C | 21EEFF | LD | HL,FFEE |
| B65F | 19 | ADD | HL,DE |
| B660 | 7E | LD | A,(HL) |
| B661 | FE0F | CP | 0F |
| B663 | C28CB6 | JP | NZ,B68C |
| B666 | 2100E8 | LD | HL,E800 |

| LOC | INST | MNEM | OPER |
|---|---|---|---|
| B669 | E5 | PUSH | HL |
| B66A | 21F8FF | LD | HL,FFF8 |
| B66D | 19 | ADD | HL,DE |
| B66E | 7E | LD | A,(HL) |
| B66F | 23 | INC | HL |
| B670 | 66 | LD | H,(HL) |
| B671 | 6F | LD | L,A |
| B672 | E3 | EX | (SP),HL |
| B673 | C1 | POP | BC |
| B674 | 09 | ADD | HL,BC |
| B675 | 3600 | LD | (HL),00 |
| B677 | 21F8FF | LD | HL,FFF8 |
| B67A | 19 | ADD | HL,DE |
| B67B | 7E | LD | A,(HL) |
| B67C | C680 | ADD | A,80 |
| B67E | 77 | LD | (HL),A |
| B67F | 23 | INC | HL |
| B680 | 7E | LD | A,(HL) |
| B681 | CE00 | ADC | A,00 |
| B683 | 77 | LD | (HL),A |
| B684 | 21EDFF | LD | HL,FFED |
| B687 | 19 | ADD | HL,DE |

| LOC | INST | MNEM | OPER |
|---|---|---|---|
| B6CA | 7E | LD | A,(HL) |
| B6CB | 4F | LD | C,A |
| B6CC | 97 | SUB | A |

```
B68F 19      ADD  HL,DE
B690 7E      LD   A,(HL)
B691 FE10    CP   10
B693 C29AB6  JP   NZ,B69A
B696 23      INC  HL
B697 7E      LD   A,(HL)
B698 FE00    CP   00
B69A C2E9B6  JP   NZ,B6E9
B69D 2100E8  LD   HL,E800
B6A0 E5      PUSH HL
B6A1 21F8FF  LD   HL,FFF8
B6A4 19      ADD  HL,DE
B6A5 7E      LD   A,(HL)
B6A6 23      INC  HL
B6A7 66      LD   H,(HL)
B6A8 6F      LD   L,A
B6A9 E3      EX   (SP),HL
B6AA C1      POP  BC
B6AB 09      ADD  HL,BC

LOC  INST    MNEM OPER
B6AC E5      PUSH HL
B6AD 21F2FF  LD   HL,FFF2
B6B0 19      ADD  HL,DE
B6B1 7E      LD   A,(HL)
B6B2 23      INC  HL
B6B3 66      LD   H,(HL)
B6B4 6F      LD   L,A
B6B5 010001  LD   BC,0100
B6B8 09      ADD  HL,BC
B6B9 7E      LD   A,(HL)
B6BA 4F      LD   C,A
B6BB 97      SUB  A
B6BC 47      LD   B,A
B6BD C5      PUSH BC
B6BE 21EEFF  LD   HL,FFEE
B6C1 19      ADD  HL,DE
B6C2 7E      LD   A,(HL)
B6C3 4F      LD   C,A
B6C4 97      SUB  A
B6C5 47      LD   B,A
B6C6 21A100  LD   HL,00A1
B6C9 09      ADD  HL,BC

B6CD 47      LD   B,A
B6CE E1      POP  HL
B6CF 7D      LD   A,L
B6D0 A1      AND  C
B6D1 6F      LD   L,A
B6D2 7C      LD   A,H
B6D3 A0      AND  B
B6D4 67      LD   H,A
B6D5 7D      LD   A,L
B6D6 B4      OR   H
B6D7 CAE0B6  JP   Z,B6E0
B6DA 214800  LD   BC,0048
B6DD C3E3B6  JP   B6E3
B6E0 010000  LD   BC,0000
B6E3 E1      POP  HL
B6E4 79      LD   A,C
B6E5 77      LD   (HL),A
B6E6 C377B6  JP   B677
B6E9 2100E8  LD   HL,E800

LOC  INST    MNEM OPER
B6EC E5      PUSH HL
B6ED 21F8FF  LD   HL,FFF8
B6F0 19      ADD  HL,DE
B6F1 7E      LD   A,(HL)
B6F2 23      INC  HL
B6F3 66      LD   H,(HL)
B6F4 6F      LD   L,A
B6F5 E3      EX   (SP),HL
B6F6 C1      POP  BC
B6F7 09      ADD  HL,BC
B6F8 E5      PUSH HL
B6F9 21EEFF  LD   HL,FFEE
B6FC 19      ADD  HL,DE
B6FD 7E      LD   A,(HL)
B6FE 4F      LD   C,A
B6FF 97      SUB  A
B700 47      LD   B,A
B701 21A100  LD   HL,00A1
B704 09      ADD  HL,BC
B705 7E      LD   A,(HL)
B706 4F      LD   C,A
B707 97      SUB  A

LOC  INST    MNEM OPER
B708 47      LD   B,A
B709 C5      PUSH BC
B70A 21F2FF  LD   HL,FFF2
B70D 19      ADD  HL,DE
B70E 7E      LD   A,(HL)
B70F 23      INC  HL
B710 66      LD   H,(HL)
B711 6F      LD   L,A
B712 7E      LD   A,(HL)
B713 4F      LD   C,A
B714 97      SUB  A
B715 47      LD   B,A
B716 E1      POP  HL
B717 7D      LD   A,L
B718 A1      AND  C
```

```
B719 6F       LD    L,A
B71A 7C       LD    A,H
B71B A0       AND   B
B71C 67       LD    H,A
B71D 7D       LD    A,L
B71E B4       OR    H
B71F CA28B7   JP    Z,B728

LOC   INST    MNEM  OPER
B722  014800  LD    BC,0048
B725  C32BB7  JP    B72B
B728  010000  LD    BC,0000
B72B  E1      POP   HL
B72C  79      LD    A,C
B72D  77      LD    (HL),A
B72E  C377B6  JP    B677
B731  C395DE  JP    DE95

LOC   INST    MNEM  OPER
78B7  3E01    LD    A,01
78B7  BREAK
```

```
                                 SP   RF RA RB RC RD RE RH RL IX   IY
                                 FFC2 3D 01 FF CB FF C9 FF C2 C9A3 0000
```

```
LOC   INST    MNEM  OPER              LOC   INST    MNEM  OPER
A2CD  CD53DE  CALL  DE53              A318  46      LD    B,(HL)
A2D0  21F6FF  LD    HL,FFF6           A319  C5      PUSH  BC
A2D3  39      ADD   HL,SP             A31A  CD41DB  CALL  DB41
A2D4  F9      LD    SP,HL             A31D  F1      POP   AF
A2D5  3A7CF8  LD    A,(F87C)          A31E  69      LD    L,C
A2D8  B7      OR    A                 A31F  60      LD    H,B
A2D9  C2E4A2  JP    NZ,A2E4           A320  0101E8  LD    BC,E801
A2DC  3A79F8  LD    A,(F879)          A323  09      ADD   HL,BC
A2DF  FE01    CP    01                A324  3648    LD    (HL),48
A2E1  C229A3  JP    NZ,A329           A326  C361A3  JP    A361
A2E4  21F8FF  LD    HL,FFF8           A329  3A88F8  LD    A,(F888)
A2E7  19      ADD   HL,DE             A32C  B7      OR    A
A2E8  3E00    LD    A,00              A32D  C271A3  JP    NZ,A371
A2EA  77      LD    (HL),A            A330  3A04F8  LD    A,(F804)
A2EB  87      ADD   A,A               A333  B7      OR    A
A2EC  9F      SBC   A,A               A334  C271A3  JP    NZ,A371
A2ED  23      INC   HL                A337  21F6FF  LD    HL,FFF6
A2EE  77      LD    (HL),A            A33A  19      ADD   HL,DE
A2EF  21F8FF  LD    HL,FFF8           A33B  E5      PUSH  HL
A2F2  19      ADD   HL,DE             A33C  2A02F8  LD    HL,(F802)
A2F3  3EFF    LD    A,FF              A33F  E5      PUSH  HL
A2F5  96      SUB   (HL)              A340  CD41DB  CALL  DB41

LOC   INST    MNEM  OPER              LOC   INST    MNEM  OPER
A2F6  3E00    LD    A,00              A343  F1      POP   AF
A2F8  23      INC   HL                A344  03      INC   BC
A2F9  9E      SBC   A,(HL)            A345  E1      POP   HL
A2FA  FA29A3  JP    M,A329            A346  79      LD    A,C
A2FD  2100EF  LD    HL,EF00           A347  77      LD    (HL),A
A300  E5      PUSH  HL                A348  78      LD    A,B
A301  21F8FF  LD    HL,FFF8           A349  23      INC   HL
A304  19      ADD   HL,DE             A34A  77      LD    (HL),A
A305  7E      LD    A,(HL)            A34B  2100E8  LD    HL,E822
A306  23      INC   HL                A34E  E5      PUSH  HL
A307  66      LD    H,(HL)            A34F  21F6FF  LD    HL,FFF6
A308  6F      LD    L,A               A352  19      ADD   HL,DE
A309  E3      EX    (SP),HL           A353  7E      LD    A,(HL)
A30A  C1      POP   BC                A354  23      INC   HL
```

```
A30B  09        ADD   HL,BC
A30C  7E        LD    A,(HL)
A30D  FE01      CP    01
A30F  C261A3    JP    NZ,A361
A312  21F8FF    LD    HL,FFF8
A315  19        ADD   HL,DE
A316  4E        LD    C,(HL)
A317  23        INC   HL

LOC   INST      MNEM  OPER
A35E  C371A3    JP    A371
A361  21F8FF    LD    HL,FFF8
A364  19        ADD   HL,DE
A365  7E        LD    A,(HL)
A366  C601      ADD   A,01
A368  77        LD    (HL),A
A369  23        INC   HL
A36A  7E        LD    A,(HL)
A36B  CE00      ADC   A,00
A36D  77        LD    (HL),A
A36E  C3EFA2    JP    A2EF
A371  CD3BDB    CALL  DB3B
A374  C395DE    JP    DE95

A355  66        LD    H,(HL)
A356  6F        LD    L,A
A357  E3        EX    (SP),HL
A358  C1        POP   BC
A359  09        ADD   HL,BC
A35A  7E        LD    A,(HL)
A35B  F62C      OR    2C
A35D  77        LD    (HL),A

LOC   INST      MNEM  OPER
A27F  CD53DE    CALL  DE53
A282  2A92F8    LD    HL,(F892)
A285  E5        PUSH  HL
A286  CD41DB    CALL  DB41
A289  F1        POP   AF
A28A  69        LD    L,C
A28B  60        LD    H,B
A28C  23        INC   HL
A28D  229EF8    LD    (F89E),HL
A290  2100E8    LD    HL,E800
A293  E5        PUSH  HL
A294  2A9EF8    LD    HL,(F89E)
A297  E3        EX    (SP),HL
A298  C1        POP   BC
A299  09        ADD   HL,BC
A29A  7E        LD    A,(HL)
A29B  32A0F8    LD    (F8A0),A
A29E  2100E8    LD    HL,E800
A2A1  E5        PUSH  HL
A2A2  2A9EF8    LD    HL,(F89E)
A2A5  E3        EX    (SP),HL
A2A6  C1        POP   BC

LOC   INST      MNEM  OPER
A2A7  09        ADD   HL,BC
A2A8  E5        PUSH  HL
A2A9  2100E8    LD    HL,E800
A2AC  E5        PUSH  HL
A2AD  2A9EF8    LD    HL,(F89E)
A2B0  E3        EX    (SP),HL
A2B1  C1        POP   BC
A2B2  09        ADD   HL,BC
A2B3  7E        LD    A,(HL)
A2B4  4F        LD    C,A
A2B5  97        SUB   A
A2B6  47        LD    B,A
A2B7  79        LD    A,C
A2B8  E6F0      AND   F0
A2BA  4F        LD    C,A
A2BB  78        LD    A,B
A2BC  E600      AND   00
A2BE  47        LD    B,A
A2BF  79        LD    A,C
A2C0  F604      OR    04
A2C2  4F        LD    C,A
A2C3  78        LD    A,B
```

| LOC  | INST   | MNEM | OPER    |
|------|--------|------|---------|
| A2C4 | F600   | OR   | 00      |
| A2C6 | 47     | LD   | B,A     |
| A2C7 | E1     | POP  | HL      |
| A2C8 | 79     | LD   | A,C     |
| A2C9 | 77     | LD   | (HL),A  |
| A2CA | C395DE | JP   | DE95    |

| LOC  | INST   | MNEM | OPER    |
|------|--------|------|---------|
| A3AC | CD53DE | CALL | DE53    |
| A3AF | F5     | PUSH | AF      |
| A3B0 | F5     | PUSH | AF      |
| A3B1 | F5     | PUSH | AF      |
| A3B2 | F5     | PUSH | AF      |
| A3B3 | 21F8FF | LD   | HL,FFF8 |
| A3B6 | 19     | ADD  | HL,DE   |
| A3B7 | E5     | PUSH | HL      |
| A3B8 | 210400 | LD   | HL,0004 |
| A3BB | 19     | ADD  | HL,DE   |
| A3BC | 4E     | LD   | C,(HL)  |
| A3BD | 23     | INC  | HL      |
| A3BE | 46     | LD   | B,(HL)  |
| A3BF | C5     | PUSH | BC      |
| A3C0 | 211400 | LD   | HL,0014 |
| A3C3 | E5     | PUSH | HL      |
| A3C4 | CD59DE | CALL | DE59    |
| A3C7 | 214000 | LD   | HL,0040 |
| A3CA | E5     | PUSH | HL      |
| A3CB | CD65DE | CALL | DE65    |
| A3CE | E1     | POP  | HL      |
| A3CF | E5     | PUSH | HL      |

| LOC  | INST   | MNEM | OPER    |
|------|--------|------|---------|
| A3D0 | 210400 | LD   | HL,0004 |
| A3D3 | 19     | ADD  | HL,DE   |
| A3D4 | 4E     | LD   | C,(HL)  |
| A3D5 | 23     | INC  | HL      |
| A3D6 | 46     | LD   | B,(HL)  |
| A3D7 | C5     | PUSH | BC      |
| A3D8 | 211400 | LD   | HL,0014 |
| A3DB | E5     | PUSH | HL      |
| A3DC | CD62DE | CALL | DE62    |
| A3DF | E1     | POP  | HL      |
| A3E0 | 29     | ADD  | HL,HL   |
| A3E1 | E3     | EX   | (SP),HL |
| A3E2 | C1     | POP  | BC      |
| A3E3 | 09     | ADD  | HL,BC   |
| A3E4 | 019001 | LD   | BC,0190 |
| A3E7 | 09     | ADD  | HL,BC   |
| A3E8 | C1     | POP  | BC      |
| A3E9 | 7D     | LD   | A,L     |
| A3EA | 02     | LD   | (BC),A  |
| A3EB | 7C     | LD   | A,H     |
| A3EC | 03     | INC  | BC      |
| A3ED | 02     | LD   | (BC),A  |

| LOC  | INST   | MNEM | OPER    |
|------|--------|------|---------|
| A3EE | 21F8FF | LD   | HL,FFF8 |
| A3F1 | 19     | ADD  | HL,DE   |
| A3F2 | 7E     | LD   | A,(HL)  |
| A3F3 | 23     | INC  | HL      |
| A3F4 | 66     | LD   | H,(HL)  |
| A3F5 | 6F     | LD   | L,A     |
| A3F6 | 4D     | LD   | C,L     |
| A3F7 | 44     | LD   | B,H     |
| A3F8 | C395DE | JP   | DE95    |

| LOC  | INST   | MNEM | OPER    |
|------|--------|------|---------|
| 9355 | CD53DE | CALL | DE53    |
| 9358 | 21F6FF | LD   | HL,FFF6 |
| 935B | 39     | ADD  | HL,SP   |
| 935C | F9     | LD   | SP,HL   |
| 935D | 21F9FF | LD   | HL,FFF9 |
| 9360 | 19     | ADD  | HL,DE   |
| 9361 | 3600   | LD   | (HL),00 |
| 9363 | 21F9FF | LD   | HL,FFF9 |
| 9366 | 19     | ADD  | HL,DE   |
| 9367 | 3E03   | LD   | A,03    |
| 9369 | BE     | CP   | (HL)    |
| 936A | FA0294 | JP   | M,9402  |
| 936D | 21F9FF | LD   | HL,FFF9 |
| 9370 | 19     | ADD  | HL,DE   |
| 9371 | 7E     | LD   | A,(HL)  |
| 9372 | 4F     | LD   | C,A     |
| 9373 | 87     | ADD  | A,A     |
| 9374 | 9F     | SBC  | A,A     |
| 9375 | 47     | LD   | B,A     |
| 9376 | 2183F9 | LD   | HL,F983 |
| 9379 | 09     | ADD  | HL,BC   |
| 937A | 7E     | LD   | A,(HL)  |

| LOC  | INST   | MNEM | OPER    |
|------|--------|------|---------|
| 939E | 9F     | SBC  | A,A     |
| 939F | 47     | LD   | B,A     |
| 93A0 | 21DBF8 | LD   | HL,F8DB |
| 93A3 | 09     | ADD  | HL,BC   |
| 93A4 | 7E     | LD   | A,(HL)  |
| 93A5 | 4F     | LD   | C,A     |
| 93A6 | 87     | ADD  | A,A     |
| 93A7 | 9F     | SBC  | A,A     |
| 93A8 | 47     | LD   | B,A     |
| 93A9 | 69     | LD   | L,C     |
| 93AA | 60     | LD   | H,B     |
| 93AB | 29     | ADD  | HL,HL   |
| 93AC | E5     | PUSH | HL      |
| 93AD | 210600 | LD   | HL,0006 |
| 93B0 | 19     | ADD  | HL,DE   |
| 93B1 | 7E     | LD   | A,(HL)  |
| 93B2 | 23     | INC  | HL      |
| 93B3 | 66     | LD   | H,(HL)  |
| 93B4 | 6F     | LD   | L,A     |
| 93B5 | E3     | EX   | (SP),HL |
| 93B6 | C1     | POP  | BC      |
| 93B7 | 09     | ADD  | HL,BC   |

| LOC | INST | MNEM | OPER |
|---|---|---|---|
| 937B | FE01 | CP | 01 |
| 937D | C20594 | JP | NZ,9405 |
| 9380 | 21F9FF | LD | HL,FFF9 |
| 9383 | 19 | ADD | HL,DE |
| 9384 | 7E | LD | A,(HL) |
| 9385 | 4F | LD | C,A |
| 9386 | 87 | ADD | A,A |
| 9387 | 9F | SBC | A,A |
| 9388 | 47 | LD | B,A |
| 9389 | 2191F9 | LD | HL,F991 |
| 938C | 09 | ADD | HL,BC |
| 938D | 7E | LD | A,(HL) |
| 938E | B7 | OR | A |
| 938F | CA0594 | JP | Z,9405 |
| 9392 | 21F6FF | LD | HL,FFF6 |
| 9395 | 19 | ADD | HL,DE |
| 9396 | E5 | PUSH | HL |
| 9397 | 21F9FF | LD | HL,FFF9 |
| 939A | 19 | ADD | HL,DE |
| 939B | 7E | LD | A,(HL) |
| 939C | 4F | LD | C,A |
| 939D | 87 | ADD | A,A |

| LOC | INST | MNEM | OPER |
|---|---|---|---|
| 93D7 | 0A | LD | A,(BC) |
| 93D8 | BE | CP | (HL) |
| 93D9 | F20594 | JP | P,9405 |
| 93DC | 21F8FF | LD | HL,FFF8 |
| 93DF | 19 | ADD | HL,DE |
| 93E0 | 7E | LD | A,(HL) |
| 93E1 | 4F | LD | C,A |
| 93E2 | 87 | ADD | A,A |
| 93E3 | 9F | SBC | A,A |
| 93E4 | 47 | LD | B,A |
| 93E5 | 69 | LD | L,C |
| 93E6 | 60 | LD | H,B |
| 93E7 | 29 | ADD | HL,HL |
| 93E8 | E5 | PUSH | HL |
| 93E9 | 21F6FF | LD | HL,FFF6 |
| 93EC | 19 | ADD | HL,DE |
| 93ED | 7E | LD | A,(HL) |
| 93EE | 23 | INC | HL |
| 93EF | 66 | LD | H,(HL) |
| 93F0 | 6F | LD | L,A |
| 93F1 | E3 | EX | (SP),HL |
| 93F2 | C1 | POP | BC |

| LOC | INST | MNEM | OPER |
|---|---|---|---|
| 93F3 | 09 | ADD | HL,BC |
| 93F4 | 0100E8 | LD | BC,E800 |
| 93F7 | 09 | ADD | HL,BC |
| 93F8 | 3648 | LD | (HL),48 |
| 93FA | 21F8FF | LD | HL,FFF8 |
| 93FD | 19 | ADD | HL,DE |
| 93FE | 34 | INC | (HL) |
| 93FF | C3C493 | JP | 93C4 |
| 9402 | C395DE | JP | DE95 |
| 9405 | 21F9FF | LD | HL,FFF9 |
| 9408 | 19 | ADD | HL,DE |
| 9409 | 34 | INC | (HL) |
| 940A | C36393 | JP | 9363 |

| LOC | INST | MNEM | OPER |
|---|---|---|---|
| 93B8 | C1 | POP | BC |
| 93B9 | 7D | LD | A,L |
| 93BA | 02 | LD | (BC),A |
| 93BB | 7C | LD | A,H |
| 93BC | 03 | INC | BC |
| 93BD | 02 | LD | (BC),A |
| 93BE | 21F8FF | LD | HL,FFF8 |
| 93C1 | 19 | ADD | HL,DE |
| 93C2 | 3600 | LD | (HL),00 |
| 93C4 | 21F8FF | LD | HL,FFF8 |
| 93C7 | 19 | ADD | HL,DE |
| 93C8 | E5 | PUSH | HL |
| 93C9 | 21F9FF | LD | HL,FFF9 |
| 93CC | 19 | ADD | HL,DE |
| 93CD | 7E | LD | A,(HL) |
| 93CE | 4F | LD | C,A |
| 93CF | 87 | ADD | A,A |
| 93D0 | 9F | SBC | A,A |
| 93D1 | 47 | LD | B,A |
| 93D2 | 21CFF8 | LD | HL,F8CF |
| 93D5 | 09 | ADD | HL,BC |
| 93D6 | C1 | POP | BC |

| LOC | INST | MNEM | OPER |
|---|---|---|---|
| 9D6A | CD53DE | CALL | DE53 |
| 9D6D | 21F3FF | LD | HL,FFF3 |
| 9D70 | 39 | ADD | HL,SP |
| 9D71 | F9 | LD | SP,HL |
| 9D72 | 21F8FF | LD | HL,FFF8 |
| 9D75 | 19 | ADD | HL,DE |
| 9D76 | 3600 | LD | (HL),00 |
| 9D78 | 21F9FF | LD | HL,FFF9 |
| 9D7B | 19 | ADD | HL,DE |
| 9D7C | 3600 | LD | (HL),00 |
| 9D7E | 3A00F8 | LD | A,(F800) |
| 9D81 | B7 | OR | A |
| 9D82 | C2BE9D | JP | NZ,9DBE |
| 9D85 | 21F6FF | LD | HL,FFF6 |
| 9D88 | 19 | ADD | HL,DE |
| 9D89 | E5 | PUSH | HL |
| 9D8A | 2A86F8 | LD | HL,(F886) |
| 9D8D | 010002 | LD | BC,0200 |
| 9D90 | 09 | ADD | HL,BC |
| 9D91 | E5 | PUSH | HL |
| 9D92 | 210420 | LD | HL,2004 |
| 9D95 | 19 | ADD | HL,DE |

| LOC | INST | MNEM | OPER |
|---|---|---|---|
| 9D96 | 7E | LD | A,(HL) |
| 9D97 | 23 | INC | HL |
| 9D98 | 66 | LD | H,(HL) |
| 9D99 | 6F | LD | L,A |
| 9D9A | E3 | EX | (SP),HL |
| 9D9B | C1 | POP | BC |
| 9D9C | 09 | ADD | HL,BC |
| 9D9D | C1 | POP | BC |
| 9D9E | 7E | LD | A,(HL) |
| 9D9F | 02 | LD | (BC),A |
| 9DA0 | 21F7FF | LD | HL,FFF7 |
| 9DA3 | 19 | ADD | HL,DE |
| 9DA4 | E5 | PUSH | HL |

```
                        9DA5  2A86F8    LD    HL,(F886)
                        9DA8  010023    LD    BC,2300
                        9DAB  09        ADD   HL,BC
                        9DAC  E5        PUSH  HL
                        9DAD  210400    LD    HL,0004
                        9DB0  19        ADD   HL,DE
                        9DB1  7E        LD    A,(HL)
                        9DB2  23        INC   HL
                        9DB3  66        LD    H,(HL)

LOC    INST      MNEM  OPER            LOC   INST      MNEM  OPER
9DB4   6F        LD    L,A             9DF2  77        LD    (HL),A
9DB5   E3        EX    (SP),HL         9DF3  21F7FF    LD    HL,FFF7
9DB6   C1        POP   BC              9DF6  19        ADD   HL,DE
9DB7   09        ADD   HL,BC           9DF7  3600      LD    (HL),00
9DB8   C1        POP   BC              9DF9  21F3FF    LD    HL,FFF3
9DB9   7E        LD    A,(HL)          9DFC  19        ADD   HL,DE
9DBA   02        LD    (BC),A          9DFD  3600      LD    (HL),00
9DBB   C3F99D    JP    9DF9            9DFF  21F3FF    LD    HL,FFF3
9DBE   21F6FF    LD    HL,FFF6         9E02  19        ADD   HL,DE
9DC1   19        ADD   HL,DE           9E03  3E03      LD    A,03
9DC2   E5        PUSH  HL              9E05  BE        CP    (HL)
9DC3   3A88F8    LD    A,(F888)        9E06  FAB39E    JP    M,9EB3
9DC6   B7        OR    A               9E09  21F3FF    LD    HL,FFF3
9DC7   C2E09D    JP    NZ,9DE0         9E0C  19        ADD   HL,DE
9DCA   2100ED    LD    HL,ED00         9E0D  7E        LD    A,(HL)
9DCD   E5        PUSH  HL              9E0E  4F        LD    C,A
9DCE   210400    LD    HL,0004         9E0F  87        ADD   A,A
9DD1   19        ADD   HL,DE           9E10  9F        SBC   A,A
9DD2   7E        LD    A,(HL)          9E11  47        LD    B,A
9DD3   23        INC   HL              9E12  2183F9    LD    HL,F983
9DD4   66        LD    H,(HL)          9E15  09        ADD   HL,BC
9DD5   6F        LD    L,A             9E16  7E        LD    A,(HL)

LOC    INST      MNEM  OPER            LOC   INST      MNEM  OPER
9DD6   E3        EX    (SP),HL         9E17  FE01      CP    01
9DD7   C1        POP   BC              9E19  C2B69E    JP    NZ,9EB6
9DD8   09        ADD   HL,BC           9E1C  21F3FF    LD    HL,FFF3
9DD9   7E        LD    A,(HL)          9E1F  19        ADD   HL,DE
9DDA   4F        LD    C,A             9E20  7E        LD    A,(HL)
9DDB   97        SUB   A               9E21  4F        LD    C,A
9DDC   47        LD    B,A             9E22  87        ADD   A,A
9DDD   C3F09D    JP    9DF0            9E23  9F        SBC   A,A
9DE0   210400    LD    HL,0004         9E24  47        LD    B,A
9DE3   19        ADD   HL,DE           9E25  2191F9    LD    HL,F991
9DE4   7E        LD    A,(HL)          9E28  09        ADD   HL,BC
9DE5   23        INC   HL              9E29  7E        LD    A,(HL)
9DE6   66        LD    H,(HL)          9E2A  B7        OR    A
9DE7   6F        LD    L,A             9E2B  CAB69E    JP    Z,9EB6
9DE8   0100EE    LD    BC,EE00         9E2E  21F4FF    LD    HL,FFF4
9DEB   09        ADD   HL,BC           9E31  19        ADD   HL,DE
9DEC   7E        LD    A,(HL)          9E32  E5        PUSH  HL
9DED   4F        LD    C,A             9E33  21F3FF    LD    HL,FFF3
9DEE   97        SUB   A               9E36  19        ADD   HL,DE
9DEF   47        LD    B,A             9E37  7E        LD    A,(HL)
9DF0   E1        POP   HL              9E38  4F        LD    C,A
9DF1   79        LD    A,C             9E39  87        ADD   A,A
```

| LOC | INST | MNEM | OPER |
|---|---|---|---|
| 9E3A | 9F | SBC | A,A |
| 9E3B | 47 | LD | B,A |
| 9E3C | C5 | PUSH | BC |
| 9E3D | 210100 | LD | HL,0001 |
| 9E40 | E5 | PUSH | HL |
| 9E41 | 21F6FF | LD | HL,FFF6 |
| 9E44 | 19 | ADD | HL,DE |
| 9E45 | E5 | PUSH | HL |
| 9E46 | CD55DF | CALL | DF55 |
| 9E49 | F1 | POP | AF |
| 9E4A | F1 | POP | AF |
| 9E4B | F1 | POP | AF |
| 9E4C | E1 | POP | HL |
| 9E4D | 79 | LD | A,C |
| 9E4E | 77 | LD | (HL),A |
| 9E4F | 78 | LD | A,B |
| 9E50 | 23 | INC | HL |
| 9E51 | 77 | LD | (HL),A |
| 9E52 | 21F3FF | LD | HL,FFF3 |
| 9E55 | 19 | ADD | HL,DE |
| 9E56 | 7E | LD | A,(HL) |
| 9E57 | 4F | LD | C,A |

| LOC | INST | MNEM | OPER |
|---|---|---|---|
| 9E58 | 87 | ADD | A,A |
| 9E59 | 9F | SBC | A,A |
| 9E5A | 47 | LD | B,A |
| 9E5B | 21C3F8 | LD | HL,F8C3 |
| 9E5E | 09 | ADD | HL,BC |
| 9E5F | 7E | LD | A,(HL) |
| 9E60 | 4F | LD | C,A |
| 9E61 | 87 | ADD | A,A |
| 9E62 | 9F | SBC | A,A |
| 9E63 | 47 | LD | B,A |
| 9E64 | C5 | PUSH | BC |
| 9E65 | 21F3FF | LD | HL,FFF3 |
| 9E68 | 19 | ADD | HL,DE |
| 9E69 | 7E | LD | A,(HL) |
| 9E6A | 4F | LD | C,A |
| 9E6B | 87 | ADD | A,A |
| 9E6C | 9F | SBC | A,A |
| 9E6D | 47 | LD | B,A |
| 9E6E | 21CFF8 | LD | HL,F8CF |
| 9E71 | 09 | ADD | HL,BC |
| 9E72 | 7E | LD | A,(HL) |
| 9E73 | 4F | LD | C,A |

| LOC | INST | MNEM | OPER |
|---|---|---|---|
| 9EAC | F1 | POP | AF |
| 9EAD | F1 | POP | AF |
| 9EAE | F1 | POP | AF |
| 9EAF | F1 | POP | AF |
| 9EB0 | C3B69E | JP | 9EB6 |
| 9EB3 | C395DE | JP | DE95 |
| 9EB6 | 21F3FF | LD | HL,FFF3 |
| 9EB9 | 19 | ADD | HL,DE |
| 9EBA | 34 | INC | (HL) |
| 9EBB | C3FF9D | JP | 9DFF |

| LOC | INST | MNEM | OPER |
|---|---|---|---|
| 9E74 | 87 | ADD | A,A |
| 9E75 | 9F | SBC | A,A |
| 9E76 | 47 | LD | B,A |
| 9E77 | 69 | LD | L,C |
| 9E78 | 60 | LD | H,B |
| 9E79 | 29 | ADD | HL,HL |
| 9E7A | 01FEFF | LD | BC,FFFE |
| 9E7D | 09 | ADD | HL,BC |
| 9E7E | E5 | PUSH | HL |
| 9E7F | 21F3FF | LD | HL,FFF3 |
| 9E82 | 19 | ADD | HL,DE |
| 9E83 | 7E | LD | A,(HL) |
| 9E84 | 4F | LD | C,A |
| 9E85 | 87 | ADD | A,A |
| 9E86 | 9F | SBC | A,A |
| 9E87 | 47 | LD | B,A |
| 9E88 | 21D8F8 | LD | HL,F8D8 |
| 9E8B | 09 | ADD | HL,BC |
| 9E8C | 7E | LD | A,(HL) |
| 9E8D | 4F | LD | C,A |
| 9E8E | 87 | ADD | A,A |
| 9E8F | 9F | SBC | A,A |

| LOC | INST | MNEM | OPER |
|---|---|---|---|
| 9E90 | 47 | LD | B,A |
| 9E91 | 69 | LD | L,C |
| 9E92 | 60 | LD | H,B |
| 9E93 | 29 | ADD | HL,HL |
| 9E94 | E5 | PUSH | HL |
| 9E95 | 210600 | LD | HL,0006 |
| 9E98 | 19 | ADD | HL,DE |
| 9E99 | 7E | LD | A,(HL) |
| 9E9A | 23 | INC | HL |
| 9E9B | 66 | LD | H,(HL) |
| 9E9C | 6F | LD | L,A |
| 9E9D | E3 | EX | (SP),HL |
| 9E9E | C1 | POP | BC |
| 9E9F | 09 | ADD | HL,BC |
| 9EA0 | E5 | PUSH | HL |
| 9EA1 | 21F4FF | LD | HL,FFF4 |
| 9EA4 | 19 | ADD | HL,DE |
| 9EA5 | 4E | LD | C,(HL) |
| 9EA6 | 23 | INC | HL |
| 9EA7 | 46 | LD | B,(HL) |
| 9EA8 | C5 | PUSH | BC |
| 9EA9 | CDA5DA | CALL | DAA5 |

| LOC | INST | MNEM | OPER |
|---|---|---|---|
| 54B0 | CD56DE | CALL | DE56 |
| 54B3 | F5 | PUSH | AF |
| 54B4 | F5 | PUSH | AF |
| 54B5 | F5 | PUSH | AF |
| 54B6 | 21F4FF | LD | HL,FFF4 |
| 54B9 | 19 | ADD | HL,DE |
| 54BA | E5 | PUSH | HL |
| 54BB | 2146F9 | LD | HL,F946 |
| 54BE | E5 | PUSH | HL |

| LOC | INST | MNEM | OPER |
|---|---|---|---|
| 54BF | 210800 | LD | HL,0008 |
| 54C2 | 19 | ADD | HL,DE |
| 54C3 | 7E | LD | A,(HL) |
| 54C4 | 23 | INC | HL |
| 54C5 | 66 | LD | H,(HL) |
| 54C6 | 6F | LD | L,A |
| 54C7 | E3 | EX | (SP),HL |
| 54C8 | C1 | POP | BC |
| 54C9 | 09 | ADD | HL,BC |
| 54CA | 7E | LD | A,(HL) |
| 54CB | 4F | LD | C,A |
| 54CC | 87 | ADD | A,A |
| 54CD | 9F | SBC | A,A |

| LOC | INST | MNEM | OPER |
|---|---|---|---|
| 54CE | 47 | LD | B,A |
| 54CF | 69 | LD | L,C |
| 54D0 | 60 | LD | H,B |
| 54D1 | 0126F9 | LD | BC,F926 |
| 54D4 | 09 | ADD | HL,BC |
| 54D5 | C1 | POP | BC |
| 54D6 | 7D | LD | A,L |
| 54D7 | 02 | LD | (BC),A |
| 54D8 | 7C | LD | A,H |
| 54D9 | 03 | INC | BC |
| 54DA | 02 | LD | (BC),A |
| 54DB | 3E00 | LD | A,00 |
| 54DD | 3284FB | LD | (FB84),A |
| 54E0 | 87 | ADD | A,A |
| 54E1 | 9F | SBC | A,A |
| 54E2 | 3285FB | LD | (FB85),A |
| 54E5 | 21F9FF | LD | HL,FFF9 |
| 54E8 | 19 | ADD | HL,DE |
| 54E9 | E5 | PUSH | HL |
| 54EA | 2191F9 | LD | HL,F991 |
| 54ED | E5 | PUSH | HL |
| 54EE | 210800 | LD | HL,0008 |

| LOC | INST | MNEM | OPER |
|---|---|---|---|
| 54F1 | 19 | ADD | HL,DE |
| 54F2 | 7E | LD | A,(HL) |
| 54F3 | 23 | INC | HL |
| 54F4 | 66 | LD | H,(HL) |
| 54F5 | 6F | LD | L,A |
| 54F6 | E3 | EX | (SP),HL |
| 54F7 | C1 | POP | BC |
| 54F8 | 09 | ADD | HL,BC |
| 54F9 | 7E | LD | A,(HL) |
| 54FA | 4F | LD | C,A |
| 54FB | 87 | ADD | A,A |
| 54FC | 9F | SBC | A,A |
| 54FD | 47 | LD | B,A |
| 54FE | 21FFFF | LD | HL,FFFF |
| 5501 | 09 | ADD | HL,BC |
| 5502 | C1 | POP | BC |
| 5503 | 7D | LD | A,L |
| 5504 | 02 | LD | (BC),A |
| 5505 | 21F9FF | LD | HL,FFF9 |
| 5508 | 19 | ADD | HL,DE |
| 5509 | 7E | LD | A,(HL) |
| 550A | B7 | OR | A |

| LOC | INST | MNEM | OPER |
|---|---|---|---|
| 552B | 19 | ADD | HL,DE |
| 552C | 7E | LD | A,(HL) |
| 552D | 4F | LD | C,A |
| 552E | 97 | SUB | A |
| 552F | 47 | LD | B,A |
| 5530 | C5 | PUSH | BC |
| 5531 | 210400 | LD | HL,0004 |
| 5534 | E5 | PUSH | HL |
| 5535 | CD68DE | CALL | DE68 |
| 5538 | 210600 | LD | HL,0006 |
| 553B | 19 | ADD | HL,DE |
| 553C | 4E | LD | C,(HL) |
| 553D | 23 | INC | HL |
| 553E | 46 | LD | B,(HL) |
| 553F | C5 | PUSH | BC |
| 5540 | CD65DE | CALL | DE65 |
| 5543 | E1 | POP | HL |
| 5544 | 227CFB | LD | (FB7C),HL |
| 5547 | 21F8FF | LD | HL,FFF8 |
| 554A | 19 | ADD | HL,DE |
| 554B | E5 | PUSH | HL |
| 554C | 210400 | LD | HL,0004 |

| LOC | INST | MNEM | OPER |
|---|---|---|---|
| 550B | FA9955 | JP | M,5599 |
| 550E | 21F7FF | LD | HL,FFF7 |
| 5511 | 19 | ADD | HL,DE |
| 5512 | E5 | PUSH | HL |
| 5513 | 21F9FF | LD | HL,FFF9 |
| 5516 | 19 | ADD | HL,DE |
| 5517 | 7E | LD | A,(HL) |
| 5518 | 4F | LD | C,A |
| 5519 | 87 | ADD | A,A |
| 551A | 9F | SBC | A,A |
| 551B | 47 | LD | B,A |
| 551C | 21F4FF | LD | HL,FFF4 |
| 551F | 19 | ADD | HL,DE |
| 5520 | 7E | LD | A,(HL) |
| 5521 | 23 | INC | HL |
| 5522 | 66 | LD | H,(HL) |
| 5523 | 6F | LD | L,A |
| 5524 | 09 | ADD | HL,BC |
| 5525 | C1 | POP | BC |
| 5526 | 7E | LD | A,(HL) |
| 5527 | 02 | LD | (BC),A |
| 5528 | 21F7FF | LD | HL,FFF7 |

| LOC | INST | MNEM | OPER |
|---|---|---|---|
| 5569 | E60F | AND | 0F |
| 556B | 4F | LD | C,A |
| 556C | 78 | LD | A,B |
| 556D | E600 | AND | 00 |
| 556F | 47 | LD | B,A |
| 5570 | C5 | PUSH | BC |
| 5571 | CDA7DE | CALL | DEA7 |
| 5574 | E1 | POP | HL |
| 5575 | 7D | LD | A,L |
| 5576 | E601 | AND | 01 |
| 5578 | 6F | LD | L,A |
| 5579 | 7C | LD | A,H |
| 557A | E600 | AND | 00 |
| 557C | 67 | LD | H,A |
| 557D | C1 | POP | BC |
| 557E | 7D | LD | A,L |
| 557F | 02 | LD | (BC),A |
| 5580 | 21F8FF | LD | HL,FFF8 |
| 5583 | 19 | ADD | HL,DE |
| 5584 | 7E | LD | A,(HL) |
| 5585 | 4F | LD | C,A |
| 5586 | 87 | ADD | A,A |

| LOC | INST | MNEM | OPER |
|---|---|---|---|
| 5587 | 9F | SBC | A,A |
| 5588 | 47 | LD | B,A |
| 5589 | 2A84FB | LD | HL,(FB84) |
| 558C | 29 | ADD | HL,HL |
| 558D | 09 | ADD | HL,BC |
| 558E | 2284FB | LD | (FB84),HL |
| 5591 | 21F9FF | LD | HL,FFF9 |
| 5594 | 19 | ADD | HL,DE |
| 5595 | 35 | DEC | (HL) |
| 5596 | C30555 | JP | 5505 |
| 5599 | 2A84FB | LD | HL,(FB84) |

| LOC | INST | MNEM | OPER |
|---|---|---|---|
| 554F | 19 | ADD | HL,DE |
| 5550 | 7E | LD | A,(HL) |
| 5551 | 23 | INC | HL |
| 5552 | 66 | LD | H,(HL) |
| 5553 | 6F | LD | L,A |
| 5554 | E5 | PUSH | HL |
| 5555 | 2A7CFB | LD | HL,(FB7C) |
| 5558 | E3 | EX | (SP),HL |
| 5559 | C1 | POP | BC |
| 555A | 09 | ADD | HL,BC |
| 555B | 7E | LD | A,(HL) |
| 555C | 4F | LD | C,A |
| 555D | 97 | SUB | A |
| 555E | 47 | LD | B,A |
| 555F | C5 | PUSH | BC |
| 5560 | 21F7FF | LD | HL,FFF7 |
| 5563 | 19 | ADD | HL,DE |
| 5564 | 7E | LD | A,(HL) |
| 5565 | 4F | LD | C,A |
| 5566 | 97 | SUB | A |
| 5567 | 47 | LD | B,A |
| 5568 | 79 | LD | A,C |

| LOC | INST | MNEM | OPER |
|---|---|---|---|
| 82E7 | CD53DE | CALL | DE53 |
| 82EA | 21F9FF | LD | HL,FFF9 |
| 82ED | 39 | ADD | HL,SP |
| 82EE | F9 | LD | SP,HL |
| 82EF | 210A00 | LD | HL,000A |
| 82F2 | 19 | ADD | HL,DE |
| 82F3 | 7E | LD | A,(HL) |
| 82F4 | FE0A | CP | 0A |
| 82F6 | C2FD82 | JP | NZ,82FD |
| 82F9 | 23 | INC | HL |
| 82FA | 7E | LD | A,(HL) |
| 82FB | FE00 | CP | 00 |
| 82FD | C22783 | JP | NZ,8327 |
| 8300 | 210400 | LD | HL,0004 |
| 8303 | 19 | ADD | HL,DE |
| 8304 | 7E | LD | A,(HL) |
| 8305 | 23 | INC | HL |
| 8306 | B6 | OR | (HL) |
| 8307 | CACE83 | JP | Z,83CE |
| 830A | 214800 | LD | HL,0048 |
| 830D | E5 | PUSH | HL |
| 830E | 210800 | LD | HL,0008 |

| LOC | INST | MNEM | OPER |
|---|---|---|---|
| 8311 | 19 | ADD | HL,DE |
| 8312 | 4E | LD | C,(HL) |
| 8313 | 23 | INC | HL |
| 8314 | 46 | LD | B,(HL) |
| 8315 | C5 | PUSH | BC |
| 8316 | 210600 | LD | HL,0006 |
| 8319 | 19 | ADD | HL,DE |
| 831A | 4E | LD | C,(HL) |
| 831B | 23 | INC | HL |
| 831C | 46 | LD | B,(HL) |

```
559C 4D        LD    C,L
559D 44        LD    B,H
559E C398DE    JP    DE98
```

```
831D C5        PUSH  BC
831E CDB8DF    CALL  DFB8
8321 F1        POP   AF
8322 F1        POP   AF
8323 F1        POP   AF
8324 C3CE83    JP    83CE
8327 210A00    LD    HL,000A
832A 19        ADD   HL,DE
832B 7E        LD    A,(HL)
832C FE01      CP    01
832E C23583    JP    NZ,8335
8331 23        INC   HL
```

```
LOC  INST      MNEM  OPER
8332 7E        LD    A,(HL)
8333 FE00      CP    00
8335 C24183    JP    NZ,8341
8338 21F9FF    LD    HL,FFF9
833B 19        ADD   HL,DE
833C 3602      LD    (HL),02
833E C36183    JP    8361
8341 210A00    LD    HL,000A
8344 19        ADD   HL,DE
8345 7E        LD    A,(HL)
8346 FE03      CP    03
8348 C24F83    JP    NZ,834F
834B 23        INC   HL
834C 7E        LD    A,(HL)
834D FE00      CP    00
834F C25B83    JP    NZ,835B
8352 21F9FF    LD    HL,FFF9
8355 19        ADD   HL,DE
8356 3608      LD    (HL),08
8358 C36183    JP    8361
835B 21F9FF    LD    HL,FFF9
835E 19        ADD   HL,DE
```

```
LOC  INST      MNEM  OPER
835F 3610      LD    (HL),10
8361 210400    LD    HL,0004
8364 19        ADD   HL,DE
8365 4E        LD    C,(HL)
8366 23        INC   HL
8367 46        LD    B,(HL)
8368 C5        PUSH  BC
8369 21F9FF    LD    HL,FFF9
836C 19        ADD   HL,DE
836D 7E        LD    A,(HL)
836E 4F        LD    C,A
836F 87        ADD   A,A
8370 9F        SBC   A,A
8371 47        LD    B,A
8372 C5        PUSH  BC
8373 CDA4DE    CALL  DEA4
8376 E1        POP   HL
8377 7D        LD    A,L
8378 B4        OR    H
8379 CA9683    JP    Z,8396
837C 210600    LD    HL,0006
837F 19        ADD   HL,DE
```

```
LOC  INST      MNEM  OPER
8380 7E        LD    A,(HL)
8381 23        INC   HL
8382 66        LD    H,(HL)
8383 6F        LD    L,A
8384 E5        PUSH  HL
8385 210800    LD    HL,0008
8388 19        ADD   HL,DE
8389 7E        LD    A,(HL)
838A 23        INC   HL
838B 66        LD    H,(HL)
838C 6F        LD    L,A
838D E3        EX    (SP),HL
838E C1        POP   BC
838F 09        ADD   HL,BC
8390 0100E8    LD    BC,E800
8393 09        ADD   HL,BC
8394 3648      LD    (HL),48
8396 210800    LD    HL,0008
8399 19        ADD   HL,DE
839A 7E        LD    A,(HL)
839B D602      SUB   A,02
839D 77        LD    (HL),A
```

```
LOC  INST      MNEM  OPER
839E 23        INC   HL
839F 7E        LD    A,(HL)
83A0 DE00      SBC   A,00
83A2 77        LD    (HL),A
83A3 210400    LD    HL,0004
83A6 19        ADD   HL,DE
83A7 E5        PUSH  HL
83A8 E1        POP   HL
83A9 E5        PUSH  HL
83AA 4E        LD    C,(HL)
83AB 23        INC   HL
83AC 46        LD    B,(HL)
83AD C5        PUSH  BC
83AE 21F9FF    LD    HL,FFF9
83B1 19        ADD   HL,DE
83B2 7E        LD    A,(HL)
83B3 4F        LD    C,A
83B4 87        ADD   A,A
83B5 9F        SBC   A,A
83B6 47        LD    B,A
83B7 C5        PUSH  BC
83B8 CD9EDE    CALL  DE9E
```

```
LOC   INST      MNEM  OPER
83BB  E1        POP   HL
83BC  C1        POP   BC
83BD  7D        LD    A,L
83BE  02        LD    (BC),A
83BF  7C        LD    A,H
83C0  03        INC   BC
83C1  02        LD    (BC),A
83C2  0B        DEC   BC
83C3  69        LD    L,C
83C4  60        LD    H,B
83C5  97        SUB   A
83C6  96        SUB   (HL)
83C7  3E00      LD    A,00
83C9  23        INC   HL
83CA  9E        SBC   A,(HL)
83CB  DA6183    JP    C,8361
      C395DE    JP    DE95
```

```
LOC   INST      MNEM  OPER
6FC0  CD53DE    CALL  DE53
6FC3  21F9FF    LD    HL,FFF9
6FC6  39        ADD   HL,SP
6FC7  F9        LD    SP,HL
6FC8  21F9FF    LD    HL,FFF9
6FCB  19        ADD   HL,DE
6FCC  3600      LD    (HL),00
6FCE  21F9FF    LD    HL,FFF9
6FD1  19        ADD   HL,DE
6FD2  7E        LD    A,(HL)
6FD3  4F        LD    C,A
6FD4  87        ADD   A,A
6FD5  9F        SBC   A,A
6FD6  47        LD    B,A
6FD7  210600    LD    HL,0006
6FDA  19        ADD   HL,DE
6FDB  7E        LD    A,(HL)
6FDC  91        SUB   C
6FDD  23        INC   HL
6FDE  7E        LD    A,(HL)
6FDF  98        SBC   A,B
6FE0  FA3570    JP    M,7035
```

```
LOC   INST      MNEM  OPER
6FE3  21F9FF    LD    HL,FFF9
6FE6  19        ADD   HL,DE
6FE7  7E        LD    A,(HL)
6FE8  4F        LD    C,A
6FE9  87        ADD   A,A
6FEA  9F        SBC   A,A
6FEB  47        LD    B,A
6FEC  210400    LD    HL,0004
6FEF  19        ADD   HL,DE
6FF0  7E        LD    A,(HL)
6FF1  23        INC   HL
6FF2  66        LD    H,(HL)
6FF3  6F        LD    L,A
6FF4  09        ADD   HL,BC
6FF5  0100E8    LD    BC,E800
6FF8  09        ADD   HL,BC
6FF9  E5        PUSH  HL
6FFA  21F9FF    LD    HL,FFF9
6FFD  19        ADD   HL,DE
6FFE  7E        LD    A,(HL)
6FFF  4F        LD    C,A
7000  87        ADD   A,A
```

```
LOC   INST      MNEM  OPER
7001  9F        SBC   A,A
7002  47        LD    B,A
7003  210400    LD    HL,0004
7006  19        ADD   HL,DE
7007  7E        LD    A,(HL)
7008  23        INC   HL
7009  66        LD    H,(HL)
700A  6F        LD    L,A
700B  09        ADD   HL,BC
700C  0100E8    LD    BC,E800
700F  09        ADD   HL,BC
```

```
LOC   INST      MNEM  OPER
8F96  CD53DE    CALL  DE53
8F99  21F0FF    LD    HL,FFF0
8F9C  39        ADD   HL,SP
8F9D  F9        LD    SP,HL
8F9E  21F0FF    LD    HL,FFF0
8FA1  19        ADD   HL,DE
8FA2  3E00      LD    A,00
8FA4  77        LD    (HL),A
8FA5  87        ADD   A,A
8FA6  9F        SBC   A,A
8FA7  23        INC   HL
```

```
7010 7E       LD    A,(HL)
7011 4F       LD    C,A
7012 97       SUB   A
7013 47       LD    B,A
7014 79       LD    A,C
7015 E680     AND   80
7017 4F       LD    C,A
7018 78       LD    A,B
7019 E600     AND   00
701B 47       LD    B,A
701C 210800   LD    HL,0008

LOC  INST    MNEM  OPER
701F 19       ADD   HL,DE
7020 79       LD    A,C
7021 B6       OR    (HL)
7022 4F       LD    C,A
7023 78       LD    A,B
7024 23       INC   HL
7025 B6       OR    (HL)
7026 47       LD    B,A
7027 E1       POP   HL
7028 79       LD    A,C
7029 77       LD    (HL),A
702A 21F9FF   LD    HL,FFF9
702D 19       ADD   HL,DE
702E 7E       LD    A,(HL)
702F C602     ADD   A,02
7031 77       LD    (HL),A
7032 C3CE6F   JP    6FCE
7035 C395DE   JP    DE95

LOC  INST    MNEM  OPER
8FD5 E3       EX    (SP),HL
8FD6 C1       POP   BC
8FD7 09       ADD   HL,BC
8FD8 C1       POP   BC
8FD9 7D       LD    A,L
8FDA 02       LD    (BC),A
8FDB 7C       LD    A,H
8FDC 03       INC   BC
8FDD 02       LD    (BC),A
8FDE 21F2FF   LD    HL,FFF2
8FE1 19       ADD   HL,DE
8FE2 E5       PUSH  HL
8FE3 21F0FF   LD    HL,FFF0
8FE6 19       ADD   HL,DE
8FE7 7E       LD    A,(HL)
8FE8 23       INC   HL
8FE9 66       LD    H,(HL)
8FEA 6F       LD    L,A
8FEB E3       EX    (SP),HL
8FEC C1       POP   BC
8FED 09       ADD   HL,BC
8FEE E5       PUSH  HL
```

```
8FA8 77       LD    (HL),A
8FA9 21F0FF   LD    HL,FFF0
8FAC 19       ADD   HL,DE
8FAD 3E03     LD    A,03
8FAF 96       SUB   (HL)
8FB0 3E00     LD    A,00
8FB2 23       INC   HL
8FB3 9E       SBC   A,(HL)
8FB4 FA3090   JP    M,9030
8FB7 21F6FF   LD    HL,FFF6
8FBA 19       ADD   HL,DE

LOC  INST    MNEM  OPER
8FBB E5       PUSH  HL
8FBC 21F0FF   LD    HL,FFF0
8FBF 19       ADD   HL,DE
8FC0 7E       LD    A,(HL)
8FC1 23       INC   HL
8FC2 66       LD    H,(HL)
8FC3 6F       LD    L,A
8FC4 29       ADD   HL,HL
8FC5 29       ADD   HL,HL
8FC6 29       ADD   HL,HL
8FC7 29       ADD   HL,HL
8FC8 29       ADD   HL,HL
8FC9 29       ADD   HL,HL
8FCA 29       ADD   HL,HL
8FCB 29       ADD   HL,HL
8FCC E5       PUSH  HL
8FCD 210400   LD    HL,0004
8FD0 19       ADD   HL,DE
8FD1 7E       LD    A,(HL)
8FD2 23       INC   HL
8FD3 66       LD    H,(HL)
8FD4 6F       LD    L,A

LOC  INST    MNEM  OPER
900D 66       LD    H,(HL)
900E 6F       LD    L,A
900F E3       EX    (SP),HL
9010 C1       POP   BC
9011 09       ADD   HL,BC
9012 7E       LD    A,(HL)
9013 4F       LD    C,A
9014 97       SUB   A
9015 47       LD    B,A
9016 E1       POP   HL
9017 7D       LD    A,L
9018 A9       XOR   C
9019 6F       LD    L,A
901A 7C       LD    A,H
901B A8       XOR   B
901C 67       LD    H,A
901D C1       POP   BC
901E 7D       LD    A,L
901F 02       LD    (BC),A
9020 21F0FF   LD    HL,FFF0
9023 19       ADD   HL,DE
9024 7E       LD    A,(HL)
```

| LOC | INST | MNEM | OPER |
|---|---|---|---|
| 8FEF | 2100F0 | LD | HL,F00E |
| 8FF2 | E5 | PUSH | HL |
| 8FF3 | 21F6FF | LD | HL,FFF6 |
| 8FF6 | 19 | ADD | HL,DE |
| 8FF7 | 7E | LD | A,(HL) |
| 8FF8 | 23 | INC | HL |
| 8FF9 | 66 | LD | H,(HL) |
| 8FFA | 6F | LD | L,A |
| 8FFB | E3 | EX | (SP),HL |
| 8FFC | C1 | POP | BC |
| 8FFD | 09 | ADD | HL,BC |
| 8FFE | 7E | LD | A,(HL) |
| 8FFF | 4F | LD | C,A |
| 9000 | 97 | SUB | A |
| 9001 | 47 | LD | B,A |
| 9002 | C5 | PUSH | BC |
| 9003 | 2100F4 | LD | HL,F400 |
| 9006 | E5 | PUSH | HL |
| 9007 | 21F6FF | LD | HL,FFF6 |
| 900A | 19 | ADD | HL,DE |
| 900B | 7E | LD | A,(HL) |
| 900C | 23 | INC | HL |

| LOC | INST | MNEM | OPER |
|---|---|---|---|
| 9025 | C601 | ADD | A,01 |
| 9027 | 77 | LD | (HL),A |
| 9028 | 23 | INC | HL |
| 9029 | 7E | LD | A,(HL) |
| 902A | CE00 | ADC | A,00 |
| 902C | 77 | LD | (HL),A |
| 902D | C3A98F | JP | 8FA9 |
| 9030 | 21F0FF | LD | HL,FFF0 |
| 9033 | 19 | ADD | HL,DE |
| 9034 | 3E00 | LD | A,00 |
| 9036 | 77 | LD | (HL),A |
| 9037 | 87 | ADD | A,A |
| 9038 | 9F | SBC | A,A |
| 9039 | 23 | INC | HL |
| 903A | 77 | LD | (HL),A |
| 903B | 21F0FF | LD | HL,FFF0 |
| 903E | 19 | ADD | HL,DE |
| 903F | 3E03 | LD | A,03 |
| 9041 | 96 | SUB | (HL) |
| 9042 | 3E00 | LD | A,00 |
| 9044 | 23 | INC | HL |
| 9045 | 9E | SBC | A,(HL) |

| LOC | INST | MNEM | OPER |
|---|---|---|---|
| 9046 | FAFB90 | JP | M,90FB |
| 9049 | 2183F9 | LD | HL,F983 |
| 904C | E5 | PUSH | HL |
| 904D | 21F0FF | LD | HL,FFF0 |
| 9050 | 19 | ADD | HL,DE |
| 9051 | 7E | LD | A,(HL) |
| 9052 | 23 | INC | HL |
| 9053 | 66 | LD | H,(HL) |
| 9054 | 6F | LD | L,A |
| 9055 | E3 | EX | (SP),HL |
| 9056 | C1 | POP | BC |
| 9057 | 09 | ADD | HL,BC |
| 9058 | 7E | LD | A,(HL) |
| 9059 | FE01 | CP | 01 |
| 905B | C2FE90 | JP | NZ,90FE |
| 905E | 2191F9 | LD | HL,F991 |
| 9061 | E5 | PUSH | HL |
| 9062 | 21F0FF | LD | HL,FFF0 |
| 9065 | 19 | ADD | HL,DE |
| 9066 | 7E | LD | A,(HL) |
| 9067 | 23 | INC | HL |
| 9068 | 66 | LD | H,(HL) |

| LOC | INST | MNEM | OPER |
|---|---|---|---|
| 908B | F1 | POP | AF |
| 908C | F1 | POP | AF |
| 908D | F1 | POP | AF |
| 908E | E1 | POP | HL |
| 908F | 79 | LD | A,C |
| 9090 | 77 | LD | (HL),A |
| 9091 | 78 | LD | A,B |
| 9092 | 23 | INC | HL |
| 9093 | 77 | LD | (HL),A |
| 9094 | 21C3F8 | LD | HL,F8C3 |
| 9097 | E5 | PUSH | HL |
| 9098 | 21F0FF | LD | HL,FFF0 |
| 909B | 19 | ADD | HL,DE |
| 909C | 7E | LD | A,(HL) |
| 909D | 23 | INC | HL |
| 909E | 66 | LD | H,(HL) |
| 909F | 6F | LD | L,A |
| 90A0 | E3 | EX | (SP),HL |
| 90A1 | C1 | POP | BC |
| 90A2 | 09 | ADD | HL,BC |
| 90A3 | 7E | LD | A,(HL) |
| 90A4 | 4F | LD | C,A |

| LOC | INST | MNEM | OPER |
|---|---|---|---|
| 9069 | 6F | LD | L,A |
| 906A | E3 | EX | (SP),HL |
| 906B | C1 | POP | BC |
| 906C | 09 | ADD | HL,BC |
| 906D | 7E | LD | A,(HL) |
| 906E | B7 | OR | A |
| 906F | CAFE90 | JP | Z,90FE |
| 9072 | 21F8FF | LD | HL,FFF8 |
| 9075 | 19 | ADD | HL,DE |
| 9076 | E5 | PUSH | HL |

| LOC | INST | MNEM | OPER |
|---|---|---|---|
| 90A5 | 87 | ADD | A,A |
| 90A6 | 9F | SBC | A,A |
| 90A7 | 47 | LD | B,A |
| 90A8 | C5 | PUSH | BC |
| 90A9 | 21CFF8 | LD | HL,F8CF |
| 90AC | E5 | PUSH | HL |
| 90AD | 21F0FF | LD | HL,FFF0 |
| 90B0 | 19 | ADD | HL,DE |
| 90B1 | 7E | LD | A,(HL) |
| 90B2 | 23 | INC | HL |

```
9077 21F0FF    LD    HL,FFF0
907A 19        ADD   HL,DE
907B 4E        LD    C,(HL)
907C 23        INC   HL
907D 46        LD    B,(HL)
907E C5        PUSH  BC
907F 210100    LD    HL,0001
9082 E5        PUSH  HL
9083 21F2FF    LD    HL,FFF2
9086 19        ADD   HL,DE
9087 E5        PUSH  HL
9088 CD55DF    CALL  DF55

LOC  INST      MNEM  OPER
90BF 29        ADD   HL,HL
90C0 01FEFF    LD    BC,FFFE
90C3 09        ADD   HL,BC
90C4 E5        PUSH  HL
90C5 21DBF8    LD    HL,F8DB
90C8 E5        PUSH  HL
90C9 21F2FF    LD    HL,FFF0
90CC 19        ADD   HL,DE
90CD 7E        LD    A,(HL)
90CE 23        INC   HL
90CF 66        LD    H,(HL)
90D0 6F        LD    L,A
90D1 E3        EX    (SP),HL
90D2 C1        POP   BC
90D3 09        ADD   HL,BC
90D4 7E        LD    A,(HL)
90D5 4F        LD    C,A
90D6 87        ADD   A,A
90D7 9F        SBC   A,A
90D8 47        LD    B,A
90D9 69        LD    L,C
90DA 60        LD    H,B

LOC  INST      MNEM  OPER
90DB 29        ADD   HL,HL
90DC E5        PUSH  HL
90DD 212600    LD    HL,0026
90E0 19        ADD   HL,DE
90E1 7E        LD    A,(HL)
90E2 23        INC   HL
90E3 66        LD    H,(HL)
90E4 6F        LD    L,A
90E5 E3        EX    (SP),HL
90E6 C1        POP   BC
90E7 09        ADD   HL,BC
90E8 E5        PUSH  HL
90E9 21F8FF    LD    HL,FFF8
90EC 19        ADD   HL,DE
90ED 4E        LD    C,(HL)
90EE 23        INC   HL
90EF 46        LD    B,(HL)
90F0 C5        PUSH  BC
90F1 CDA5DA    CALL  DAA5
90F4 F1        POP   AF
90F5 F1        POP   AF
90F6 F1        POP   AF

90B3 66        LD    H,(HL)
90B4 6F        LD    L,A
90B5 E3        EX    (SP),HL
90B6 C1        POP   BC
90B7 09        ADD   HL,BC
90B8 7E        LD    A,(HL)
90B9 4F        LD    C,A
90BA 87        ADD   A,A
90BB 9F        SBC   A,A
90BC 47        LD    B,A
90BD 69        LD    L,C
90BE 60        LD    H,B

LOC  INST      MNEM  OPER
90F7 F1        POP   AF
90F8 C3FE90    JP    90FE
90FB C395DE    JP    DE95
90FE 21F0FF    LD    HL,FFF0
9101 19        ADD   HL,DE
9102 7E        LD    A,(HL)
9103 C601      ADD   A,01
9105 77        LD    (HL),A
9106 23        INC   HL
9107 7E        LD    A,(HL)
9108 CE00      ADC   A,00
910A 77        LD    (HL),A
910B C33B90    JP    903B
```

| LOC | INST | MNEM | OPER | | LOC | INST | MNEM | OPER |
|---|---|---|---|---|---|---|---|---|
| BEDE | CD53DE | CALL | DE53 | | BF20 | 21F8FF | LD | HL,FFF8 |
| BEE1 | 21F4FF | LD | HL,FFF4 | | BF23 | 19 | ADD | HL,DE |
| BEE4 | 39 | ADD | HL,SP | | BF24 | 3AA9F8 | LD | A,(F8A9) |
| BEE5 | F9 | LD | SP,HL | | BF27 | 77 | LD | (HL),A |
| BEE6 | 21F4FF | LD | HL,FFF4 | | BF28 | 3AAAF8 | LD | A,(F8AA) |
| BEE9 | 19 | ADD | HL,DE | | BF2B | 23 | INC | HL |
| BEEA | E5 | PUSH | HL | | BF2C | 77 | LD | (HL),A |
| BEEB | 3A21FA | LD | A,(FA21) | | BF2D | 21F8FF | LD | HL,FFF8 |
| BEEE | 4F | LD | C,A | | BF30 | 19 | ADD | HL,DE |
| BEEF | 97 | SUB | A | | BF31 | 3AABF8 | LD | A,(F8AB) |
| BEF0 | 47 | LD | B,A | | BF34 | 96 | SUB | (HL) |
| BEF1 | 2111FA | LD | HL,FA11 | | BF35 | 3AACF8 | LD | A,(F8AC) |
| BEF4 | 79 | LD | A,C | | BF38 | 23 | INC | HL |
| BEF5 | 96 | SUB | (HL) | | BF39 | 9E | SBC | A,(HL) |
| BEF6 | 4F | LD | C,A | | BF3A | FAB2BF | JP | M,BFB2 |
| BEF7 | 78 | LD | A,B | | BF3D | 21F6FF | LD | HL,FFF6 |
| BEF8 | 23 | INC | HL | | BF40 | 19 | ADD | HL,DE |
| BEF9 | 9E | SBC | A,(HL) | | BF41 | E5 | PUSH | HL |
| BEFA | 47 | LD | B,A | | BF42 | 2A86F8 | LD | HL,(F886) |
| BEFB | E1 | POP | HL | | BF45 | E5 | PUSH | HL |
| BEFC | 79 | LD | A,C | | BF46 | 21F8FF | LD | HL,FFF8 |
| BEFD | 77 | LD | (HL),A | | BF49 | 19 | ADD | HL,DE |

| LOC | INST | MNEM | OPER | | LOC | INST | MNEM | OPER |
|---|---|---|---|---|---|---|---|---|
| BEFE | 21F5FF | LD | HL,FFF5 | | BF4A | 7E | LD | A,(HL) |
| BF01 | 19 | ADD | HL,DE | | BF4B | 23 | INC | HL |
| BF02 | E5 | PUSH | HL | | BF4C | 66 | LD | H,(HL) |
| BF03 | 3A7FF8 | LD | A,(F87F) | | BF4D | 6F | LD | L,A |
| BF06 | B7 | OR | A | | BF4E | E3 | EX | (SP),HL |
| BF07 | C212BF | JP | NZ,BF12 | | BF4F | C1 | POP | BC |
| BF0A | 2ADBF9 | LD | HL,(F9DB) | | BF50 | 09 | ADD | HL,BC |
| BF0D | 4D | LD | C,L | | BF51 | C1 | POP | BC |
| BF0E | 44 | LD | B,H | | BF52 | 7D | LD | A,L |
| BF0F | C31DBF | JP | BF1D | | BF53 | 02 | LD | (BC),A |
| BF12 | 2ADBF9 | LD | HL,(F9DB) | | BF54 | 7C | LD | A,H |
| BF15 | 4D | LD | C,L | | BF55 | 03 | INC | BC |
| BF16 | 44 | LD | B,H | | BF56 | 02 | LD | (BC),A |
| BF17 | 79 | LD | A,C | | BF57 | 21F5FF | LD | HL,FFF5 |
| BF18 | 2F | CPL | | | BF5A | 19 | ADD | HL,DE |
| BF19 | 4F | LD | C,A | | BF5B | 7E | LD | A,(HL) |
| BF1A | 78 | LD | A,B | | BF5C | 4F | LD | C,A |
| BF1B | 2F | CPL | | | BF5D | 97 | SUB | A |
| BF1C | 47 | LD | B,A | | BF5E | 47 | LD | B,A |
| BF1D | E1 | POP | HL | | BF5F | C5 | PUSH | BC |
| BF1E | 79 | LD | A,C | | BF60 | 21F4FF | LD | HL,FFF4 |
| BF1F | 77 | LD | (HL),A | | BF63 | 19 | ADD | HL,DE |

| LOC | INST | MNEM | OPER | | LOC | INST | MNEM | OPER |
|---|---|---|---|---|---|---|---|---|
| BF64 | 7E | LD | A,(HL) | | BF9A | 23 | INC | HL |
| BF65 | 4F | LD | C,A | | BF9B | 228DF8 | LD | (F88D),HL |
| BF66 | 97 | SUB | A | | BF9E | 2100EF | LD | HL,EF00 |
| BF67 | 47 | LD | B,A | | BFA1 | E5 | PUSH | HL |
| BF68 | E1 | POP | HL | | BFA2 | 21F8FF | LD | HL,FFF8 |
| BF69 | 7D | LD | A,L | | BFA5 | 19 | ADD | HL,DE |
| BF6A | A1 | AND | C | | BFA6 | 7E | LD | A,(HL) |
| BF6B | 6F | LD | L,A | | BFA7 | 23 | INC | HL |
| BF6C | 7C | LD | A,H | | BFA8 | 66 | LD | H,(HL) |
| BF6D | A0 | AND | B | | BFA9 | 6F | LD | L,A |

```
BF6E 67       LD    H,A              BFAA E3       EX    (SP),HL
BF6F E5       PUSH  HL               BFAB C1       POP   BC
BF70 21F6FF   LD    HL,FFF6          BFAC 09       ADD   HL,BC
BF73 19       ADD   HL,DE            BFAD 3601     LD    (HL),01
BF74 7E       LD    A,(HL)           BFAF C3B5BF   JP    BFB5
BF75 23       INC   HL               BFB2 C395DE   JP    DE95
BF76 66       LD    H,(HL)           BFB5 21F8FF   LD    HL,FFF8
BF77 6F       LD    L,A              BFB8 19       ADD   HL,DE
BF78 7E       LD    A,(HL)           BFB9 7E       LD    A,(HL)
BF79 4F       LD    C,A              BFBA C601     ADD   A,01
BF7A 97       SUB   A                BFBC 77       LD    (HL),A
BF7B 47       LD    B,A              BFBD 23       INC   HL

LOC  INST    MNEM  OPER              LOC  INST    MNEM  OPER
BF7C C5       PUSH  BC               BFBE 7E       LD    A,(HL)
BF7D 21F4FF   LD    HL,FFF4          BFBF CE00     ADC   A,00
BF80 19       ADD   HL,DE            BFC1 77       LD    (HL),A
BF81 7E       LD    A,(HL)           BFC2 C32DBF   JP    BF2D
BF82 4F       LD    C,A
BF83 97       SUB   A
BF84 47       LD    B,A
BF85 E1       POP   HL
BF86 7D       LD    A,L
BF87 A1       AND   C
BF88 6F       LD    L,A
BF89 7C       LD    A,H
BF8A A0       AND   B
BF8B 67       LD    H,A
BF8C C1       POP   BC
BF8D 79       LD    A,C
BF8E BD       CP    L
BF8F C294BF   JP    NZ,BF94
BF92 78       LD    A,B
BF93 BC       CP    H
BF94 C2B5BF   JP    NZ,BFB5
BF97 2A8DF8   LD    HL,(F88D)

LOC  INST    MNEM  OPER              LOC  INST    MNEM  OPER
83D1 CD53DE   CALL  DE53             840B 67       LD    H,A
83D4 21F5FF   LD    HL,FFF5          840C 3A21FA   LD    A,(FA21)
83D7 39       ADD   HL,SP            840F 4F       LD    C,A
83D8 F9       LD    SP,HL            8410 97       SUB   A
83D9 21F8FF   LD    HL,FFF8          8411 47       LD    B,A
83DC 19       ADD   HL,DE            8412 7D       LD    A,L
83DD E5       PUSH  HL               8413 A1       AND   C
83DE 2100F0   LD    HL,F000          8414 6F       LD    L,A
83E1 E5       PUSH  HL               8415 7C       LD    A,H
83E2 210400   LD    HL,0004          8416 A8       AND   B
83E5 19       ADD   HL,DE            8417 67       LD    H,A
83E6 7E       LD    A,(HL)           8418 C1       POP   BC
83E7 23       INC   HL               8419 7D       LD    A,L
83E8 66       LD    H,(HL)           841A 02       LD    (BC),A
83E9 6F       LD    L,A              841B 7C       LD    A,H
83EA E3       EX    (SP),HL          841C 03       INC   BC
83EB C1       POP   BC               841D 02       LD    (BC),A
83EC 09       ADD   HL,BC            841E 3A9CF8   LD    A,(F89C)
83ED 7E       LD    A,(HL)           8421 FE02     CP    02
83EE 4F       LD    C,A              8423 CA8E84   JP    Z,848E
83EF 97       SUB   A                8426 21F6FF   LD    HL,FFF6
83F0 47       LD    B,A              8429 19       ADD   HL,DE
```

| LOC | INST | MNEM | OPER |
|---|---|---|---|
| 83F1 | C5 | PUSH | BC |
| 83F2 | 2100F4 | LD | HL,F400 |
| 83F5 | E5 | PUSH | HL |
| 83F6 | 210400 | LD | HL,0004 |
| 83F9 | 19 | ADD | HL,DE |
| 83FA | 7E | LD | A,(HL) |
| 83FB | 23 | INC | HL |
| 83FC | 66 | LD | H,(HL) |
| 83FD | 6F | LD | L,A |
| 83FE | E3 | EX | (SP),HL |
| 83FF | C1 | POP | BC |
| 8400 | 09 | ADD | HL,BC |
| 8401 | 7E | LD | A,(HL) |
| 8402 | 4F | LD | C,A |
| 8403 | 97 | SUB | A |
| 8404 | 47 | LD | B,A |
| 8405 | E1 | POP | HL |
| 8406 | 7D | LD | A,L |
| 8407 | A9 | XOR | C |
| 8408 | 6F | LD | L,A |
| 8409 | 7C | LD | A,H |
| 840A | A8 | XOR | B |

| LOC | INST | MNEM | OPER |
|---|---|---|---|
| 8446 | 78 | LD | A,B |
| 8447 | 9C | SBC | A,H |
| 8448 | 47 | LD | B,A |
| 8449 | E1 | POP | HL |
| 844A | 79 | LD | A,C |
| 844B | 77 | LD | (HL),A |
| 844C | 78 | LD | A,B |
| 844D | 23 | INC | HL |
| 844E | 77 | LD | (HL),A |
| 844F | 21F5FF | LD | HL,FFF5 |
| 8452 | 19 | ADD | HL,DE |
| 8453 | E5 | PUSH | HL |
| 8454 | 3AD8F8 | LD | A,(F8D8) |
| 8457 | 4F | LD | C,A |
| 8458 | 87 | ADD | A,A |
| 8459 | 9F | SBC | A,A |
| 845A | 47 | LD | B,A |
| 845B | 69 | LD | L,C |
| 845C | 60 | LD | H,B |
| 845D | 29 | ADD | HL,HL |
| 845E | 01FEFF | LD | BC,FFFE |
| 8461 | 09 | ADD | HL,BC |

| LOC | INST | MNEM | OPER |
|---|---|---|---|
| 8462 | C1 | POP | BC |
| 8463 | 7D | LD | A,L |
| 8464 | 02 | LD | (BC),A |
| 8465 | 3ACCF8 | LD | A,(F8CC) |
| 8468 | 4F | LD | C,A |
| 8469 | 87 | ADD | A,A |
| 846A | 9F | SBC | A,A |
| 846B | 47 | LD | B,A |
| 846C | C5 | PUSH | BC |
| 846D | 21F5FF | LD | HL,FFF5 |

| LOC | INST | MNEM | OPER |
|---|---|---|---|
| 842A | E5 | PUSH | HL |
| 842B | 210600 | LD | HL,0006 |
| 842E | 19 | ADD | HL,DE |
| 842F | 7E | LD | A,(HL) |
| 8430 | 23 | INC | HL |
| 8431 | 66 | LD | H,(HL) |
| 8432 | 6F | LD | L,A |
| 8433 | 011400 | LD | BC,0014 |
| 8436 | 09 | ADD | HL,BC |
| 8437 | E5 | PUSH | HL |
| 8438 | 3AD8F8 | LD | A,(F8D8) |
| 843B | 4F | LD | C,A |
| 843C | 87 | ADD | A,A |
| 843D | 9F | SBC | A,A |
| 843E | 47 | LD | B,A |
| 843F | 69 | LD | L,C |
| 8440 | 60 | LD | H,B |
| 8441 | 29 | ADD | HL,HL |
| 8442 | C1 | POP | BC |
| 8443 | 79 | LD | A,C |
| 8444 | 95 | SUB | L |
| 8445 | 4F | LD | C,A |

| LOC | INST | MNEM | OPER |
|---|---|---|---|
| 847E | C5 | PUSH | BC |
| 847F | 21F8FF | LD | HL,FFF8 |
| 8482 | 19 | ADD | HL,DE |
| 8483 | 4E | LD | C,(HL) |
| 8484 | 23 | INC | HL |
| 8485 | 46 | LD | B,(HL) |
| 8486 | C5 | PUSH | BC |
| 8487 | CDA5DA | CALL | DAA5 |
| 848A | F1 | POP | AF |
| 848B | F1 | POP | AF |
| 848C | F1 | POP | AF |
| 848D | F1 | POP | AF |
| 848E | 3A9CF8 | LD | A,(F89C) |
| 8491 | B7 | OR | A |
| 8492 | C2B984 | JP | NZ,84B9 |
| 8495 | 210100 | LD | HL,0001 |
| 8498 | E5 | PUSH | HL |
| 8499 | 210E00 | LD | HL,000E |
| 849C | E5 | PUSH | HL |
| 849D | 210600 | LD | HL,0006 |
| 84A0 | 19 | ADD | HL,DE |
| 84A1 | 7E | LD | A,(HL) |

| LOC | INST | MNEM | OPER |
|---|---|---|---|
| 84A2 | 23 | INC | HL |
| 84A3 | 66 | LD | H,(HL) |
| 84A4 | 6F | LD | L,A |
| 84A5 | 011800 | LD | BC,0018 |
| 84A8 | 09 | ADD | HL,BC |
| 84A9 | E5 | PUSH | HL |
| 84AA | 21F8FF | LD | HL,FFF8 |
| 84AD | 19 | ADD | HL,DE |
| 84AE | 4E | LD | C,(HL) |
| 84AF | 23 | INC | HL |

| LOC | INST | MNEM | OPER |
|---|---|---|---|
| 8470 | 19 | ADD | HL,DE |
| 8471 | 7E | LD | A,(HL) |
| 8472 | 4F | LD | C,A |
| 8473 | 87 | ADD | A,A |
| 8474 | 9F | SBC | A,A |
| 8475 | 47 | LD | B,A |
| 8476 | C5 | PUSH | BC |
| 8477 | 21F6FF | LD | HL,FFF6 |
| 847A | 19 | ADD | HL,DE |
| 847B | 4E | LD | C,(HL) |
| 847C | 23 | INC | HL |
| 847D | 46 | LD | B,(HL) |

| LOC | INST | MNEM | OPER |
|---|---|---|---|
| 84B0 | 46 | LD | B,(HL) |
| 84B1 | C5 | PUSH | BC |
| 84B2 | CDA5DA | CALL | DAA5 |
| 84B5 | F1 | POP | AF |
| 84B6 | F1 | POP | AF |
| 84B7 | F1 | POP | AF |
| 84B8 | F1 | POP | AF |
| 84B9 | 3A9CF8 | LD | A,(F89C) |
| 84BC | FE01 | CP | 01 |
| 84BE | CAE584 | JP | Z,84E5 |
| 84C1 | 210A00 | LD | HL,000A |
| 84C4 | E5 | PUSH | HL |

| LOC | INST | MNEM | OPER |
|---|---|---|---|
| 84C5 | 210400 | LD | HL,0004 |
| 84C8 | E5 | PUSH | HL |
| 84C9 | 210600 | LD | HL,0006 |
| 84CC | 19 | ADD | HL,DE |
| 84CD | 7E | LD | A,(HL) |
| 84CE | 23 | INC | HL |
| 84CF | 66 | LD | H,(HL) |
| 84D0 | 6F | LD | L,A |
| 84D1 | 012C00 | LD | BC,002C |
| 84D4 | 09 | ADD | HL,BC |
| 84D5 | E5 | PUSH | HL |
| 84D6 | 21F8FF | LD | HL,FFF8 |
| 84D9 | 19 | ADD | HL,DE |
| 84DA | 4E | LD | C,(HL) |
| 84DB | 23 | INC | HL |
| 84DC | 46 | LD | B,(HL) |
| 84DD | C5 | PUSH | BC |
| 84DE | CDA5DA | CALL | DAA5 |
| 84E1 | F1 | POP | AF |
| 84E2 | F1 | POP | AF |
| 84E3 | F1 | POP | AF |
| 84E4 | F1 | POP | AF |

| LOC | INST | MNEM | OPER |
|---|---|---|---|
| 84E5 | C3950E | JP | DE95 |

What we claim as being novel is:

1. A logic analyzer storing and displaying a sequence of input logic signal states occurring in a collection of digital signals comprising:

an addressable memory for storing logic signal states, said collection of digital signals being input to said memory;

means for addressing and write enabling said addressable memory such that a first set of successive logic signal states of said collection of digital signals is stored at successive addresses in said addressable memory;

means responsive to operator input for permitting an operator to define a reference signal state, for permitting the operator to select a second set of successive addresses of said addressable memory wherein said second set of memory addresses contains less than all of the logic signal states of said first set of logic signal states, and for permitting the operator to select one of said logic signal states stored at one of the memory addresses of the second set;

means for generating a first count of logic signal states of said first set which were stored in said addressable memory before said selected one logic signal state was stored and which match said reference logic signal state; and means for displaying a representation of the logic signal states stored at said second set of memory addresses, for displaying said first count, and for displaying an indication of which addresses of said addressable memory are included in said second set and which addresses are not included in said second set.

2. A logic analyzer according to claim 1 wherein said selected one logic signal state is included in said first count when said selected one logic signal state matches said reference logic signal state.

3. A logic analyzer according to claim 1 further comprising means for generating a second count of logic signal states of said first set which match said reference signal, said second count being displayed by said means for displaying.

4. A logic analyzer according to claim 1 wherein said means for displaying also displays an indication as to whether said selected logic signal state matches said reference state.

5. A logic analyzer for storing and displaying a sequence of input logic signal states occurring in a collection of digital signals comprising:

means for generating a glitch signal of a state indicating whether each state of a sequence of input logic signal states in a collection of digital signals occurs during a period when the collection of digital signals contains a glitch;

an addressable memory for storing an input logic signal state and a glitch signal state at each address, said collection of digital signals and said glitch signal being applied as inputs to said memory;

means for addressing and write enabling said addressable memory such that a first set of successive logic signal states of said collection of digital signals is stored in said addressable memory, successive logic signal states of said collection of digital signals being stored at successive addresses, and such that a glitch signal state generated by said means for generating a signal is stored in said addressable memory with each stored logic signal state, said glitch signal state indicating whether the logic signal state stored with the glitch signal state occurred during a period when the collection of digital signals contained a glitch;

means responsive to operator input for permitting an operator to select a second set of successive addresses of said addressable memory wherein said second set of memory addresses contains less than all of said first set of logic signal states, and for permitting the operator to select one of said logic signal states stored at one of the memory addresses of the second set;

means for generating a first count of glitch signal states stored in said addressable memory indicating a glitch occurring prior to said selected one logic signal state; and means for displaying a representation of the logic signal states stored at said second set of memory addresses, for displaying an indication of which of said displayed logic signal states occurred during a period in which the collection of logic signals contained a glitch, and for displaying said first count.

6. A logic analyzer according to claim 5 further comprising means for generating a second count of glitch indicating signal states stored in memory with all of said first set of logic signal states.

7. A logic analyzer according to claim 1 wherein said selected one logic signal state is included in said first count when a glitch signal state stored with said further selected one logic signal state indicates said selected one logic signal state includes a glitch.

* * * * *